US010211215B1

(12) United States Patent
Ishii et al.

(10) Patent No.: US 10,211,215 B1
(45) Date of Patent: *Feb. 19, 2019

(54) THREE-DIMENSIONAL MEMORY DEVICE CONTAINING WORD LINES HAVING VERTICAL PROTRUSION REGIONS AND METHODS OF MAKING THE SAME

(71) Applicant: SANDISK TECHNOLOGIES LLC, Plano, TX (US)

(72) Inventors: Yashushi Ishii, Yokkaichi (JP); Kazuto Watanabe, Yokkaichi (JP); Michiaki Sano, Yokkaichi (JP); Haruki Urata, Yokkaichi (JP); Akira Takahashi, Yokkaichi (JP); Tae-Kyung Kim, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/895,102

(22) Filed: Feb. 13, 2018

Related U.S. Application Data

(63) Continuation-in-part of application No. 15/867,881, filed on Jan. 11, 2018, which is a continuation-in-part
(Continued)

(51) Int. Cl.
*H01L 27/11556* (2017.01)
*H01L 27/11524* (2017.01)
(Continued)

(52) U.S. Cl.
CPC .... *H01L 27/11556* (2013.01); *H01L 23/5226* (2013.01); *H01L 27/1157* (2013.01);
(Continued)

(58) Field of Classification Search
CPC ............... H01L 27/281; H01L 27/1052; H01L 27/11597; H01L 27/11568;
(Continued)

(56) References Cited

U.S. PATENT DOCUMENTS 5,915,167 A   6/1999  Leedy
7,936,004 B2  5/2011  Kito et al.
(Continued)

FOREIGN PATENT DOCUMENTS

JP   2011049561       3/2011
KR   20100109745 A   10/2010
KR   20110021444 A    3/2011

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Mohsen Ahmadi
(74) *Attorney, Agent, or Firm* — The Marbury Law Group PLLC

(57) ABSTRACT

An alternating stack of insulating layers and spacer material layers is formed over a substrate. Each of the first insulating layers and the first sacrificial material layers includes a respective horizontally-extending portion and a respective non-horizontally-extending portion. Memory stack structures are formed through the horizontally-extending portions of the alternating stack. Regions of the non-horizontally-extending portions of the sacrificial material layers are masked with patterned etch mask portions. Unmasked first regions of the non-horizontally-extending portions of the first sacrificial material layers are selectively recessed, and the sacrificial material layers with electrically conductive layers. Each electrically conductive layer can include a vertical plate region and a protrusion region that protrudes
(Continued)

above the vertical plate region and having a narrower lateral dimension that the vertical plate region. Metal contact structures can be formed on the protrusion regions without contacting the vertical plate regions.

14 Claims, 61 Drawing Sheets

Related U.S. Application Data of application No. 15/826,796, filed on Nov. 30, 2017.

(51) Int. Cl.

| | | |
|---|---|---|
| *H01L 27/1157* | (2017.01) | |
| *H01L 27/11582* | (2017.01) | |
| *H01L 23/522* | (2006.01) | |
| *H01L 27/11597* | (2017.01) | |
| *H01L 27/28* | (2006.01) | |
| *H01L 27/11529* | (2017.01) | |
| *H01L 27/105* | (2006.01) | |
| *H01L 27/11578* | (2017.01) | |
| *H01L 27/11551* | (2017.01) | |
| *H01L 27/11514* | (2017.01) | |
| *H01L 45/00* | (2006.01) | |

(52) U.S. Cl.
CPC .. *H01L 27/11524* (2013.01); *H01L 27/11582* (2013.01); *H01L 27/1052* (2013.01); *H01L 27/11514* (2013.01); *H01L 27/11529* (2013.01); *H01L 27/11551* (2013.01); *H01L 27/11578* (2013.01); *H01L 27/11597* (2013.01); *H01L 27/281* (2013.01); *H01L 45/1675* (2013.01)

(58) Field of Classification Search
CPC ......... H01L 27/11551; H01L 27/11514; H01L 27/1157; H01L 27/11529; H01L 27/11578; H01L 27/11524; H01L 27/11582; H01L 45/1675; H01L 23/5226
See application file for complete search history.

(56) References Cited

U.S. PATENT DOCUMENTS

| | | | |
|---|---|---|---|
| 7,952,136 B2 * | 5/2011 | Kito | ............. G11C 16/10 257/326 |
| 8,187,932 B2 | 5/2012 | Nguyen et al. | |
| 8,363,481 B2 | 1/2013 | Kidoh et al. | |
| 8,394,716 B2 | 3/2013 | Hwang et al. | |
| 8,520,425 B2 | 8/2013 | Xiao et al. | |
| 8,587,052 B2 * | 11/2013 | Yun | ............. H01L 29/66833 257/324 |
| 8,592,912 B2 | 11/2013 | Hwang et al. | |
| 8,884,357 B2 | 11/2014 | Wang et al. | |
| 8,946,023 B2 | 2/2015 | Makala et al. | |
| 8,981,567 B2 | 3/2015 | Hu et al. | |
| 9,165,774 B2 | 10/2015 | Oh et al. | |
| 9,196,628 B1 | 11/2015 | Chen | |
| 9,230,987 B2 | 1/2016 | Pachamuthu et al. | |
| 9,356,034 B1 | 5/2016 | Yada et al. | |
| 9,502,332 B2 | 11/2016 | Lim et al. | |
| 9,716,062 B2 | 7/2017 | Yada et al. | |
| 9,806,093 B2 | 10/2017 | Toyama et al. | |
| 9,818,693 B2 | 11/2017 | Toyama et al. | |
| 9,818,759 B2 | 11/2017 | Kai et al. | |
| 2008/0099819 A1 | 5/2008 | Kito et al. | |
| 2008/0149913 A1 | 6/2008 | Tanaka et al. | |
| 2009/0230449 A1 * | 9/2009 | Sakaguchi | .......... H01L 27/0688 257/298 |
| 2010/0090188 A1 | 4/2010 | Futatsuyama | |
| 2010/0254191 A1 | 10/2010 | Son et al. | |
| 2011/0204420 A1 | 8/2011 | Kim et al. | |
| 2011/0316072 A1 | 12/2011 | Lee | |
| 2012/0112264 A1 * | 5/2012 | Lee | ............. H01L 27/11551 257/324 |
| 2012/0193705 A1 | 8/2012 | Lim et al. | |
| 2012/0195128 A1 * | 8/2012 | Fujiwara | ............. G11C 11/5628 365/185.24 |
| 2012/0256247 A1 | 10/2012 | Alsmeier | |
| 2012/0322252 A1 | 12/2012 | Son et al. | |
| 2013/0270714 A1 * | 10/2013 | Lee | ............. H01L 21/76802 257/774 |
| 2014/0021632 A1 | 1/2014 | Lee et al. | |
| 2014/0061776 A1 | 3/2014 | Kwon et al. | |
| 2014/0183756 A1 | 7/2014 | Hwang et al. | |
| 2015/0069616 A1 | 3/2015 | Oh et al. | |
| 2015/0179577 A1 | 6/2015 | Tobitsuka et al. | |
| 2015/0179659 A1 | 6/2015 | Takaki et al. | |
| 2015/0179660 A1 * | 6/2015 | Yada | ............. H01L 21/02164 257/321 |
| 2015/0340366 A1 | 11/2015 | Lim et al. | |
| 2016/0204117 A1 | 7/2016 | Liu et al. | |
| 2016/0358855 A1 | 12/2016 | Oh | |
| 2017/0077139 A1 | 3/2017 | Iguchi | |
| 2017/0179153 A1 | 6/2017 | Ogawa et al. | |
| 2017/0179154 A1 | 6/2017 | Furihata et al. | |

OTHER PUBLICATIONS

Invitation to Pay Additional Fees and Search Report from the European Patent Office received in connection with International Application No. PCT/US2014/071397; dated Mar. 26, 2015.
International Search Report for PCT/US2014/071397, dated Mar. 18, 2015 (5 pages).
Written Opinion of the International Searching Authority for PCT/US2014/071397, dated Mar. 18, 2015 (11 pages).
International Preliminary Report on Patentability for International Application No. PCT/US2014/071397, 12 pages, dated Jun. 21, 2016.
Non-Final Office Action for corresponding U.S. Appl. No. 14/643,211, filed Mar. 10, 2015, dated Apr. 4, 2016, containing 22 pages.
U.S. Appl. No. 15/251,374, filed Aug. 30, 2016, SanDisk Technologies LLC.
U.S. Appl. No. 15/367,791, filed Dec. 2, 2016, SanDisk Technologies LLC.
U.S. Appl. No. 15/451,773, filed Mar. 7, 2017, SanDisk Technologies LLC.
U.S. Appl. No. 15/805,599, filed Nov. 7, 2017, SanDisk Technologies LLC.
U.S. Appl. No. 15/826,796, filed Nov. 30, 2017, SanDisk Technologies LLC.
U.S. Appl. No. 15/678,881, filed Jan. 11, 2018, SanDisk Technologies LLC.
Office Communication, Non-final Office Action for U.S. Appl. No. 15/451,773, dated Mar. 7, 2017, 23 pages.
U.S. Appl. No. 15/826,796, Notice of Allowance, dated Sep. 10, 2018, 30pgs.

* cited by examiner

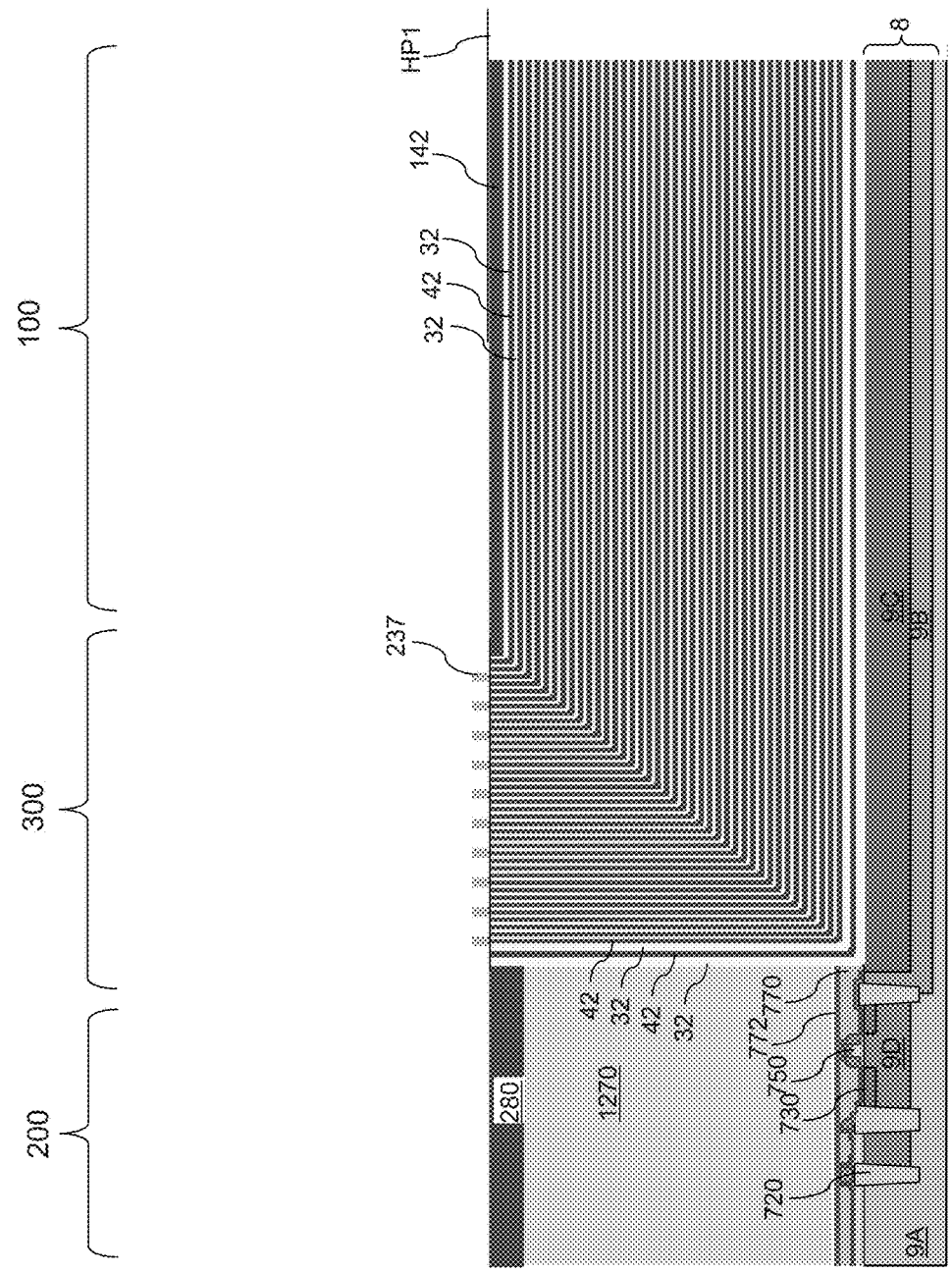

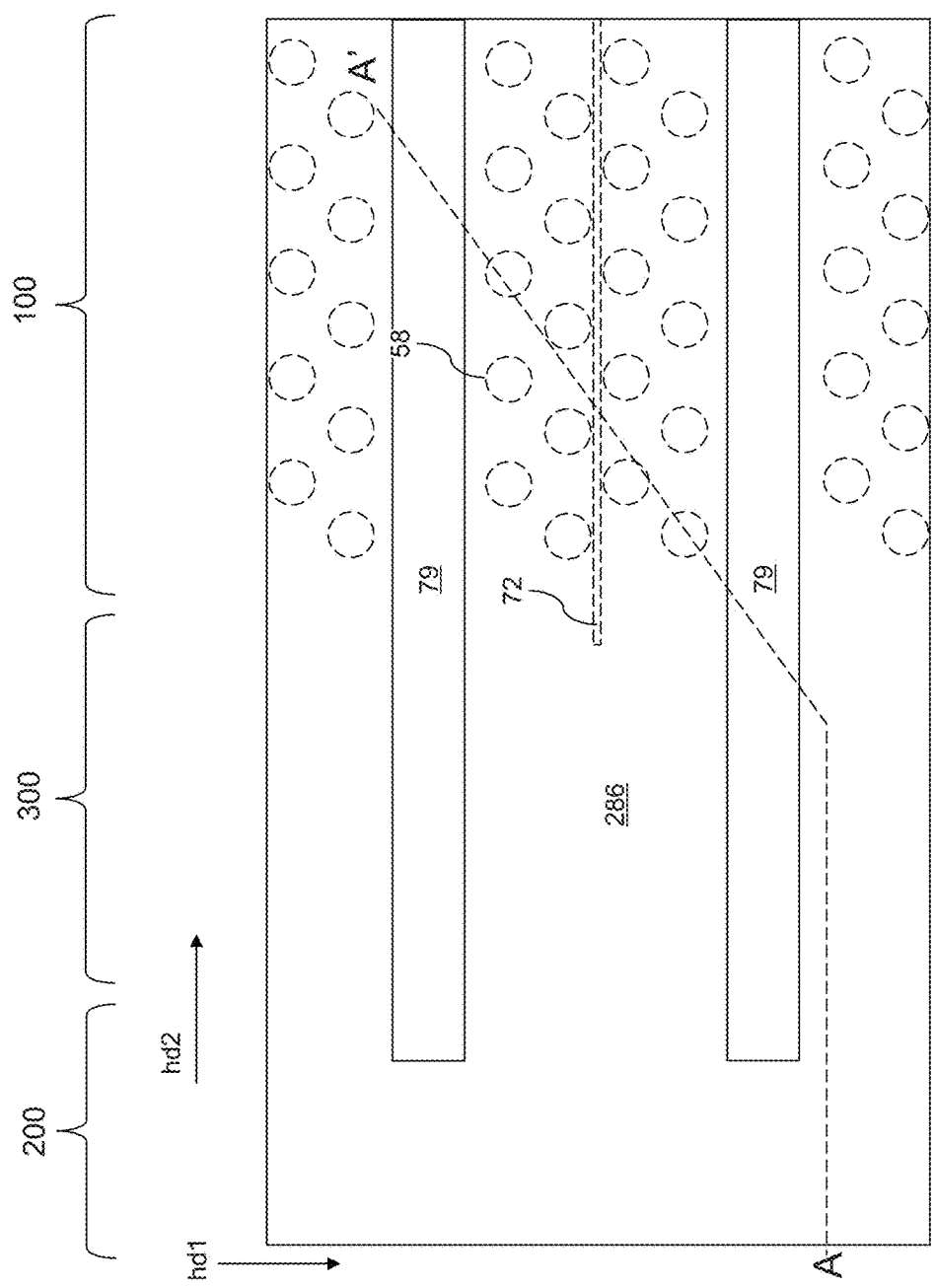

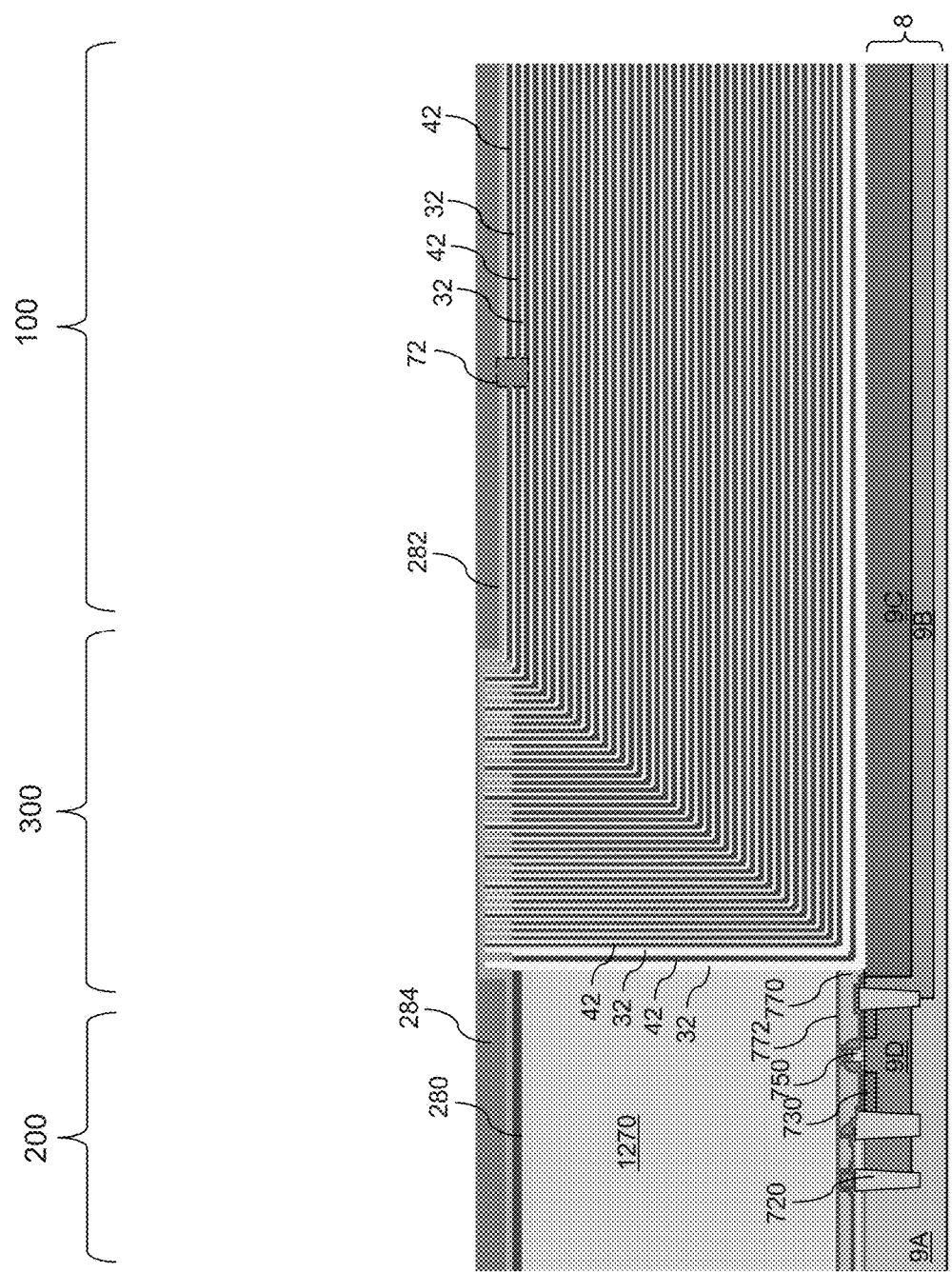

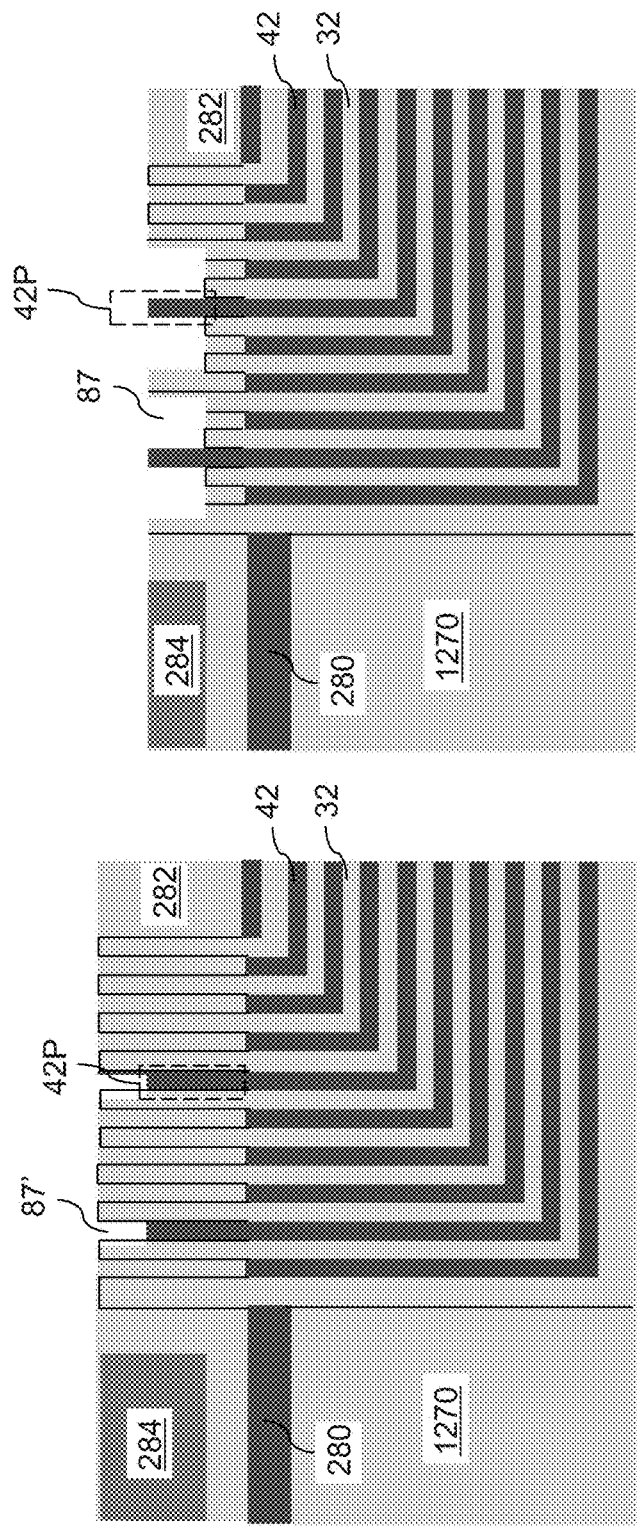

THREE-DIMENSIONAL MEMORY DEVICE CONTAINING WORD LINES HAVING VERTICAL PROTRUSION REGIONS AND METHODS OF MAKING THE SAME

RELATED APPLICATIONS

This application is a continuation-in-part application of U.S. application Ser. No. 15/867,881 filed on Jan. 11, 2018, which is a continuation-in-part application of U.S. application Ser. No. 15/826,796 filed on Nov. 30, 2017, the entire contents of which are incorporated herein by reference.

FIELD

The present disclosure relates generally to the field of semiconductor devices, and particular to a three-dimensional memory device employing L-shaped word lines and metal contact structures aligned to vertical portions of the L-shaped word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a first alternating stack of first insulating layers and first electrically conductive layers located over the top surface of a substrate, wherein each of the first insulating layers and the first electrically conductive layers includes a respective horizontally-extending portion and a respective non-horizontally-extending portion; a first mesa structure located over a top surface of the substrate; memory stack structures extending through a memory array region of the first alternating stack that includes the horizontally-extending portions of the first electrically conductive layers, wherein each of the memory stack structures comprises a memory film and a vertical semiconductor channel; and metal contact structures that contact a respective one of the non-horizontally-extending portions of the first electrically conductive layers.

According to another aspect of the present disclosure, a method of forming a three-dimensional memory device is provided, which comprises: forming a first mesa structure having a dielectric sidewall over a substrate; forming a first alternating stack of first insulating layers and first sacrificial material layers on the first mesa structure and over the substrate, wherein each of the first insulating layers and the first sacrificial material layers includes a respective horizontally-extending portion and a respective non-horizontally-extending portion; forming memory stack structures in a memory array region of the first alternating stack that includes the horizontally-extending portions of the first sacrificial material layers, wherein each of the memory stack structures comprises a memory film and a vertical semiconductor channel; masking first regions of the non-horizontally-extending portions of the first sacrificial material layers with patterned etch mask portions; vertically recessing unmasked second regions of the non-horizontally-extending portions of the first sacrificial material layers, while not removing the masked first regions of the non-horizontally-extending portions of the first sacrificial material layers; and replacing the first sacrificial material layers with first electrically conductive layers.

According to an aspect of the present disclosure, a three-dimensional memory device includes an alternating stack of L-shaped insulating layers and L-shaped electrically conductive layers located over a top surface of a substrate, such that each of the L-shaped insulating layers and the L-shaped electrically conductive layers includes a respective horizontally-extending portion and a respective non-horizontally-extending portion, memory stack structures extending through a memory array region of the alternating stack that includes the horizontally-extending portions of the L-shaped electrically conductive layers, such that each of the memory stack structures includes a memory film and a vertical semiconductor channel, dielectric spacers non-horizontally extending between neighboring pairs of a non-horizontally-extending portion of an L-shaped insulating layer and a non-horizontally-extending portion of an L-shaped electrically conductive layer, and contact via structures that contact a respective one of the non-horizontally-extending portions of the L-shaped electrically conductive layers.

According to another aspect of the present disclosure, a method of forming a three-dimensional memory device is provided, which comprises: forming a mesa structure over a substrate; performing multiple times a set of processing steps comprising an insulating layer deposition step in which an insulating layer is conformally deposited, a dielectric spacer formation step in which a dielectric spacer is formed, and a sacrificial material layer deposition step in which a sacrificial material layer is conformally deposited; removing portions of the insulating layers, the dielectric spacers, and the sacrificial material layers from above a horizontal plane including a top surface of the mesa structure by a planarization process, wherein an alternating stack of L-shaped insulating layers and L-shaped sacrificial material layers is formed over the substrate and on a sidewall of the mesa structure; forming memory stack structures through a memory array region of the alternating stack that includes the horizontally-extending portions of the L-shaped electrically conductive layers, wherein each of the memory stack structures comprises a memory film and a vertical semiconductor channel; replacing the L-shaped sacrificial material layers with L-shaped electrically conductive layers; and forming contact via structures on a respective one of vertically-extending portions of the L-shaped electrically conductive layers.

BRIEF DESCRIPTION OF THE DRAWINGS

FIG. 31A is a vertical cross-sectional view of the second exemplary structure after application and patterning of a photoresist layer to mask isolated areas of non-horizontally-extending portions of the first sacrificial material layers according to the second embodiment of the present disclosure.

FIG. 37B is a top-down view of the second exemplary structure of FIG. 37A. The vertical plane A-A' is the plane of the vertical cross-sectional view of FIG. 37A.

FIG. 48 is a vertical cross-sectional view of the alternative embodiment of the second exemplary structure after formation of a second insulating cap layer according to the second embodiment of the present disclosure.

FIGS. 49A-49F are sequential vertical cross-sectional views of a region of the alternative embodiment of the second exemplary structure during formation of first sacrificial pad structures according to the second embodiment of the present disclosure.

DETAILED DESCRIPTION

Figure 1:
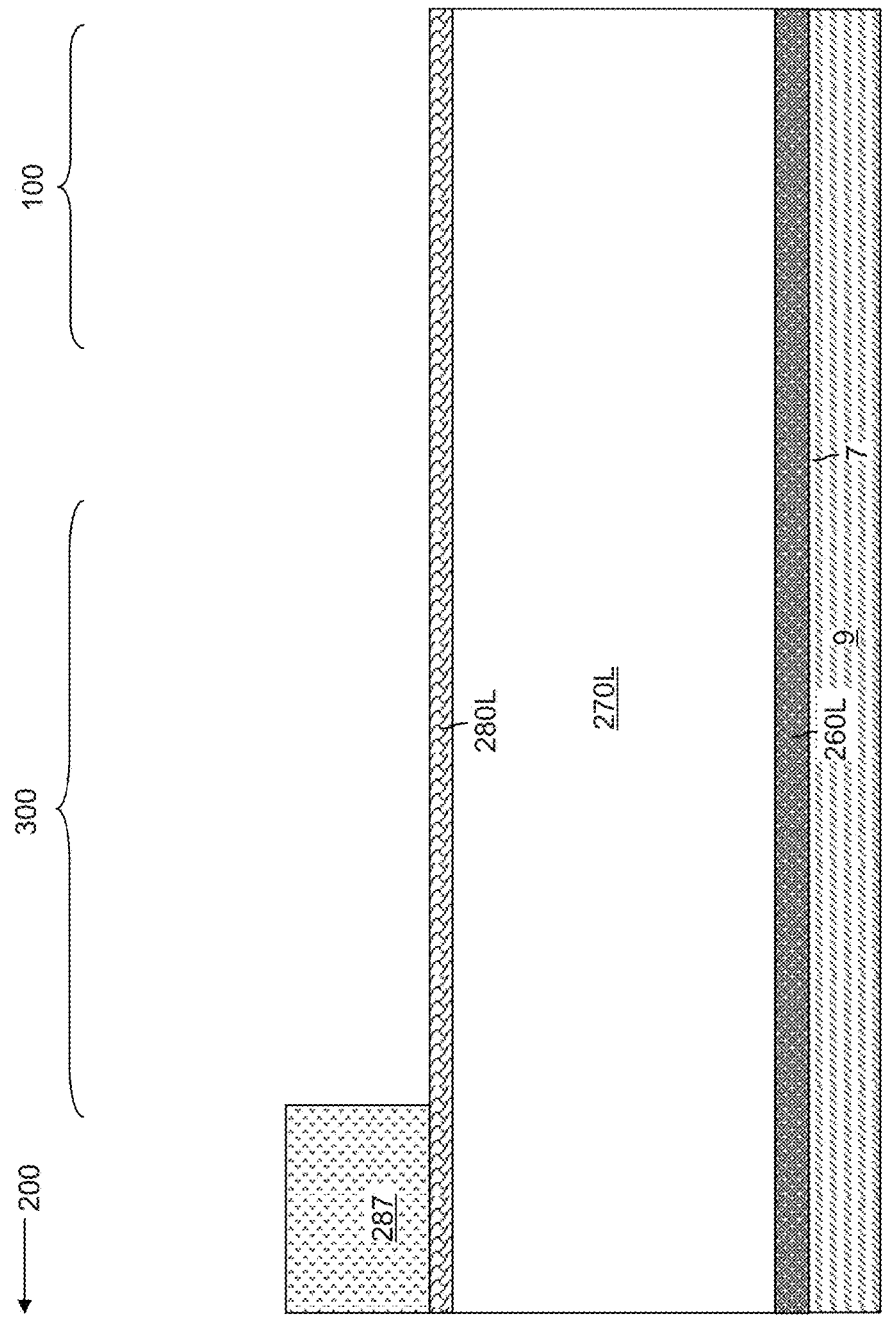
FIG. 1 is a schematic vertical cross-sectional view of a first exemplary structure after formation of a lower template layer, an upper template layer, a planarization stopping layer, and a patterned photoresist layer according to a first embodiment of the present disclosure.

As discussed above, the present disclosure is directed to a three-dimensional memory device employing L-shaped word lines and metal contact structures aligned to vertical portions of the L-shaped word lines and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a top surface 7, which can be, for example, a topmost surface of the substrate semiconductor layer 9. The top surface 7 can be a semiconductor surface. In one embodiment, the top surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device (not shown) for a peripheral circuitry can be formed on a portion of the substrate semiconductor layer 9. The at least one semiconductor device can include, for example, field effect transistors. The least one semiconductor device for the peripheral circuitry can contain a driver circuit for memory devices to be subsequently formed, which can include at least one NAND device. The region (i.e., area) of the at least one semiconductor device is herein referred to as a peripheral device region 200, which is located outside of the illustrated region of the first exemplary structure in FIG. 1. The region in which a memory array is subsequently formed is herein referred to as a memory array region 100. A contact region 300 for subsequently forming stepped terraces of electrically conductive layers can be provided between the memory array region 100 and the peripheral device region 200.

At least one template layer (260L, 270L) can be deposited on the top surface 7 of the substrate layer 9. In one embodiment, the at least one template layer (260L, 270L) can include a lower template layer 260L and an upper template layer 270L. The lower template layer 260L can include a first dielectric material that can be etched with a taper during a subsequent anisotropic etch. The upper template layer 270L can include a second dielectric material that can be etched with vertical sidewalls during the subsequent anisotropic etch. For example, the lower template layer 260L can include silicon nitride or aluminum oxide, and the upper template layer 270L can include silicon oxide. The total thickness of the at least one template layer (260L, 270L) can be greater than the thickness of an alternating stack of insulating layers and sacrificial material layers to be subsequently formed. For example, the lower template layer 260L can have a thickness in a range from 100 nm to 2,000 nm, and the upper template layer 270L can have a thickness in a range from 1,000 nm to 20,000 nm, although lesser and greater thicknesses can also be employed. In an alternative embodiment, the lower template layer 260L may be omitted, and the at least one template layer (260L, 270L) may consist of a single template layer such as the upper template layer 270L.

An optional planarization stopping layer 280L can be formed over the at least one template layer (260L, 270L). The planarization stopping layer 280L includes a material that can be employed as a stopping layer for a chemical mechanical planarization process to be subsequently performed. For example, the planarization stopping layer 280L can include polysilicon or a dielectric metal oxide. The thickness of the planarization stopping layer 280L can be in a range from 10 nm to 200 nm, such as from 10 nm to 100 nm, although lesser and greater thicknesses can also be employed. A photoresist layer 287 can be applied over the planarization stopping layer 280L, and can be lithographically patterned to cover to a region adjacent to the contact region 300.

Figure 2:
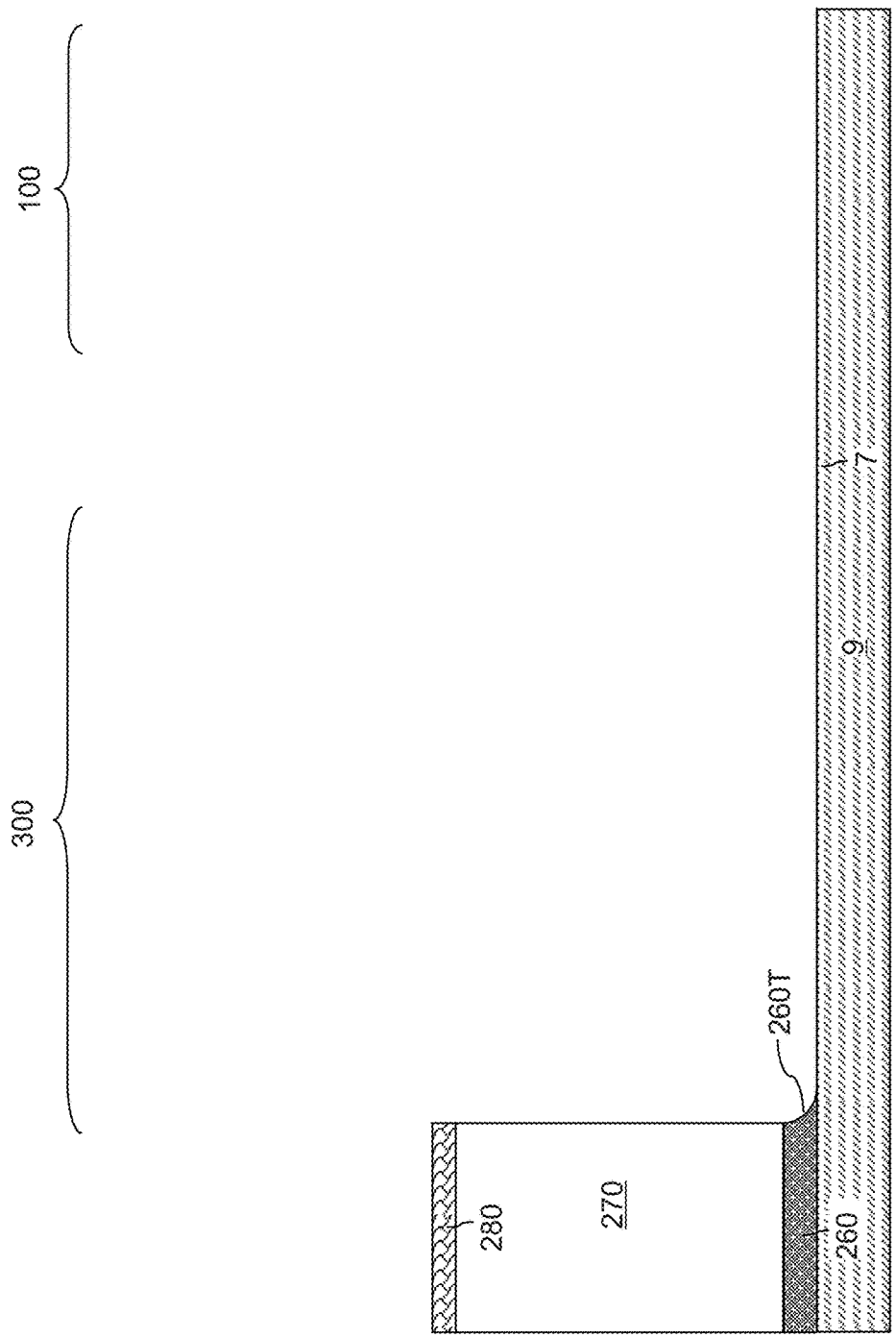
FIG. 2 is a schematic vertical cross-sectional view of the first exemplary structure after patterning the planarization stopping layer, the upper template layer, and the lower template layer to form a mesa structure according to the first embodiment of the present disclosure.

Referring to FIG. 2, an anisotropic etch is performed to transfer the pattern of the photoresist layer 287 through the planarization stopping layer 280L and the at least one template layer (260L, 270L). The isotropic etch can include multiple etch steps for sequentially etching the materials of the planarization stopping layer 280L and the at least one template layer (260L, 270L). For example, if the upper template layer 270L includes silicon oxide, a reactive ion etch employing a combination of $C_4F_6$, Ar, and $O_2$ or a combination of $C_4F_8$, Ar, and $O_2$ can be employed to pattern the upper template layer 270L with vertical sidewalls. If the lower template layer 260L includes silicon nitride, the top surface of the lower template layer 260L can be cleaned using $O_2$ or $O_2$/Ar chemistry. Subsequently, the lower template layer 260L including silicon nitride can be etched with a tapered sidewall employing a combination of $CHF_3$, Ar, and $O_2$ or $CH_2F_2$, Ar, and $O_2$. Low electrostatic chuck (ESC) temperature in a range from −10 degrees Celsius to 20 degrees Celsius can facilitate accumulation of residual material from the etch process (which may be from the combination of materials from the upper template layer 270L, the photoresist layer 287, and the etch gas) on the sidewalls of remaining portions of the lower template layer 260L and induce formation of tapered sidewalls 260T on the remaining portion of the lower template layer 260L. The top surface 7 of the substrate semiconductor layer 9 can be physically exposed after the anisotropic etch process.

The remaining portion of the planarization stopping layer 280L is herein referred to as a planarization stopping structure 280, the remaining portion of the upper template layer 270L is herein referred to as an upper template structure 270, and the remaining portion of the lower template layer 270L is herein referred to as a lower template structure 260. The upper template structure 270 can have non-horizontal sidewalls having an angle of 60 to 90 degrees with respect to a horizontal direction (e.g., with respect to the top surface 7 of the substrate), and may include vertical sidewalls (i.e., having an angle of 90 degrees with respect to the horizontal direction) in some embodiments. The lower template structure 260 can have tapered sidewalls. The photoresist layer 287 can be subsequently removed, for example, by ashing. The combination of the lower template structure 260 and the upper template structure 270 constitutes a mesa structure (260, 270) that protrudes above the top surface 7 of the substrate semiconductor layer 9. In one embodiment the mesa structure can have a planar top surface (which is the top surface of the upper template structure 270). In another embodiment, the mesa structure can have a non-planar top surface.

Figure 3:
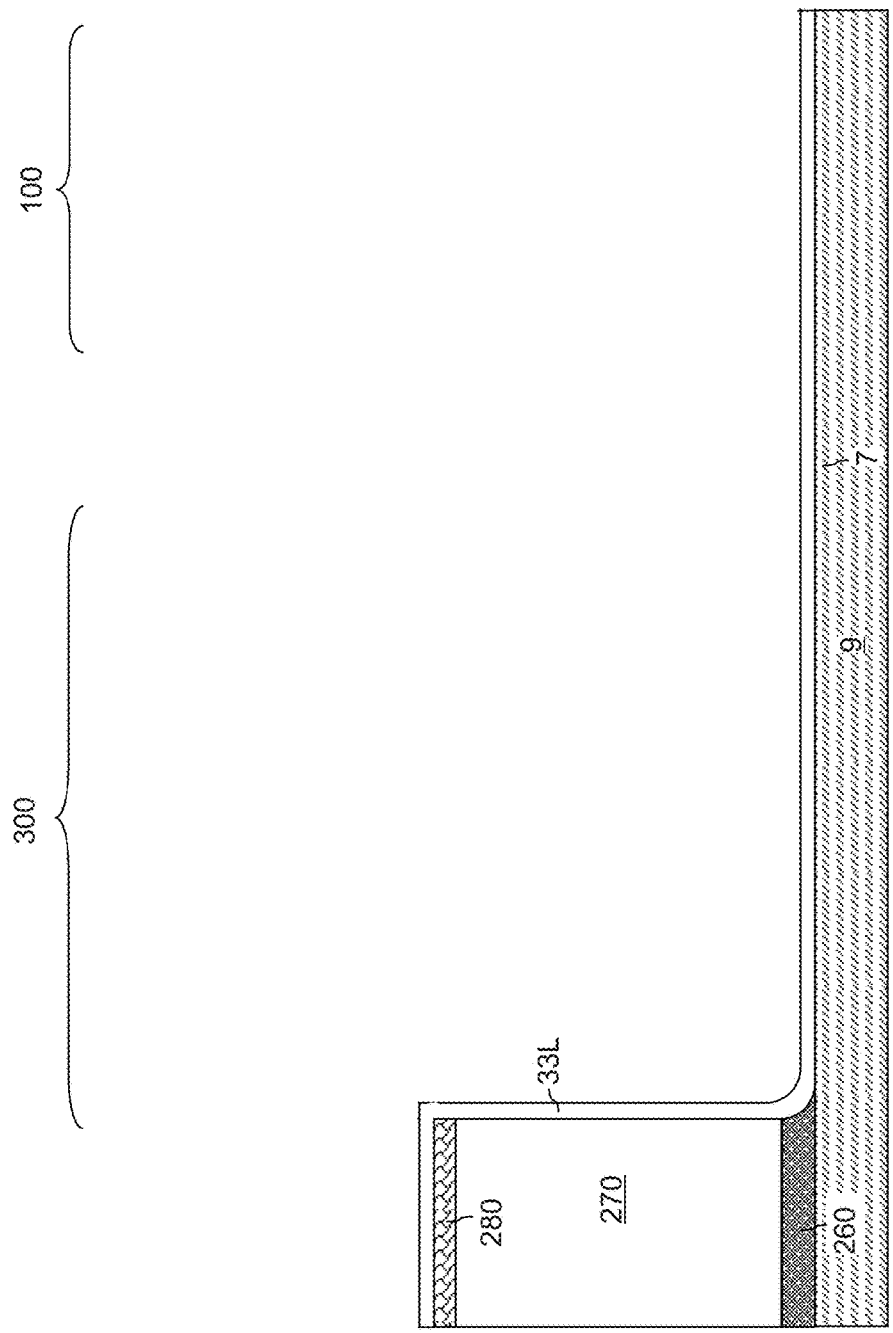
FIG. 3 is a schematic vertical cross-sectional view of the first exemplary structure after formation of a Z-shaped dielectric spacer material layer according to the first embodiment of the present disclosure.

Referring to FIG. 3, an optional Z-shaped dielectric spacer material layer 33L can be formed on the top surface 7 of the substrate semiconductor layer 9, on the sidewalls of the mesa structure (260, 270), and on the top surface of the mesa structure (260, 270). As used herein, a "Z-shaped" element refers to an element that includes a pair of horizontally extending portions that are adjoined by a connecting portion that extends along a non-horizontal direction (e.g., having an angle of 60 to 90 degrees with respect to a horizontal direction), such as a vertical direction. Specifically, the Z-shaped dielectric spacer material layer 33L includes a first horizontal portion that contacts the top surface 7 of the substrate semiconductor layer 9, a second horizontal portion that overlies the mesa structure (260, 270), and a non-horizontal portion, such as a vertical portion, that connects the first horizontal portion and the second horizontal portion. The Z-shaped dielectric spacer material layer 33L is a continuous dielectric material layer including a dielectric material that is subsequently incorporated into a dielectric spacer. For example, the Z-shaped dielectric spacer material layer 33L can include silicon oxide, which may, or may not, be doped with dopants such as B, P, F, or As. The Z-shaped dielectric spacer material layer 33L can be formed by a conformal deposition process such as low pressure chemical vapor deposition. The thickness of the Z-shaped dielectric spacer material layer 33L can be in a range from 15 nm to 200 nm, although lesser and greater thicknesses can also be employed. In another embodiment, the Z-shaped dielectric spacer material layer 33L may be omitted.

Figure 4:
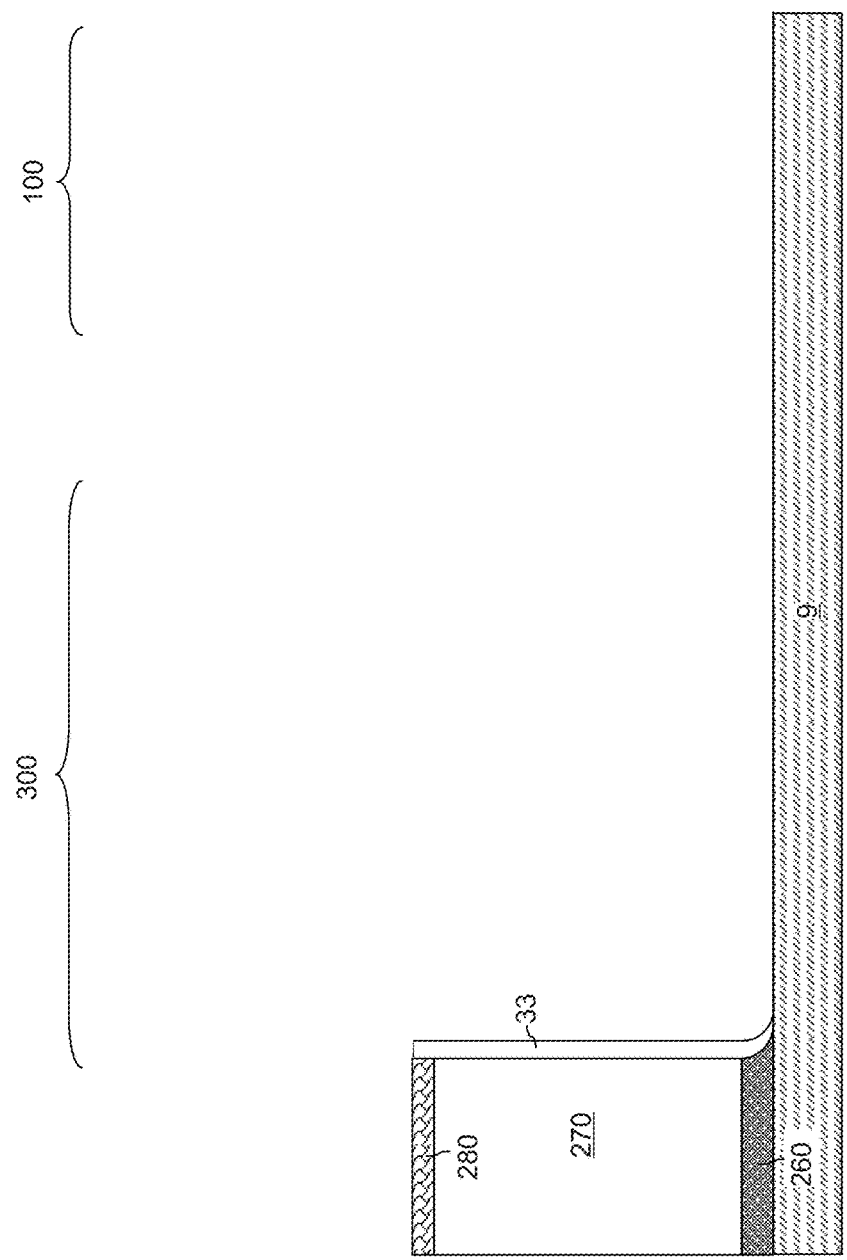
FIG. 4 is a schematic vertical cross-sectional view of the first exemplary structure after formation of a dielectric spacer according to the first embodiment of the present disclosure.

Referring to FIG. 4, an anisotropic etch process is performed to remove horizontal portions of the Z-shaped dielectric spacer material layer 33L from above the top surface of the substrate semiconductor layer 9 and from above the top surface of the mesa structure (260, 270). For example, etch chemistry employing $C_4F_8$ and/or $C_4F_6$, Ar, and $O_2$ can be employed to anisotropically etch the Z-shaped dielectric spacer material layer 33L. Remaining vertical portions of the Z-shaped dielectric spacer material layer 33L can have a spacer shape, such as a rectangular or cylindrical spacer shape, and is herein referred to as a dielectric spacer 33. The dielectric spacer 33 includes a vertical portion located at an edge of the contact region 300. In one embodiment, the vertical portion of the dielectric spacer 33 can laterally extend along a horizontal direction that is perpendicular to the direction connecting the memory array region 100 and the contact region 300, which is the direction perpendicular to the view illustrated in FIG. 4 (i.e., perpendicular to the plane of view in FIG. 4). The dielectric spacer 33 is optional and can be omitted in an alternative embodiment.

Figure 5:
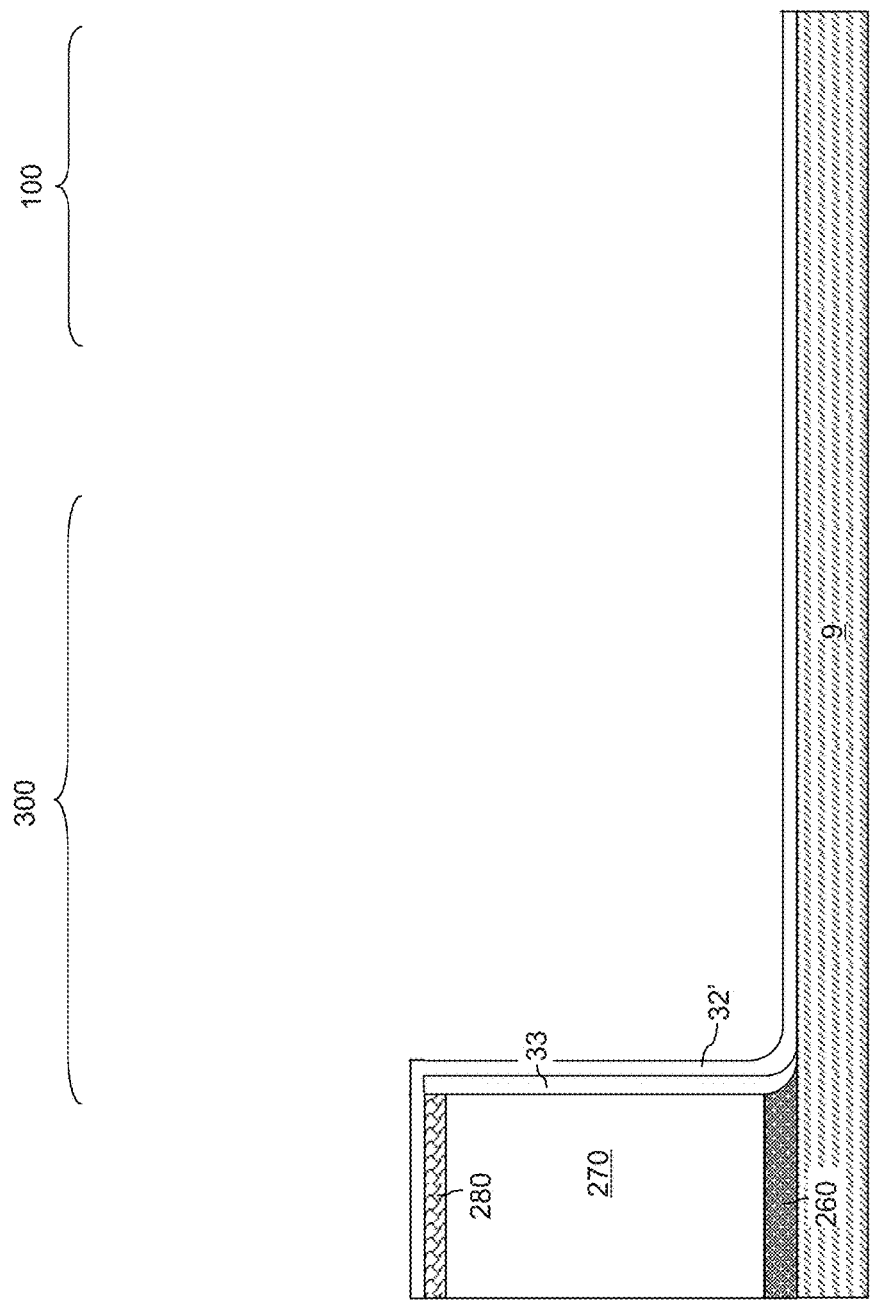
FIG. 5 is a schematic vertical cross-sectional view of the first exemplary structure after formation of a Z-shaped insulating layer according to the first embodiment of the present disclosure.

Referring to FIG. 5, a Z-shaped insulating layer 32' can be deposited on the top surface 7 of the substrate semiconductor layer 9, on the sidewalls of the dielectric spacer 33, and on the top surface of the mesa structure (260, 270). The Z-shaped insulating layer 32' is a continuous insulating material layer including a dielectric material that is subsequently combined with the dielectric spacer 33. The Z-shaped insulating layer 32' includes a first horizontal portion that contacts the top surface of the substrate semiconductor layer 9, a second horizontal portion that contacts the top surface of the mesa structure (260, 270), and a non-horizontally extending portion having an angle of 60 to 90 degrees with respect to a horizontal direction, such as a vertically-extending portion that connects the first horizontal portion and the second horizontal portion and contacting the dielectric spacer 33. As used herein, an element is "non-horizontally-extending" if the element extends along a non-horizontal direction, which may be a vertical direction, or any non-vertical and non-horizontal direction. The insulating material of the Z-shaped insulating layer 32' may be the same as, or may be different from, the dielectric material of the dielectric spacer 33. In one embodiment, the Z-shaped insulating layer 32' can include silicon oxide, which may, or may not, be doped with dopants such as B, P, F, or As. In one embodiment, the Z-shaped insulating layer 32' may consist essentially of $SiO_2$ with a trace level of hydrogen atoms and/or carbon atoms. The Z-shaped insulating layer 32' can be formed by a conformal deposition process such as low pressure chemical vapor deposition. The thickness of the Z-shaped insulating layer 32' can be in a range from 25 nm to 60 nm, although lesser and greater thicknesses can also be employed.

Figure 6:
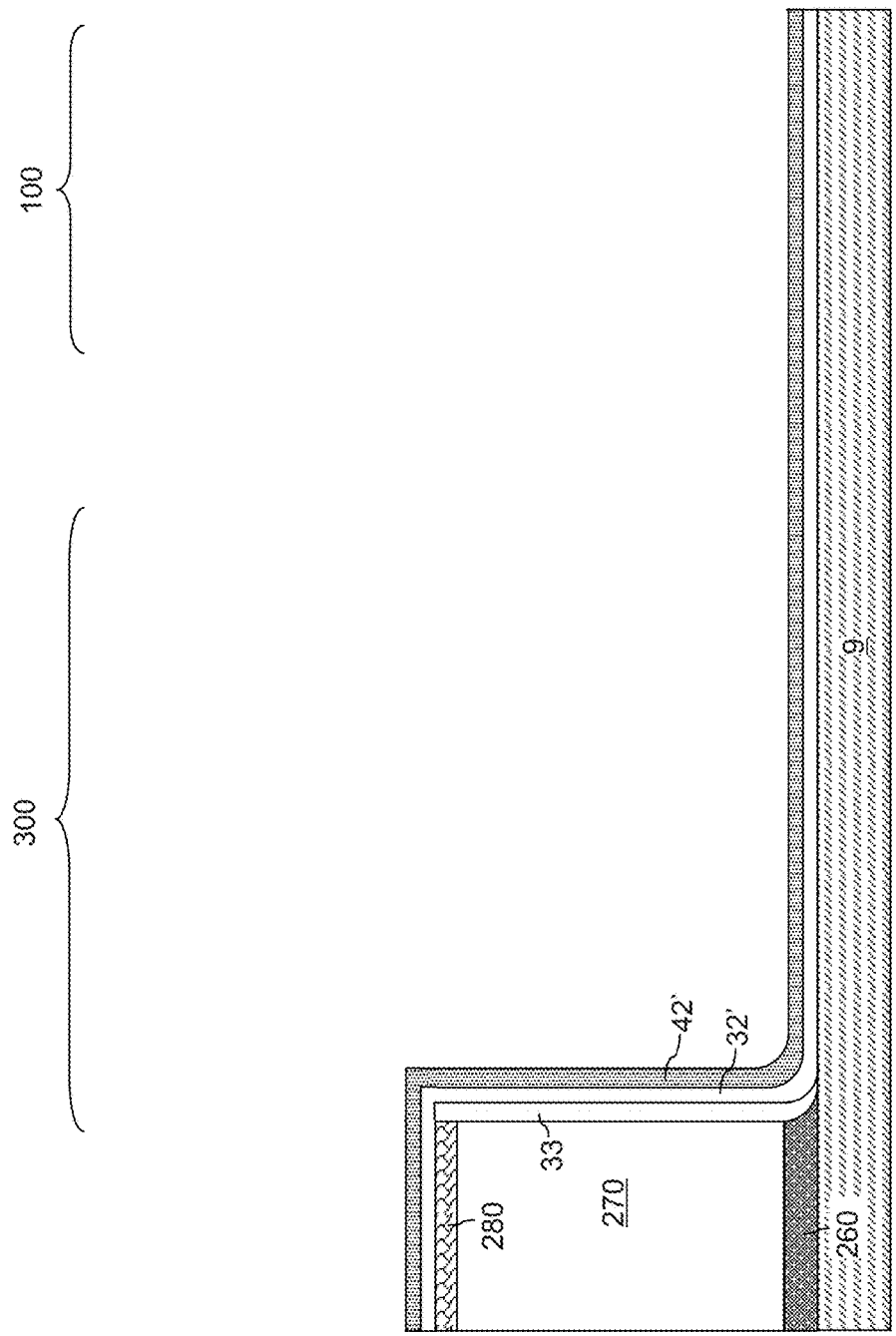
FIG. 6 is a schematic vertical cross-sectional view of the first exemplary structure after formation of a Z-shaped sacrificial material layer according to the first embodiment of the present disclosure.

Referring to FIG. 6, a Z-shaped sacrificial material layer 42' can be deposited on the Z-shaped insulating layer 32'. The Z-shaped sacrificial material layer 42' is a continuous sacrificial material layer including a sacrificial material that spatially separates the Z-shaped insulating layer 32' from another Z-shaped insulating layer to be subsequently formed. The Z-shaped sacrificial material layer 42' includes a first horizontal portion located in the memory array region 100 and the contact region 300, a second horizontal portion overlying the mesa structure (260, 270), and a non-horizontally extending portion having an angle of 60 to 90 degrees with respect to a horizontal direction, such as a vertically-extending portion that connects the first horizontal portion and the second horizontal portion. In one embodiment, the spacer material can be a sacrificial material that is subsequently replaced with an electrically conductive material. For example, the sacrificial material of the Z-shaped sacrificial material layer 42' can be silicon nitride. The Z-shaped sacrificial material layer 42' can be formed by a conformal deposition process such as low pressure chemical vapor deposition. The thickness of the Z-shaped sacrificial material layer 42' can be in a range from 25 nm to 60 nm, although lesser and greater thicknesses can also be employed.

Figure 7:
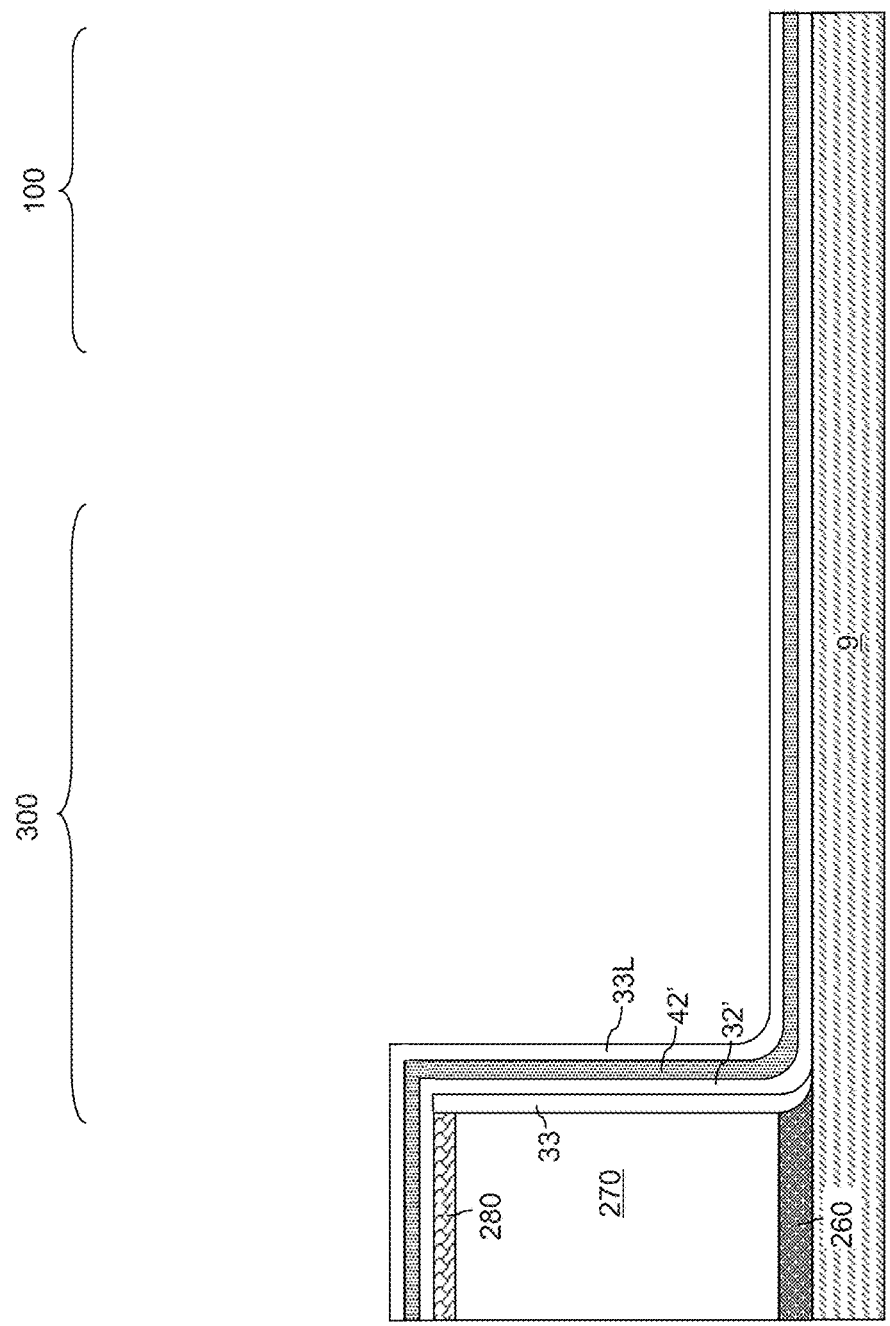
FIG. 7 is a schematic vertical cross-sectional view of the first exemplary structure after formation of a Z-shaped dielectric spacer material layer according to the first embodiment of the present disclosure.

Referring to FIG. 7, the processing steps of FIG. 3 can be performed to form another Z-shaped dielectric spacer material layer 33L, which is herein referred to as a second Z-shaped dielectric spacer material layer 33L. The second Z-shaped dielectric spacer material layer 33L can have the same composition and the same thickness as the Z-shaped dielectric spacer material layer 33L formed at the processing steps of FIG. 3.

Figure 8:
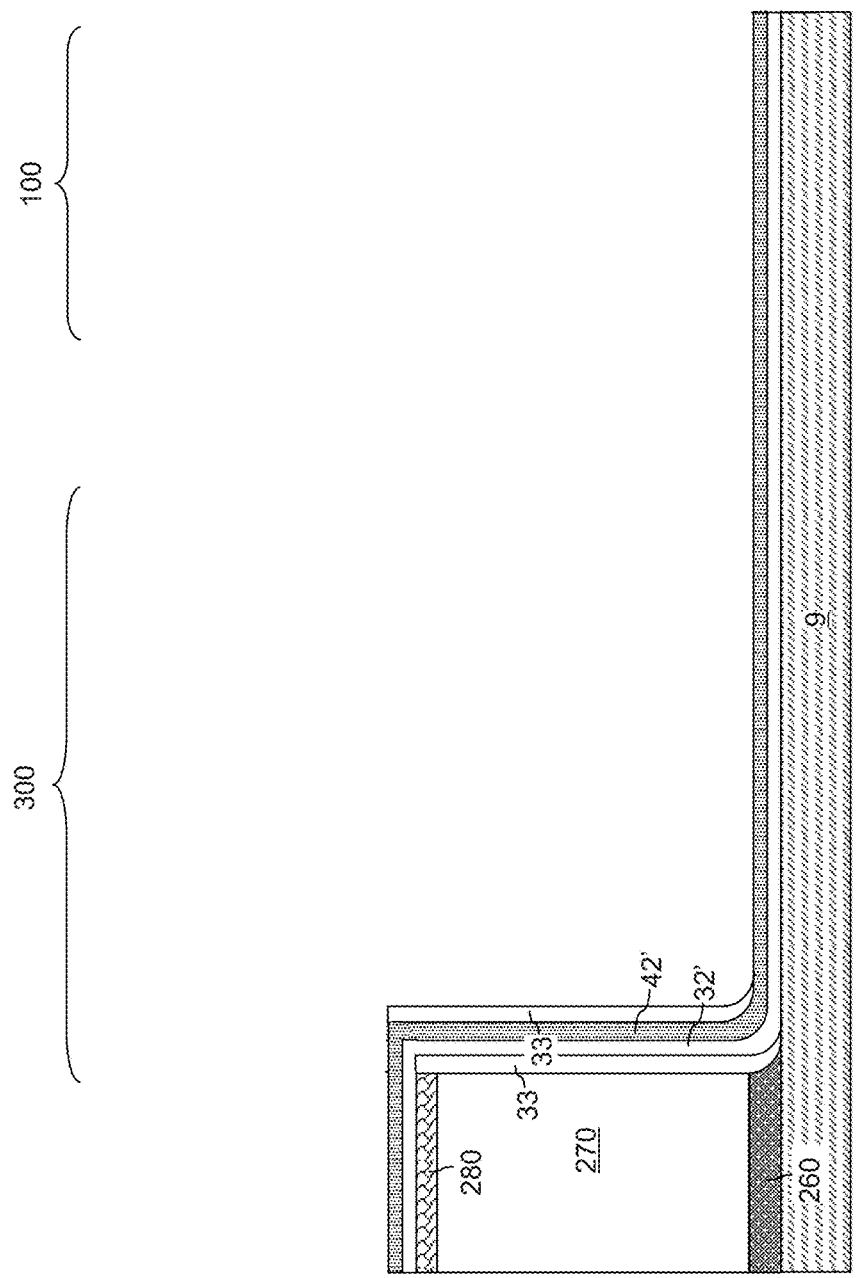
FIG. 8 is a schematic vertical cross-sectional view of the first exemplary structure after formation of a dielectric spacer according to the first embodiment of the present disclosure.

Referring to FIG. 8, the processing steps of FIG. 4 can be performed to form another dielectric spacer 33, which is herein referred to as a second dielectric spacer 33. The second dielectric spacer 33 can have the same composition and the same thickness as the dielectric spacer 33 that is formed at the processing steps FIG. 4.

Figure 9:
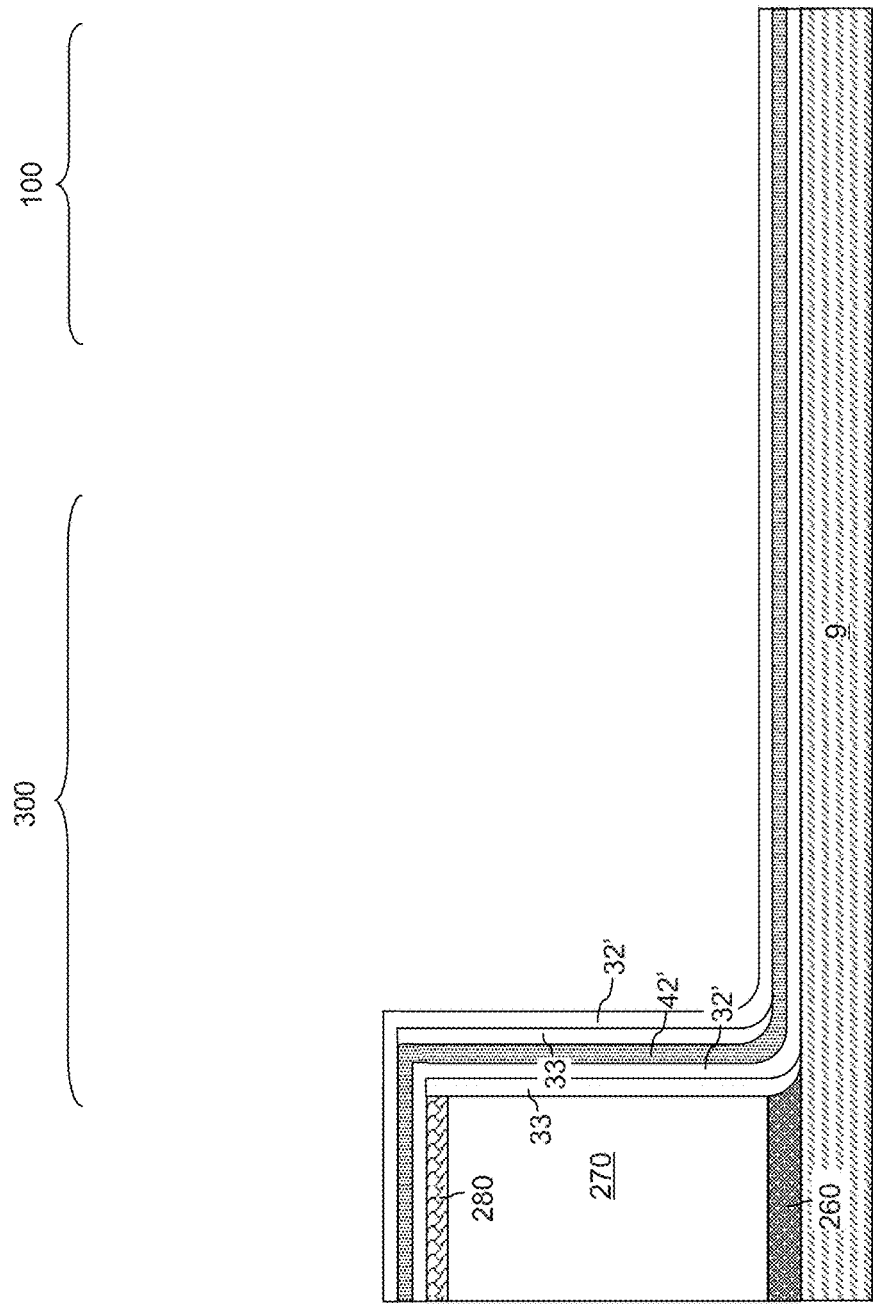
FIG. 9 is a schematic vertical cross-sectional view of the first exemplary structure after formation of a Z-shaped insulating layer according to the first embodiment of the present disclosure.

Referring to FIG. 9, the processing steps of FIG. 5 can be performed to form another Z-shaped insulating layer 32', which is herein referred to as a second Z-shaped insulating layer 32'. The second Z-shaped insulating layer 32' can have the same composition and the same thickness as the Z-shaped insulating layer 32' formed at the processing steps of FIG. 5.

Figure 10:
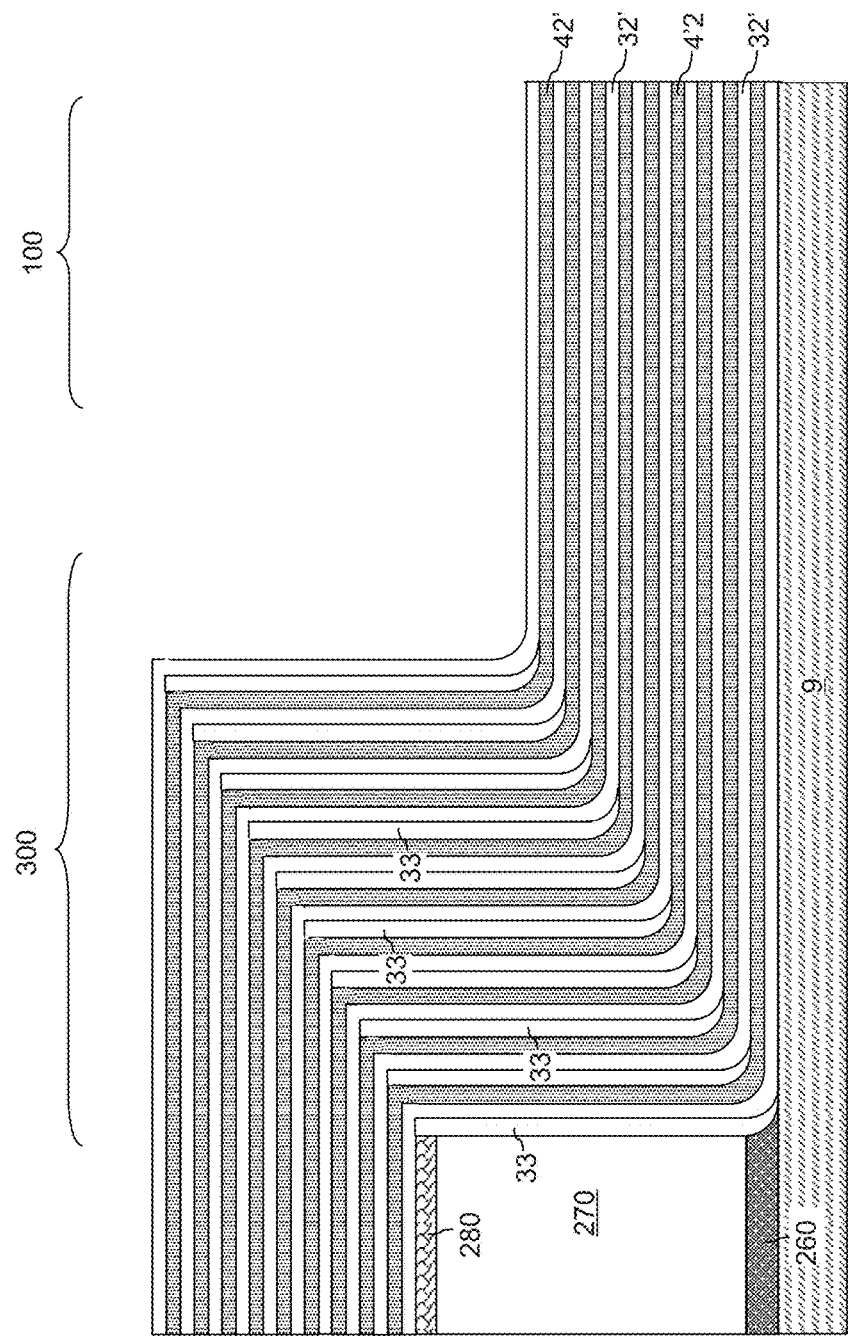
FIG. 10 is a schematic vertical cross-sectional view of the first exemplary structure after formation of multiple sets of a dielectric spacer, a Z-shaped insulating layer, and a Z-shaped sacrificial material layer according to the first embodiment of the present disclosure.

Referring to FIG. 10, the processing steps of FIG. 6 can be performed to form another Z-shaped sacrificial material layer 42', which is herein referred to as a second Z-shaped sacrificial material layer 42'. The second Z-shaped sacrificial material layer 42' can have the same composition and the same thickness as the Z-shaped sacrificial material layer 42' formed at the processing steps of FIG. 6.

Subsequently, the set of processing steps of FIGS. 3-6 can be repeated multiple times, such as 31 to 127 times. Each set of processing steps can form a dielectric spacer 33, a Z-shaped insulating layer 32', and a Z-shaped sacrificial material layer 42' to form a total of 32 to 128 sets of layers, such as 64 to 128 sets of layers (32, 33' 42'). Generally, a set of processing steps can be repeated multiple times provided that the set of processing steps includes an insulating layer deposition step in which a Z-shaped insulating layer 32' is conformally deposited, a dielectric spacer formation step in which a dielectric spacer 33 is formed, and a sacrificial material layer deposition step in which a Z-shaped sacrificial material layer 42' is conformally deposited. The order of the processing steps within the set of processing steps can be rearranged as needed. In some embodiments, a Z-shaped sacrificial material layer 42' is deposited directly on horizontal surfaces of a Z-shaped insulating layer 32' within each set of processing steps. In some other embodiments, a Z-shaped insulating layer 32' is deposited directly on horizontal surfaces of a Z-shaped sacrificial material layer 42' within each set of processing steps. In some embodiments, a Z-shaped sacrificial material layer 42' is deposited directly on a sidewall of a dielectric spacer 33 within each set of processing steps. In some other embodiments, a Z-shaped insulating layer 32' is deposited directly on a sidewall of a dielectric spacer 33 within each set of processing steps.

An alternating stack (32', 42') of Z-shaped insulating layers 32' and Z-shaped sacrificial material layers 42' is formed over the substrate semiconductor layer 9 and the mesa structure (260, 270). A dielectric spacer 33 is provided between each neighboring pairs of a Z-shaped insulating layer 32' and a Z-shaped sacrificial material layer 42'. The lateral extent of vertical portions of the alternating stack (32', 42') in the contact region 300 is greater than the vertical thickness of the alternating stack (32', 42') in the memory array region 100 by the total lateral thickness of the dielectric spacers 33. In one embodiment, the dielectric spacers 33 have a lateral width that is in a range from 50% to 400% of an average lateral width of the non-horizontally extending portions, such as the vertically-extending portions of the insulating layers 32'.

Figure 11:
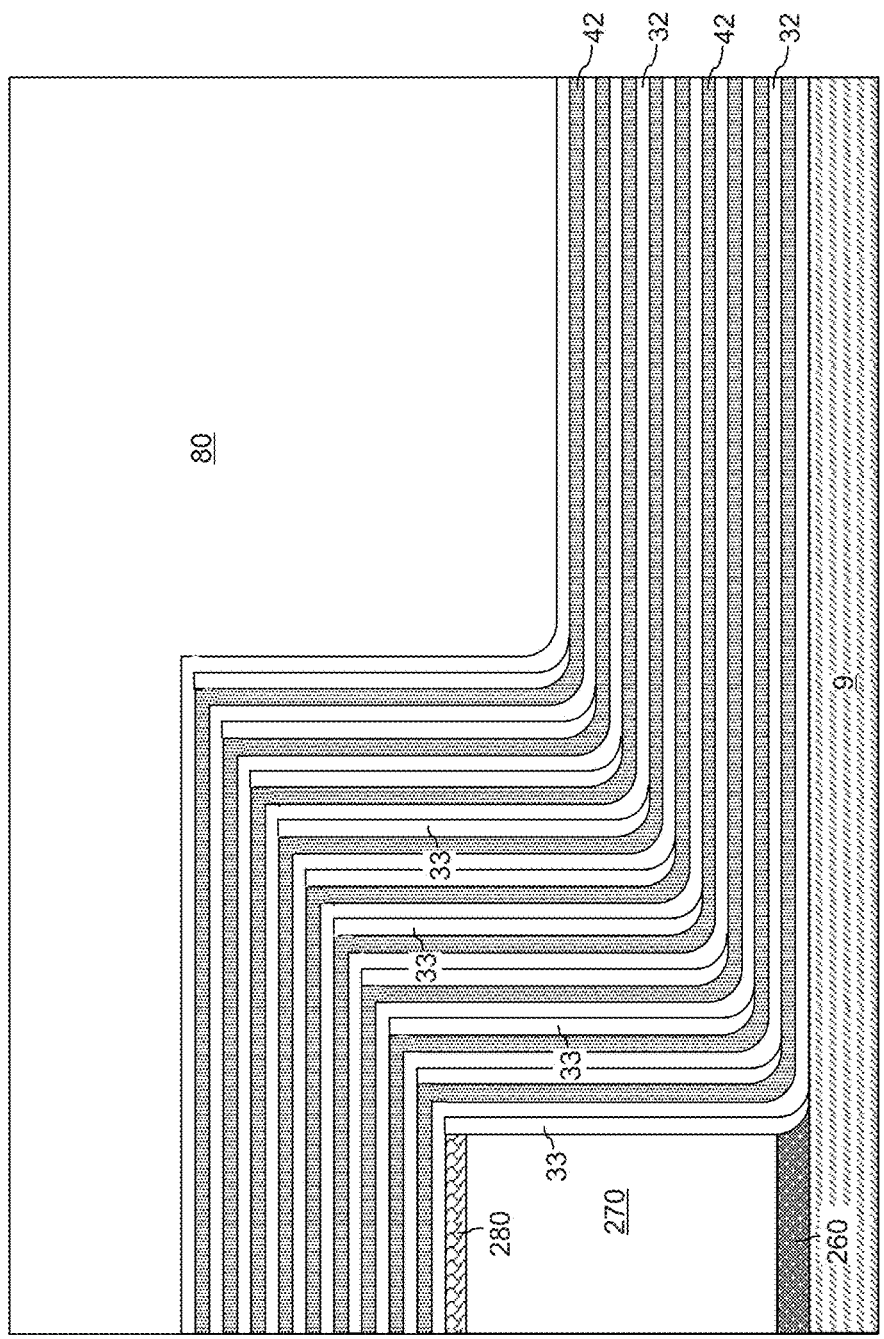
FIG. 11 is a schematic vertical cross-sectional view of the first exemplary structure after formation of a planarization dielectric layer according to the first embodiment of the present disclosure.

Referring to FIG. 11, a planarizable dielectric material is deposited over the alternating stack (32', 42') to form a planarization dielectric layer 80. The planarizable dielectric material may be a self-planarizing material such as spin-on glass (SOG), or a dielectric material such as doped silicate glass or undoped silicate glass that can be planarized by chemical mechanical planarization (CMP) process. The lowest portion of the top surface of the planarization dielectric layer 80 can be located above the horizontal plane including the top surface of the upper template structure 270.

Figure 12:
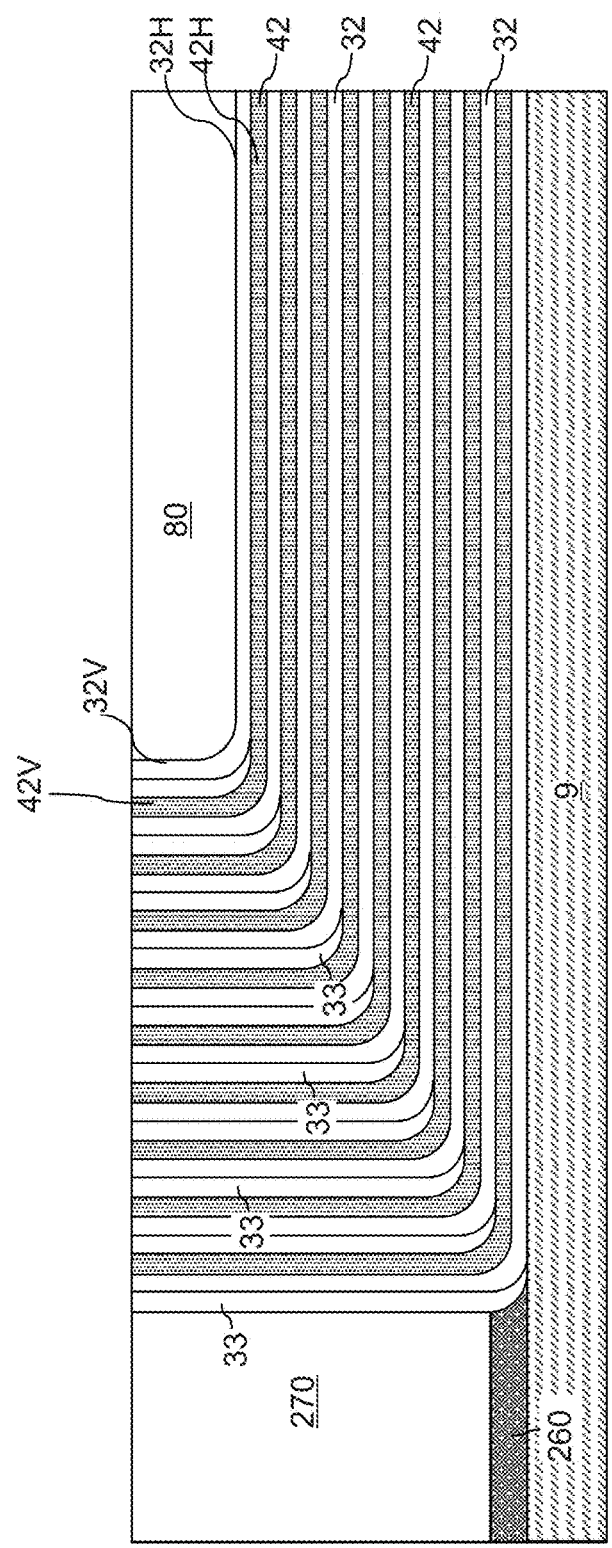
FIG. 12 is a schematic vertical cross-sectional view of the first exemplary structure after a planarization process that forms L-shaped insulating layers and L-shaped sacrificial material layers according to the first embodiment of the present disclosure.

Referring to FIG. 12, the portions of the planarization dielectric layer 80, the alternating stack (32', 42') and the dielectric spacers 33 interspersed therein, and the planarization stopping structure 280 can be removed from above the horizontal plane including the top surface of the upper template structure 270. In one embodiment, a chemical mechanical planarization process can be performed employing the planarization stopping structure 280 as a stopping structure. Over-polishing can be performed to remove additional portions of the planarization dielectric layer 80 and the alternating stack (32', 42') and the dielectric spacers 33 from above the horizontal plane including the top surface of the upper template structure 270. Alternatively or additionally, a recess etch can be performed instead of, or in addition to, the over-polishing so that the recessed surfaces of the planarization dielectric layer 80 and the alternating stack (32', 42') and the dielectric spacers 33 are substantially coplanar with the top surface of the upper template structure 270. Any remaining portion of the planarization stopping structure 280, if present, can be removed by an etch process, which can be a reactive ion etch process or an isotropic etch process such as a wet etch process.

Generally, portions of the Z-shaped insulating layers 32', the dielectric spacers 33, and the Z-shaped sacrificial material layers 42' can be removed from above the horizontal plane including the top surface of the mesa structure (260, 270) by a planarization process. An alternating stack of L-shaped insulating layers 32 and L-shaped sacrificial material layers 42 is formed over the substrate and on a sidewall of the mesa structure (260, 270). Each L-shaped insulating layer 32 is a remaining portion of a Z-shaped insulating layer 32', and each L-shaped sacrificial material layer 42 is a remaining portion of a Z-shaped sacrificial material layer 42'. Each of the L-shaped insulating layers 32 and the L-shaped sacrificial material layers 42 includes a respective horizontally-extending portion (32H, 42H) and a respective non-horizontally extending portion (32V, 42V) having an angle of 60 to 90 degrees with respect to a horizontal direction, such as a vertically-extending portion. In one embodiment, each horizontally-extending portion has a uniform vertical thickness and each non-horizontally extending portion has a uniform horizontal thickness. The uniform vertical thickness and the uniform horizontal thickness can be the same for each of the L-shaped insulating layers 32 and the L-shaped sacrificial material layers 42. The dielectric spacers 33 are located between neighboring pairs of a vertically-extending portion of an L-shaped insulating layer 32 and a vertically-extending portion of an L-shaped sacrificial material layer 42 after the planarization process.

Figure 13:
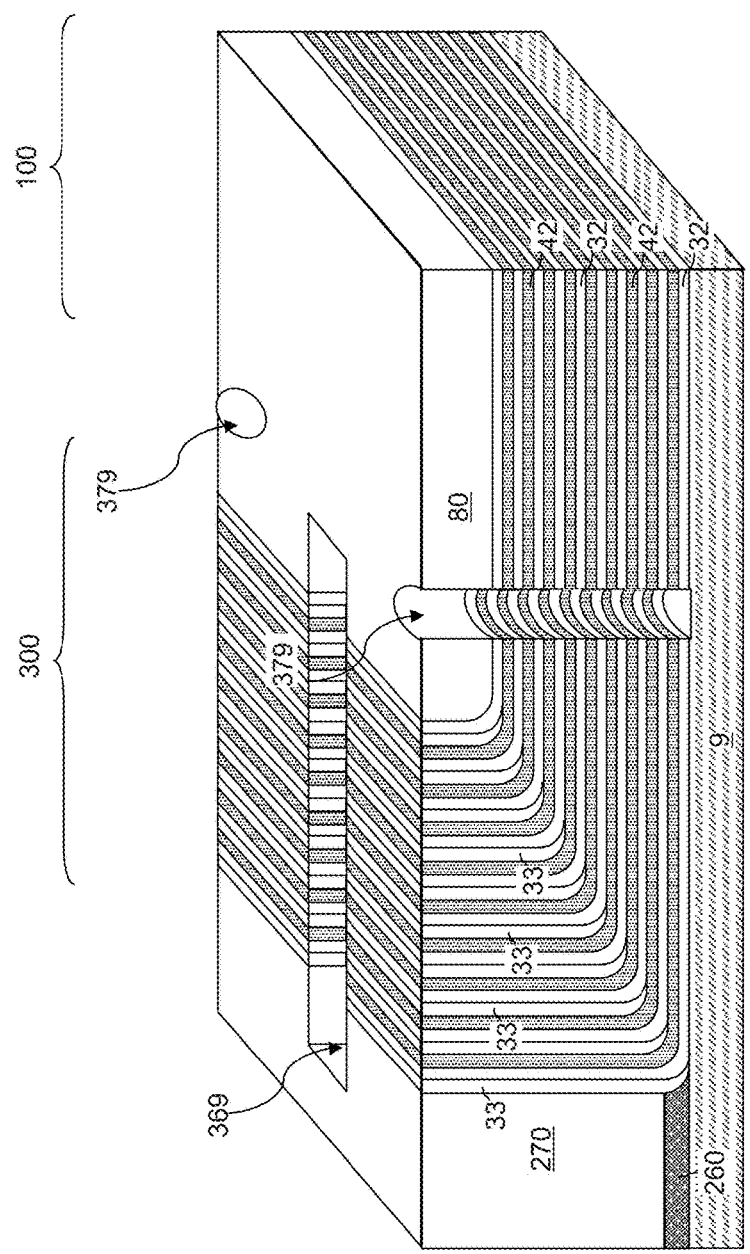
FIG. 13 is a perspective view of the first exemplary structure after formation of various support openings according to the first embodiment of the present disclosure.

Referring to FIG. 13, a photoresist layer (not shown) can be applied over the first exemplary structure, and can be lithographically patterned to form openings therein. The pattern in the photoresist layer can be transferred through the planarization dielectric layer 80, the alternating stack (32, 42) and the dielectric spacers 33, and the mesa structure (260, 270) by an anisotropic etch process. Support openings (369, 379) are formed through the alternating stack (32, 42) and the dielectric spacers 33, and the mesa structure (260, 270). The support openings (369, 379) can include trench-type support openings 369 that laterally extend along a respective lengthwise direction, and cylindrical-type support openings 379 that have a respective generally cylindrical shape.

In one embodiment, at least one of the trench-type support openings 369 can laterally extend through the entire width of the vertically-extending portions of the alternating stack (32, 42) of L-shaped insulating layers 32 and L-shaped sacrificial material layers 42 and the dielectric spacers 33 in the contact region 300. In this case, sidewalls of at least one of the trench-type support openings 369 can include sidewalls of the planarization dielectric layer 80, sidewalls of the horizontally-extending portions (32H, 42H) of the alternating stack (32, 42), sidewalls of the mesa structure (260, 270), and sidewalls of the non-horizontally extending portions (e.g., vertically-extending portions) (32V, 42V) of the alternating stack (32, 42) of L-shaped insulating layers 32 and L-shaped sacrificial material layers 42 and the dielectric spacers 33.

In one embodiment, the cylindrical-type support openings 379 can be formed within a peripheral portion of the contact region 300 and/or a peripheral portion of the memory array region 100. In one embodiment, the sidewalls of the cylindrical-type support openings 379 can consist of sidewalls of the planarization dielectric layer 80, sidewalls of the horizontally-extending portion of the alternating stack (32, 42), and optionally sidewalls of the substrate semiconductor layer 9 if the cylindrical-type support openings 379 extend into the substrate semiconductor layer 9. The photoresist layer can be subsequently removed, for example, by ashing.

Figure 14:
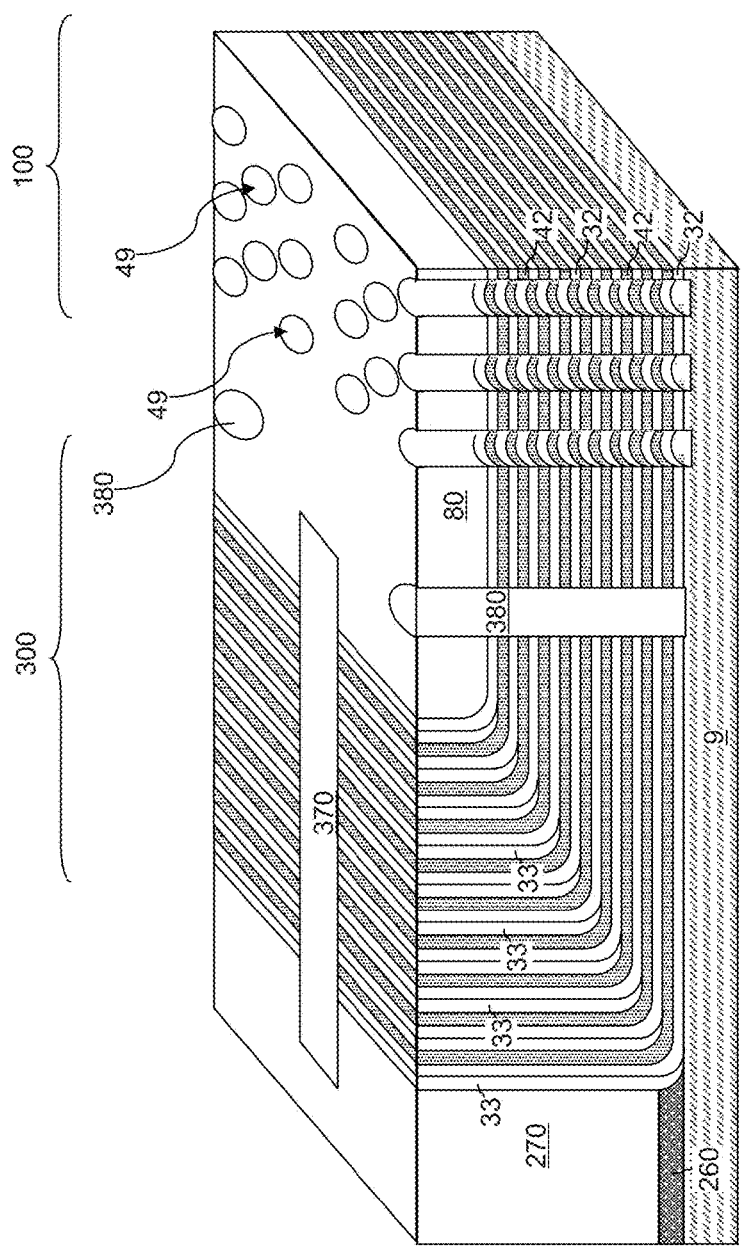
FIG. 14 is a perspective view of the first exemplary structure after formation of a first dielectric wall structure and dielectric support pillar structures and formation of memory openings according to the first embodiment of the present disclosure.

Referring to FIG. 14, a dielectric material such as silicon oxide is deposited in the support openings (369, 379), for example, by spin-coating or a conformal deposition process. The deposited dielectric material may be removed from above the horizontal plane including the top surface of the planarization dielectric layer 80 by a planarization process, which can employ chemical mechanical planarization and/or a recess etch. Each portion of the deposited dielectric material within a trench-type support opening 369 constitutes a dielectric wall support structure, which is herein referred to as a first dielectric wall structure 370. Each first dielectric wall structure 370 is a support structure including a dielectric material and having a wall configuration, i.e., a pair of parallel sidewalls that horizontally extend along a lengthwise direction. Each portion of the deposited dielectric material within a cylindrical-type support opening 379 is a support structure including a dielectric material, and is herein referred to as a support pillar structure 380. Each of the first dielectric wall structures 370 and the support pillar structures 380 can have straight sidewalls that extend vertically from the top surface of the planarization dielectric layer 80 to the substrate semiconductor layer 9. The first dielectric wall structure 370 are formed through the vertically-extending portions of the L-shaped insulating layers 32 and the L-shaped sacrificial material layers 42 of the alternating stack (32, 42).

Subsequently, a lithographic material stack (not shown) including at least a photoresist layer can be formed over the first exemplary structure, and can be lithographically patterned to form openings within the memory array region 100. The pattern in the lithographic material stack can be transferred through the planarization dielectric layer 80 and through horizontally-extending portions of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

Figure 15:
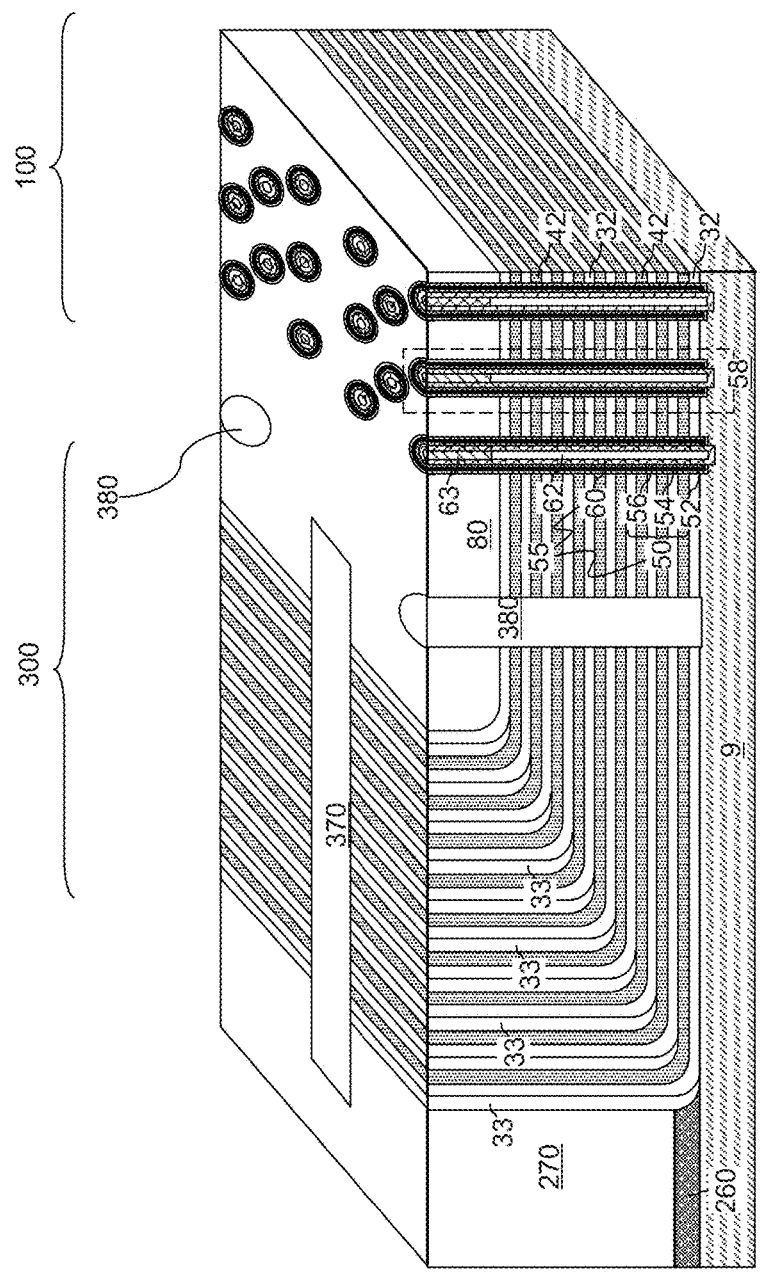
FIG. 15 is a perspective view of the first exemplary structure after formation of memory opening fill structures according to the first embodiment of the present disclosure.

Referring to FIG. 15, a memory opening fill structure 58 is formed within each memory opening 49. Each memory opening fill structure 58 includes a memory stack structure 55, an optional dielectric core 62, and a drain region 63.

For example, a memory film 50 including a blocking dielectric layer 52, a charge storage layer 54, and a tunneling dielectric layer 56 can be sequentially deposited in each of the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide (LaO$_2$), yttrium oxide (Y$_2$O$_3$), tantalum oxide (Ta$_2$O$_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within backside recesses into sacrificial material layers 42. In one embodiment, the charge storage layer 54 includes a silicon nitride layer. In one embodiment, the L-shaped sacrificial material layers 42 and the L-shaped insulating layers 32 can have vertically coincident sidewalls, and the charge storage layer 54 can be formed as a single continuous layer.

In another embodiment, the L-shaped sacrificial material layers 42 can be laterally recessed with respect to the sidewalls of the L-shaped insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer (not expressly shown) may be deposited on the tunneling dielectric. The optional first semiconductor channel layer, the tunneling dielectric layer 56, the charge storage layer 54, and the blocking dielectric layer 52 are sequentially anisotropically etched employing at least one anisotropic etch process. The portions of the optional first semiconductor channel layer, the tunneling dielectric layer 56, the charge storage layer 54, and the blocking dielectric layer 52 located above the top surface of the planarization dielectric layer 80 can be removed by the at least one anisotropic etch process or a chemical mechanical planarization (CMP) process. Further, the horizontal portions of the optional first semiconductor channel layer, the tunneling dielectric layer 56, the charge storage layer 54, and the blocking dielectric layer 52 at a bottom of each memory opening 49 can be removed to form openings in remaining portions thereof. A semiconductor surface of the substrate semiconductor layer 9 can be physically exposed at the bottom of each memory opening 49.

A semiconductor channel material layer can be deposited directly on the semiconductor surface of the substrate semiconductor layer 9. If the optional first semiconductor channel layer is present, then the semiconductor channel material layer comprises a second semiconductor channel layer formed on a surface of the optional first semiconductor channel layer. If the optional first semiconductor channel layer is not present, then the semiconductor channel material layer is formed directly on the tunneling dielectric layer 56. The semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer includes amorphous silicon or polysilicon. The semiconductor channel material layer can be formed by a conformal deposition method such as low pressure chemical vapor deposition (LPCVD). The thickness of the semiconductor channel material layer can be in a range from 2 nm to 10 nm, although lesser and greater thicknesses can also be employed. The semiconductor channel material layer may partially or fully fill the cavities in the memory openings 49. Any remaining semiconductor material of the semiconductor channel material layer located above the top surface of the planarization dielectric layer 80 can be removed by a planarization process, which can employ a recess etch or chemical mechanical planarization (CMP). Each remaining portion of the semiconductor channel material layer in the memory openings 49 constitutes a vertical semiconductor channel 60.

In case the cavities in each memory opening 49 are not completely filled by the vertical semiconductor channel 60, a dielectric core layer can be deposited in the cavity to fill any remaining portion of the cavity within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. Subsequently, the horizontal portion of the dielectric core layer can be removed, for example, by a recess etch from above the top surface of the planarization dielectric layer 80. Each remaining portion of the dielectric core layer in the memory openings 49 constitutes a dielectric core 62.

Each vertical semiconductor channel 60 formed in the memory openings 49 is a channel of a vertical field effect transistor through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each contiguous set of a blocking dielectric layer 52, a charge storage layer 54, and a tunneling dielectric layer 56 within a memory opening 49 collectively constitutes a memory film 50, which can store electrical charges with a macroscopic retention time.

In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 located within a same memory opening 49 constitutes a memory stack structure 55.

The top surface of each dielectric core 62 can be further recessed within each memory opening, for example, by a recess etch to a depth that is located between the top surface of the planarization dielectric layer 80 and the bottom surface of the planarization dielectric layer 80. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the planarization dielectric layer 80, for example, by chemical mechanical planarization (CMP) or a recess etch to form the drain regions 63. Each combination of a memory film 50 and a vertical semiconductor channel 60 within a memory opening 49 constitutes a memory stack structure 55.

Figure 16:
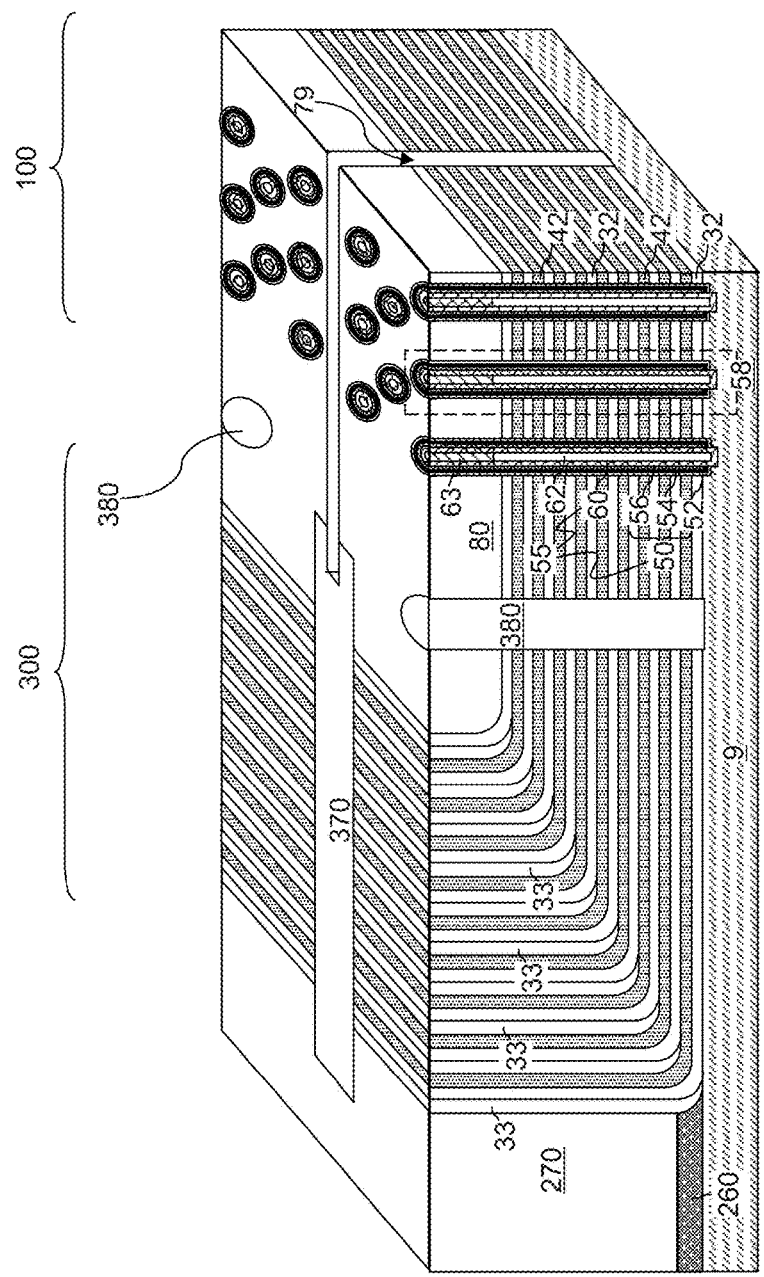
FIG. 16 is a perspective view of the first exemplary structure after formation of a backside trench according to the first embodiment of the present disclosure.

Referring to FIG. 16, a photoresist layer (not shown) can be applied over the alternating stack (32, 42), and is lithographically patterned to form at least one elongated opening between clusters of memory stack structures 55 within the memory array region 100. The pattern in the photoresist layer can be transferred through the planarization dielectric layer 80 and the alternating stack (32, 42) employing an anisotropic etch to form at least one backside trench 79, which extends at least to the top surface of the substrate semiconductor layer 9. In one embodiment, the at least one backside trench 79 can be adjoined a respective one of the first dielectric wall structures 370. In one embodiment, the at least one backside trench 79 can include a source contact opening in which a source contact via structure can be subsequently formed. The photoresist layer can be subsequently removed, for example, by ashing.

Figure 17:
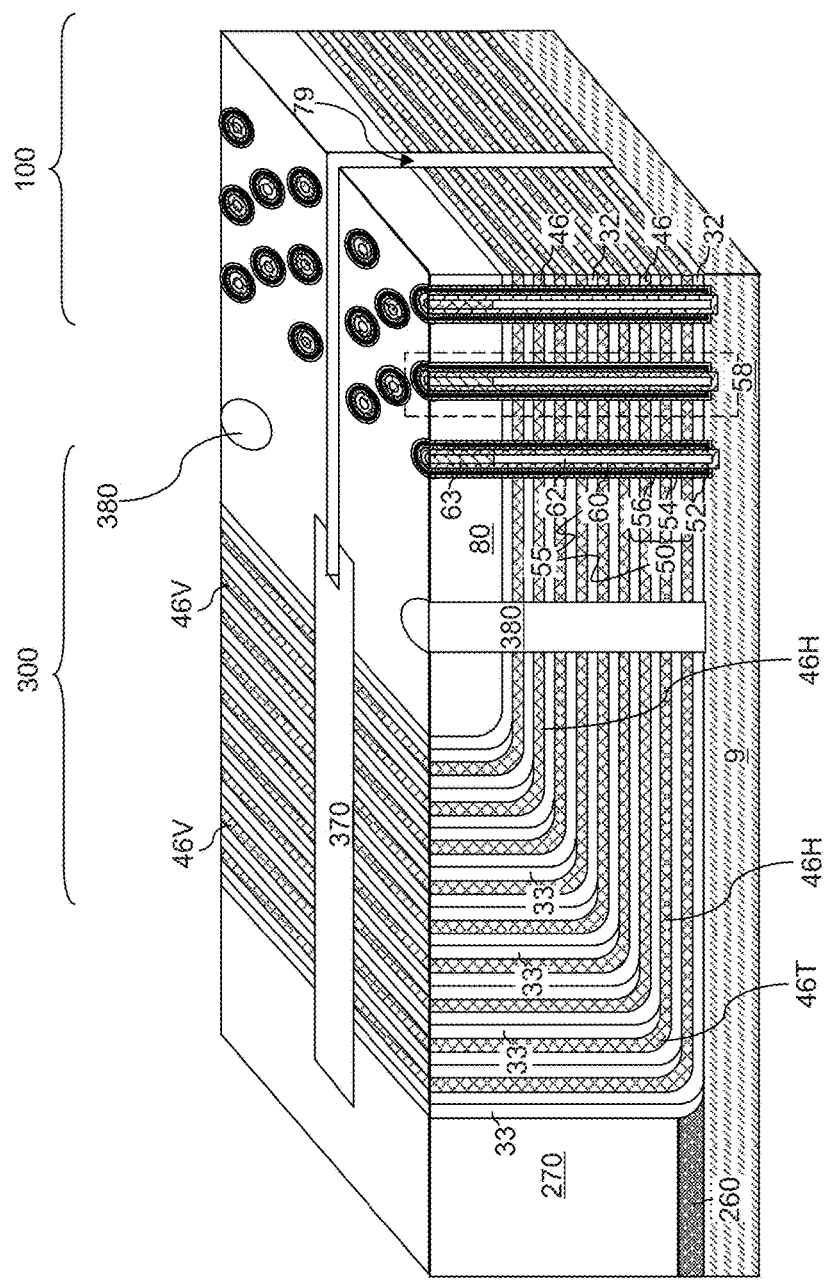
FIG. 17 is a perspective view of the first exemplary structure after replacement of L-shaped sacrificial material layer with L-shaped electrically conductive layers according to the first embodiment of the present disclosure.

Referring to FIG. 17, the L-shaped sacrificial material layers 42 can be replaced with L-shaped electrically conductive layers 46. For example, an etchant that selectively etches the material of the L-shaped sacrificial material layers 42 with respect to the material of the L-shaped insulating layers 32 can be introduced into the at least one backside trench 79, for example, employing an etch process. Backside recesses are formed in volumes from which the L-shaped sacrificial material layers 42 are removed. The removal of the material of the L-shaped sacrificial material layers 42 can be selective to the material of the L-shaped insulating layers 32, the semiconductor material of the substrate semiconductor layer 9, and the material of the outermost layer of the memory films 50. In one embodiment, the L-shaped sacrificial material layers 42 can include silicon nitride, and the L-shaped insulating layers 32 include silicon oxide.

The etch process that removes the material selective to the material and the outermost layer of the memory films 50 can be a wet etch process employing a wet etch solution, or can be a gas phase (dry) etch process in which the etchant is introduced in a vapor phase into the at least one backside trench 79. For example, if the L-shaped sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The first dielectric wall structures 370, the support pillar structures 380, and the memory stack structures 55 provide structural support to prevent collapse of the L-shaped insulating layers 32 while the backside recesses are present within volumes previously occupied by the L-shaped sacrificial material layers 42.

Each backside recess can include a horizontally-extending portion and a non-horizontally-extending portion, which may extend vertically or substantially vertically. Each backside recess extends to the horizontal plane including the top surface of the planarization dielectric layer 80, the top surface of the mesa structure (260, 270), and the top surfaces of the first dielectric wall structures 370 and the support pillar structures 380. A plurality of backside recesses can be formed in the volumes from which the material of the L-shaped sacrificial material layers 42 is removed. The memory openings in which the memory stack structures 55 are formed are herein referred to as front side openings or front side cavities in contrast with the backside recesses. In one embodiment, the memory array region 100 comprises an array of monolithic three-dimensional NAND strings having a plurality of device levels disposed above the substrate semiconductor layer 9. In this case, each backside recess can define a space for receiving a respective word line of the array of monolithic three-dimensional NAND strings.

Each horizontally-extending portion of the backside recesses can extend substantially parallel to the top surface of the substrate semiconductor layer 9. Each horizontally-extending portion of the backside recesses can be vertically bounded by a top surface of an underlying insulating layer 32 and a bottom surface of an overlying insulating layer 32. In one embodiment, each horizontally-extending portion of the backside recesses can have a uniform height throughout.

Each non-horizontally-extending portion of the backside recesses can extend at an angle of 60 to 90 degrees with respect to a horizontal direction, such as vertically or substantially vertically (e.g., within 5 degrees of vertical). Each non-horizontally-extending portion of the backside recesses can be laterally bounded by a sidewall of a vertically-extending portion of an L-shaped insulating layer 32 and a sidewall of a dielectric spacer 33 (if present). In one embodiment, each non-horizontally-extending portion of the backside recesses can have a uniform width throughout, which can be the same as the uniform height of an adjoining horizontally-extending portion of the same backside recess.

Optionally, a backside blocking dielectric layer (not shown) can be optionally formed. The backside blocking dielectric layer, if present, comprises a dielectric material that functions as a control gate dielectric for the control gates to be subsequently formed in the backside recesses. In case the blocking dielectric layer 52 is present within each memory opening, the backside blocking dielectric layer is optional. In case the blocking dielectric layer 52 is omitted, the backside blocking dielectric layer is present. The backside blocking dielectric layer can be formed in the backside recesses and on a sidewall of the backside trench 79. The backside blocking dielectric layer can be formed directly on horizontal surfaces of the L-shaped insulating layers 32 and sidewalls of the memory stack structures 55 within the backside recesses. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conductive material is deposited within the backside recesses to form electrically conductive layers 46. The at least one conductive material deposited in the at least one backside trench 79 and over the planarization dielectric layer 80 constitutes a continuous conductive material layer (not shown) that is subsequently removed. A backside cavity is present within each backside trench 79. The at least one conductive material can include, for example, a metallic liner material such as a conductive metal nitride (e.g., TiN, TaN, or WN) and a metallic fill material that consists essentially of at least one metal. The metallic fill material can consist essentially of a single elemental metal (such as Cu, Co, W, or Al) or an intermetallic alloy of at least two elemental metals. In one embodiment, the at least one conductive material can include a titanium nitride liner and a tungsten fill material. The at least one conductive material can be deposited by a conductive deposition process such as chemical vapor deposition (CVD) and/or atomic layer deposition (ALD). The at least one conductive material fills each of the backside recesses. Each continuous portion of the deposited at least one conductive material located within a backside recess constitutes an electrically conductive layer 46. Each electrically conductive layer 46 can include an optional metallic liner portion that include the metallic liner material and a metallic fill portion that includes the metallic fill material.

The continuous conductive material layer (i.e., the continuous portion of the at least one conductive material deposited in the at least one backside trench 79 or over the horizontal plane including the top surfaces of the planarization dielectric layer 80 and the mesa structure (260, 270)) can be removed by an etch process, which may be an isotropic etch process. Each of the L-shaped electrically conductive layers 46 comprises a respective continuously-extending conductive material portion of a homogeneous composition that includes a respective horizontally-extending portion 46H that extend parallel to the top surface of the substrate semiconductor layer 9 and a respective non-horizontally-extending portion (such as a vertically extending portion) 46V that extends parallel to the at least one sidewall of the mesa structure (260, 270). In one embodiment, each of the L-shaped electrically conductive layers 46 further comprises a tapered portion 46T which extends in a direction between the vertical and horizontal directions (e.g., at an angle of 10 to 80 degrees with respect to the horizontal direction) and which connects respective vertically-extending 46V and horizontally-extending portions 46H of the respective L-shaped electrically conductive layers 46. The tapered portion 46T of each electrically conductive layer 46 is formed over the tapered sidewall 260T of the lower template layer 260L of the mesa structure (260, 270). As used herein, a "continuously-extending" element or an "integral" refers to an element that consists of a single continuous structure such that each point within the structure can be connected to any other point within the structure by a line that is contained entirely within the volume of the structure. As used herein, a "homogeneous composition" refers to a composition that is the same throughout the entirety of an element.

Specifically, each metallic liner portion within the L-shaped electrically conductive layers 46 is a continuously-extending conductive material portion of a homogeneous composition that includes a respective horizontally-extending portion 46H that extend parallel to the top surface of the substrate semiconductor layer 9 and a respective non-horizontally-extending portion 46V that extend parallel to the at least one sidewall of the mesa structure (260, 270). Further, each metallic fill portion within the L-shaped electrically conductive layers 46 is a continuously-extending conductive material portion of a homogeneous composition that includes a respective horizontally-extending portion that extend parallel to the top surface of the substrate semiconductor layer 9 and a respective non-horizontally-extending portion that extend parallel to the at least one sidewall of the mesa structure (260, 270). Each of the continuously-extending conductive material portions, as embodied as a metallic liner portion or as a metallic fill portion, is free of any physical interface therein. As used herein, a "physical interface" in an element refers to a region including at least one physically observable inhomogeneity therein such as an interfacial compositional change or an interfacial microstructural change.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 18:
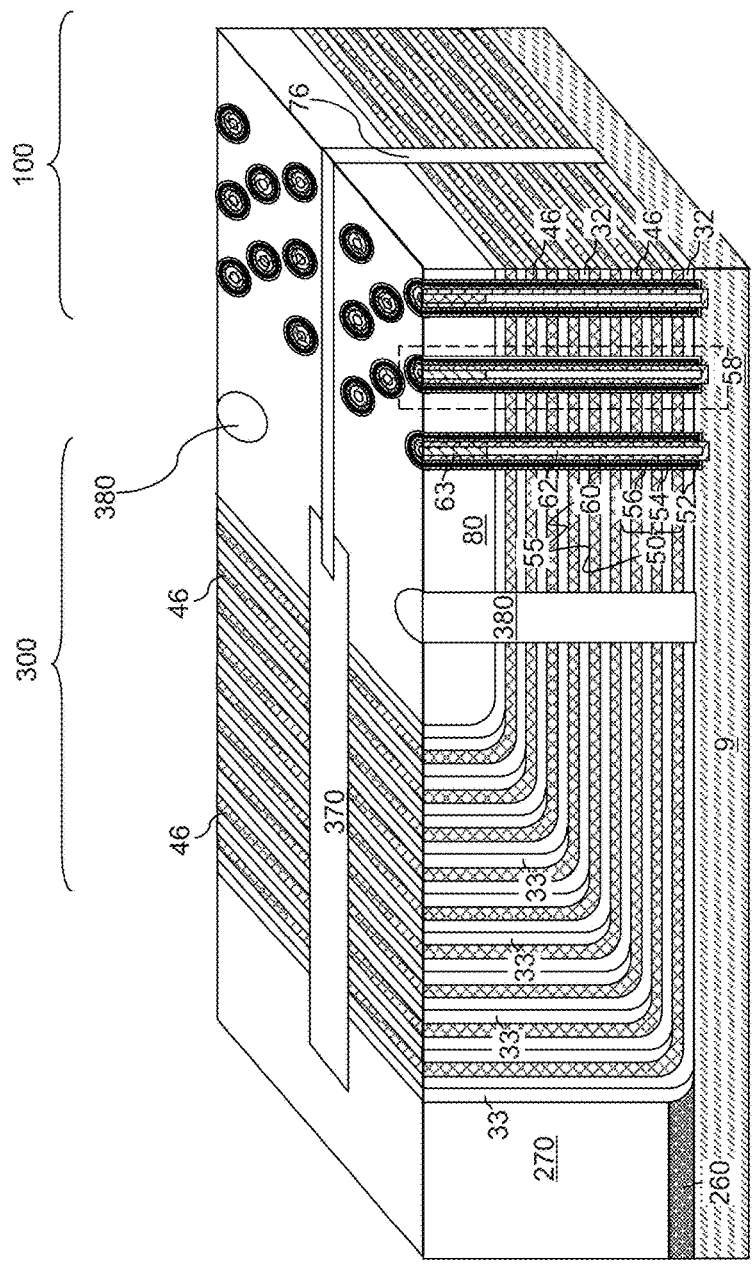
FIG. 18 is a perspective view of the first exemplary structure after formation of a second dielectric wall structure according to the first embodiment of the present disclosure.

Referring to FIG. 18, a dielectric material such as doped silicate glass or undoped silicate glass can be deposited in the at least one backside trench 79 by a conformal deposition process such as chemical vapor deposition. Excess portions of the deposited dielectric material may, or may not, be removed from above the top surface including the top surface of the planarization dielectric layer 80. A second dielectric wall structure 76 is formed within each of the at least one backside trench 79. Each second dielectric wall structure 76 is formed through the horizontally-extending portions of the L-shaped insulating layers 32 and the L-shaped electrically conductive layers 46, which form an alternating stack (32, 46). In one embodiment, a second dielectric wall structure 76 can contact a sidewall of a first dielectric wall structure 370. In an alternative embodiment, a source region is implanted through the backside trench 79 into the substrate semiconductor layer 9, and the dielectric wall structure 370 comprises a dielectric spacer. In this alternative embodiment, an electrically conductive source line or source electrode is formed inside the dielectric wall structure 370 in contact with the source region.

Figure 19:
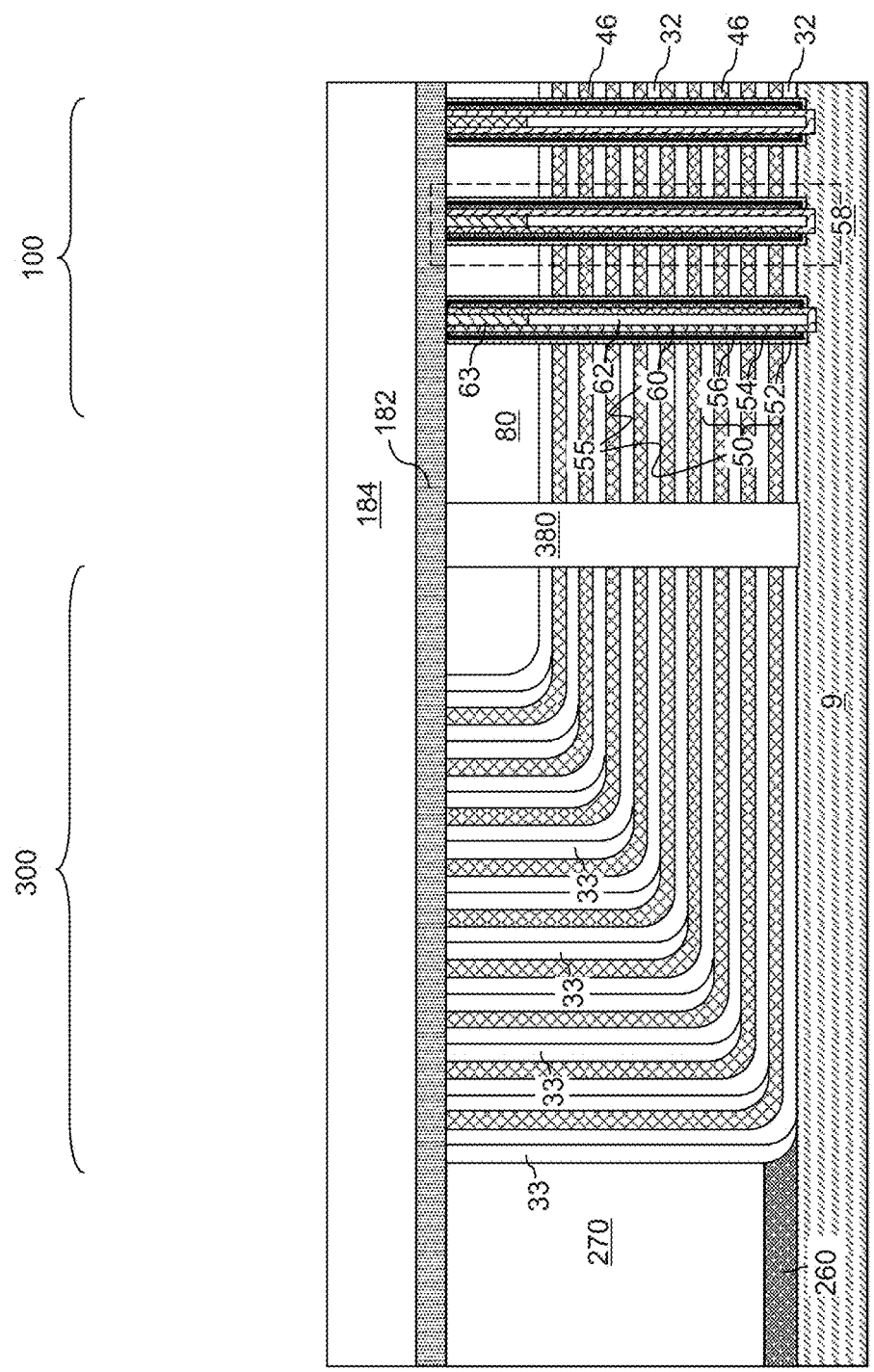
FIG. 19 is a vertical cross-sectional view of the first exemplary structure after formation of at least one contact level dielectric layer according to the first embodiment of the present disclosure.

Referring to FIG. 19, at least one contact level dielectric layer (182, 184) can be formed over the top surface of the planarization dielectric layer 80, over the vertically-extending portions of the alternating stack (32, 46) and the optional dielectric spacers 33, and the mesa structure (260, 270). In case the dielectric material that fills the at least one backside trench is not removed, an additional dielectric material layer may be present between the planarization dielectric layer 80 and the at least one contact level dielectric layer (182, 184). Alternatively, a horizontal portion of the dielectric material that fills the at least one backside trench may remain over the planarization dielectric layer 80, and may be employed in lieu of all, or a part of, the at least one contact level dielectric layer (182, 184).

In an illustrative example, the at least one contact level dielectric layer (182, 184) can include a first contact level dielectric layer 182 and a second contact level dielectric layer 184. The first contact level dielectric layer 182 can include silicon nitride, and can have a thickness in a range from 10 nm to 100 nm. The second contact level dielectric layer 184 can include silicon oxide, and can have a thickness in a range from 100 nm to 1,000 nm.

Figure 20:
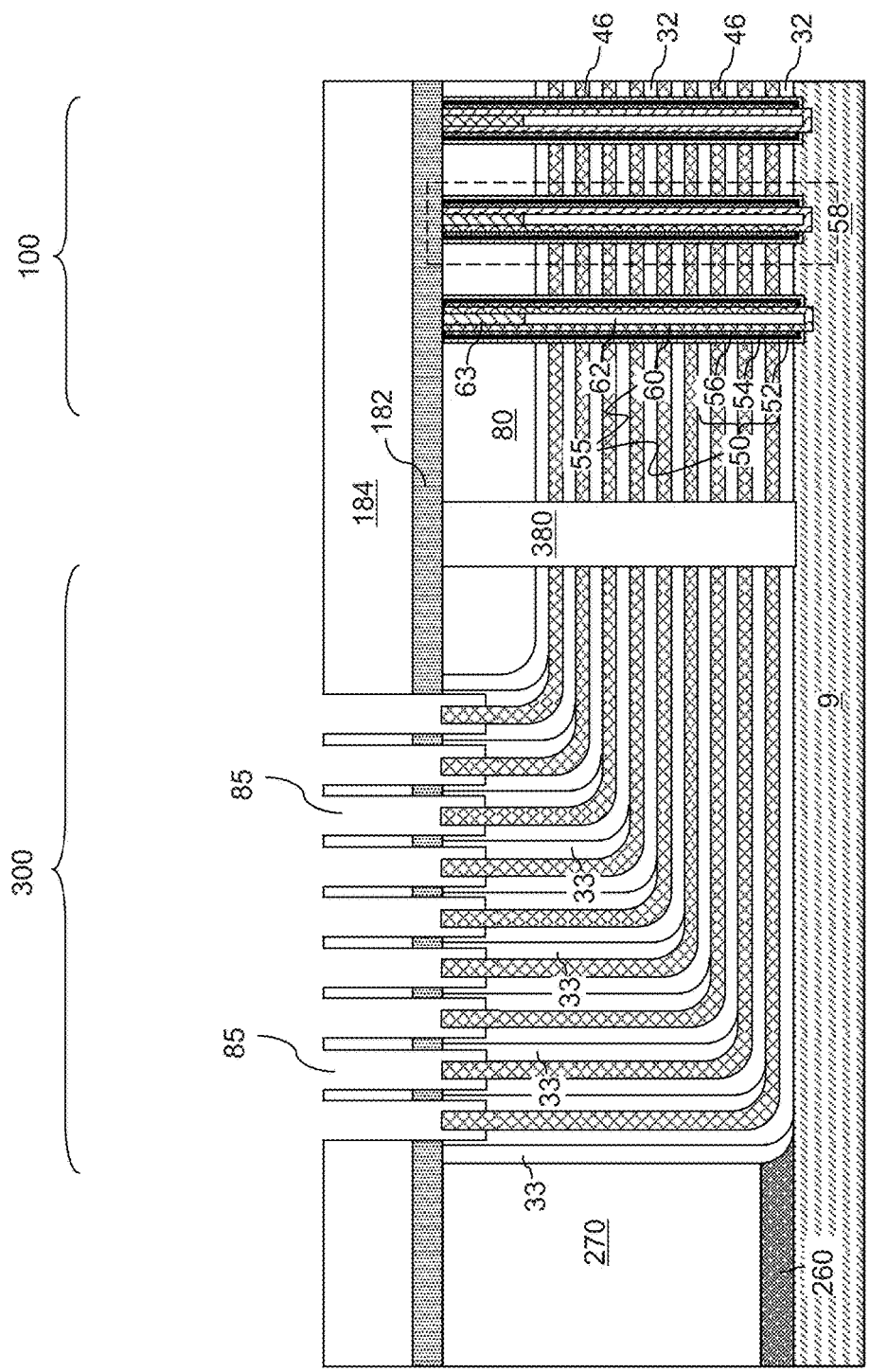
FIG. 20 is a vertical cross-sectional view of the first exemplary structure after formation of word line contact via cavities according to the first embodiment of the present disclosure.

Referring to FIG. 20, a photoresist layer (not shown) can be applied over the at least one contact level dielectric layer (182, 184), and can be lithographically patterned to form openings in the contact region 300. The openings in the photoresist layer can be formed in areas that overlie the vertically-extending portions of the L-shaped electrically conductive layers 46. The pattern in the photoresist layer can be transferred through the at least one contact level dielectric layer (182, 184) and optionally partly through the vertically-extending portions of the L-shaped insulating layers 32 and the dielectric spacers 33. Contact via cavities are formed through the at least one contact level dielectric layer (182, 184) and into upper regions of the vertically-extending portions of the L-shaped insulating layers 32 and the dielectric spacers 33. The contact via cavities are herein referred to as word line contact via cavities 85.

At least a top surface of a respective one of the non-horizontally extending portions, such as vertically-extending portions of the L-shaped electrically conductive layers 46 is physically exposed at a bottom of each of the word line contact via cavities 85. The lateral dimensions of the word line contact via cavities 85 can be greater than the lateral thickness of the non-horizontally extending portions, such as vertically-extending portions of the L-shaped electrically conductive layers 46 along the direction of alternation of the non-horizontally extending portions, such as vertically-extending portions of the L-shaped insulating layers 32 and the L-shaped electrically conductive layers 46. In this case, a pair of sidewalls of the respective one of the non-horizontally extending portions, such as vertically-extending portions of the L-shaped electrically conductive layers 46 can be physically exposed within each of the word line contact via cavities 85. Further, a sidewall of a non-horizontally extending portion, such as vertically-extending portion of an L-shaped insulating layer 32 and a sidewall of a dielectric spacer 33 (or another insulating layer 32 if the dielectric spacer 33 is omitted) can be physically exposed at the bottom of each of the word line contact via cavities 85. The photoresist layer can be subsequently removed, for example, by ashing.

Figure 21:
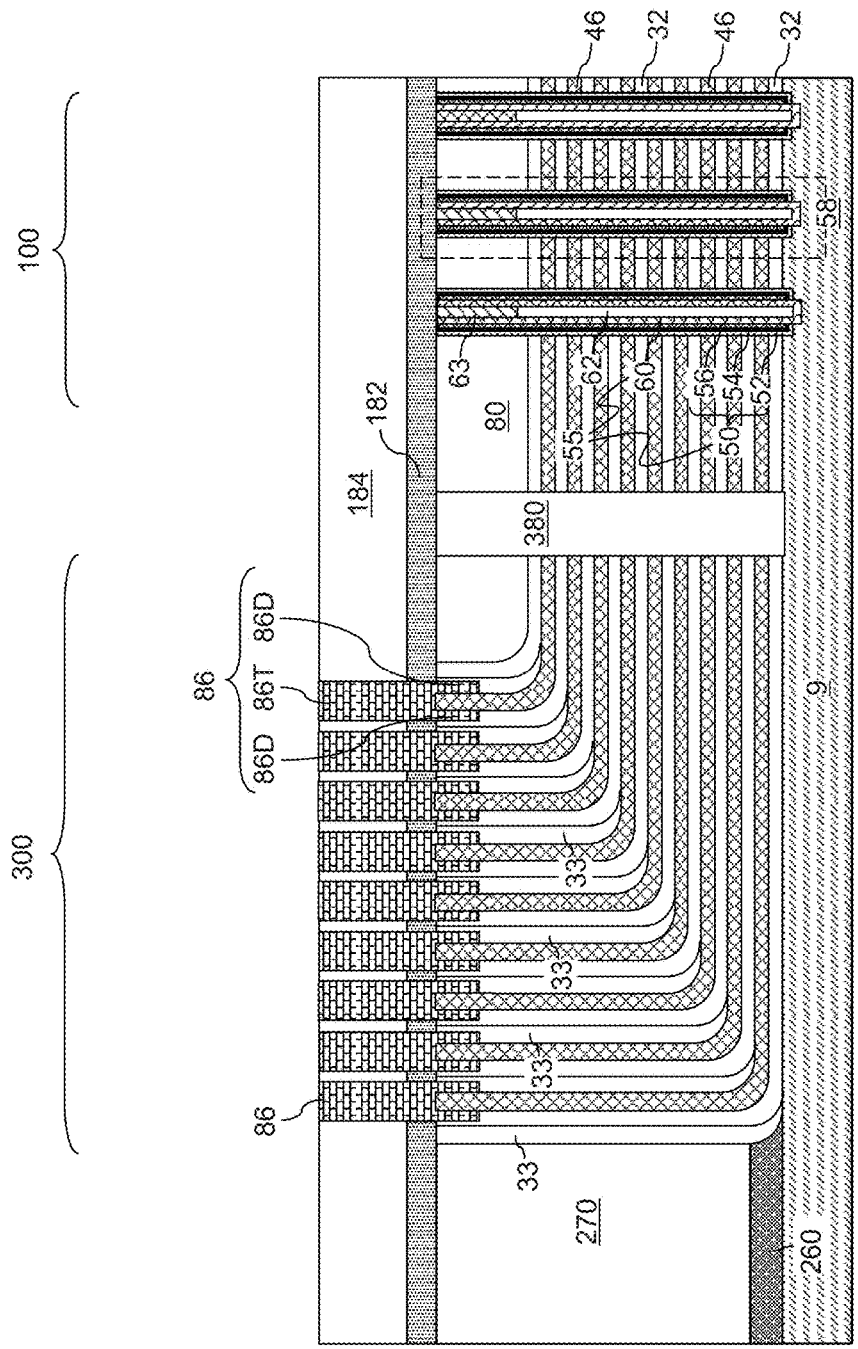
FIG. 21 is a vertical cross-sectional view of the first exemplary structure after formation of contact via structures according to the first embodiment of the present disclosure.

Referring to FIG. 21, at least one conductive material can be deposited in each of the word line contact via cavities 85. The at least one conductive material can include, for example, an optional metallic nitride liner material (such as TiN) and a metallic fill material (such as copper or tungsten). Excess portions of the at least one conductive material can be removed from above the top surface of the at least one contact level dielectric layer (182, 184) by a planarization process such as a recess etch. Each remaining portion of the at least one conductive material in the word line contact via cavities 85 constitutes a contact via structure, which is herein referred to as a word line contact via structure 86.

Each word line contact via structure 86 on a respective one of non-horizontally extending portions, such as vertically-extending portions of the L-shaped electrically conductive layers 46. One of more of the contact via structures 86 can include a respective pair of downward-protruding portions 86D that straddle and contact sidewalls of a respective one of the non-horizontally extending portions, such as vertically-extending portions 46V of the L-shaped electrically conductive layers 46. The respective pair of downward-protruding portions 86D contacts a sidewall of one of the dielectric spacers 33 and a sidewall of one of the non-horizontally extending portions 32V, such as vertically-extending portions of the L-shaped insulating layers 32. In an alternative embodiment, if the dielectric spacer 33 is omitted, then respective pair of downward-protruding portions 86D contacts sidewalls of a pair of nearest neighbor non-horizontally extending portions 32V of the L-shaped insulating layers 32. A top portion 86T of the word line contact via structure 86 joins portions 86D and contacts the top surface of the non-horizontally extending portions 46V of the electrically conductive layers 46. In some embodiments, the word line contact via structures 86 can have the same height thereamongst, which can be greater than the total thickness of the at least one contact level dielectric layer (182, 184).

Figure 22A:
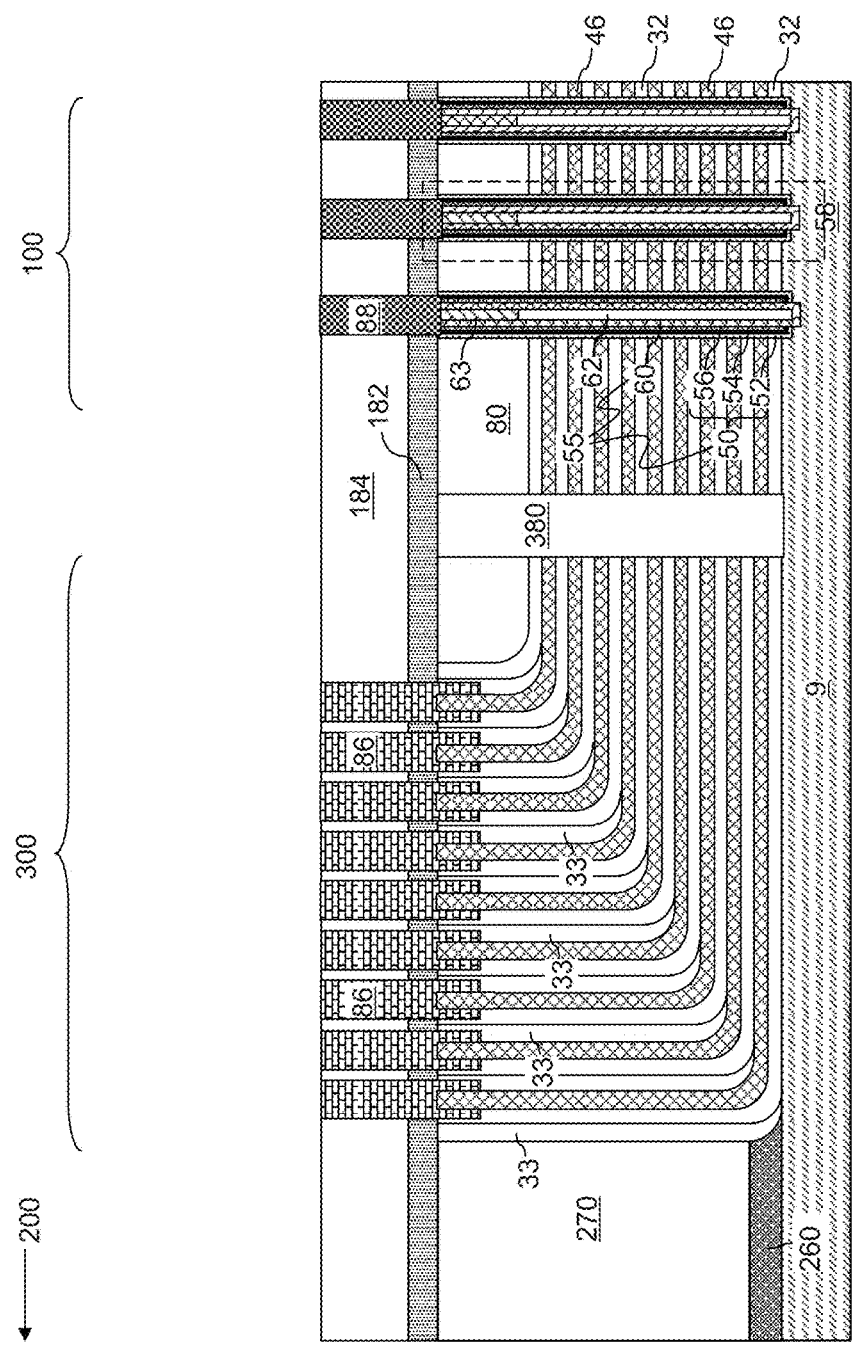
FIG. 22A is a vertical cross-sectional view of the first exemplary structure after formation of array contact via structures according to the first embodiment of the present disclosure.
Figure 22B:
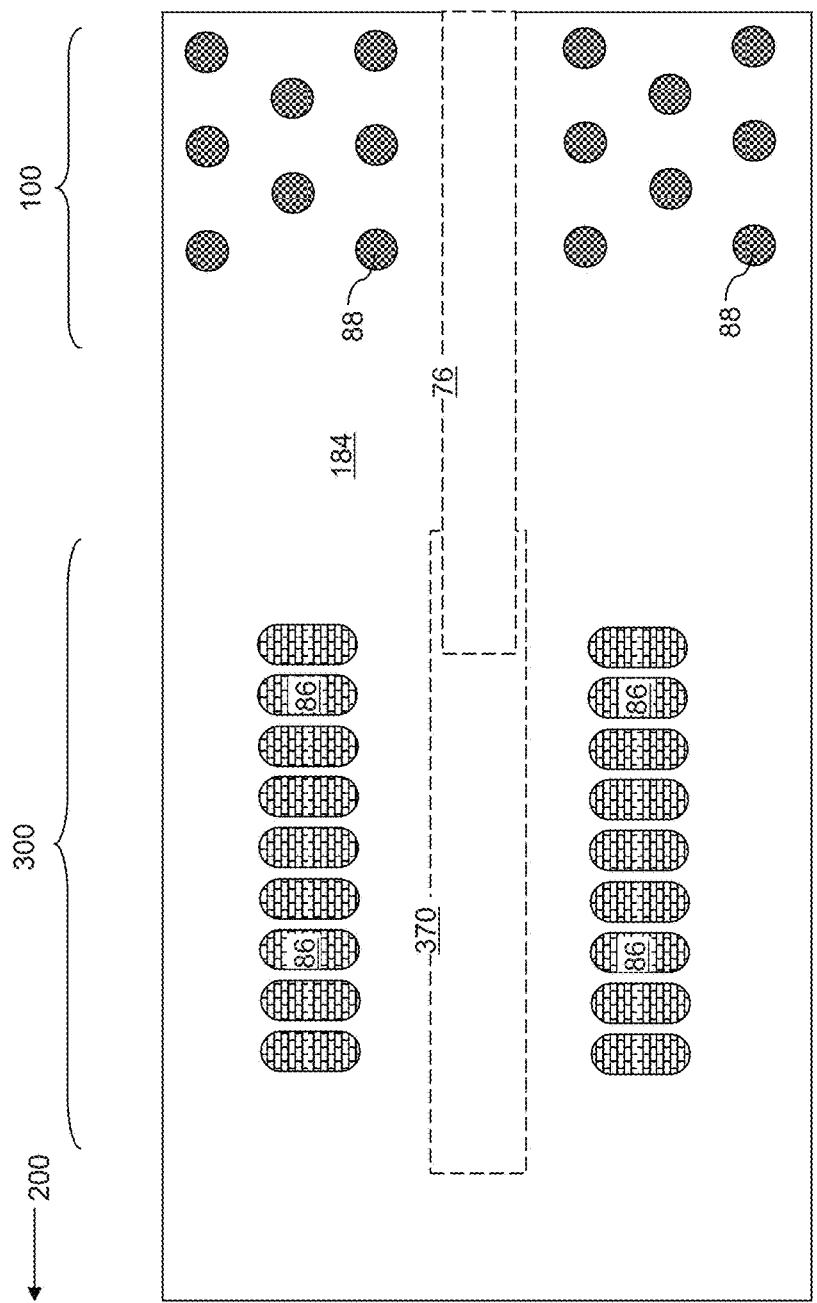
FIG. 22B is a top-down view of the first exemplary structure of FIG. 22A. The plane A-A' is the plane of the cross-section of FIG. 22A.

Referring to FIGS. 22A and 22B, additional contact via structures such as array contact via structures 88 and peripheral device contact via structures (not shown) that contact peripheral devices in the peripheral device region 200 can be formed. The array contact via structures 88 can extend through the at least one contact level dielectric layer (182, 184), and can contact a top surface of a respective one of the drain regions 63. Additional dielectric material layers (not shown) and additional metal interconnect structures (not shown) can be formed above the at least one contact level dielectric layer (182, 184). In one embodiment, the word line contact via structures 86 may be arranged as linear arrays that extend along the horizontal direction that is the same as the thickness direction of the vertically-extending portions of the alternating stack (32, 46).

Figure 23:
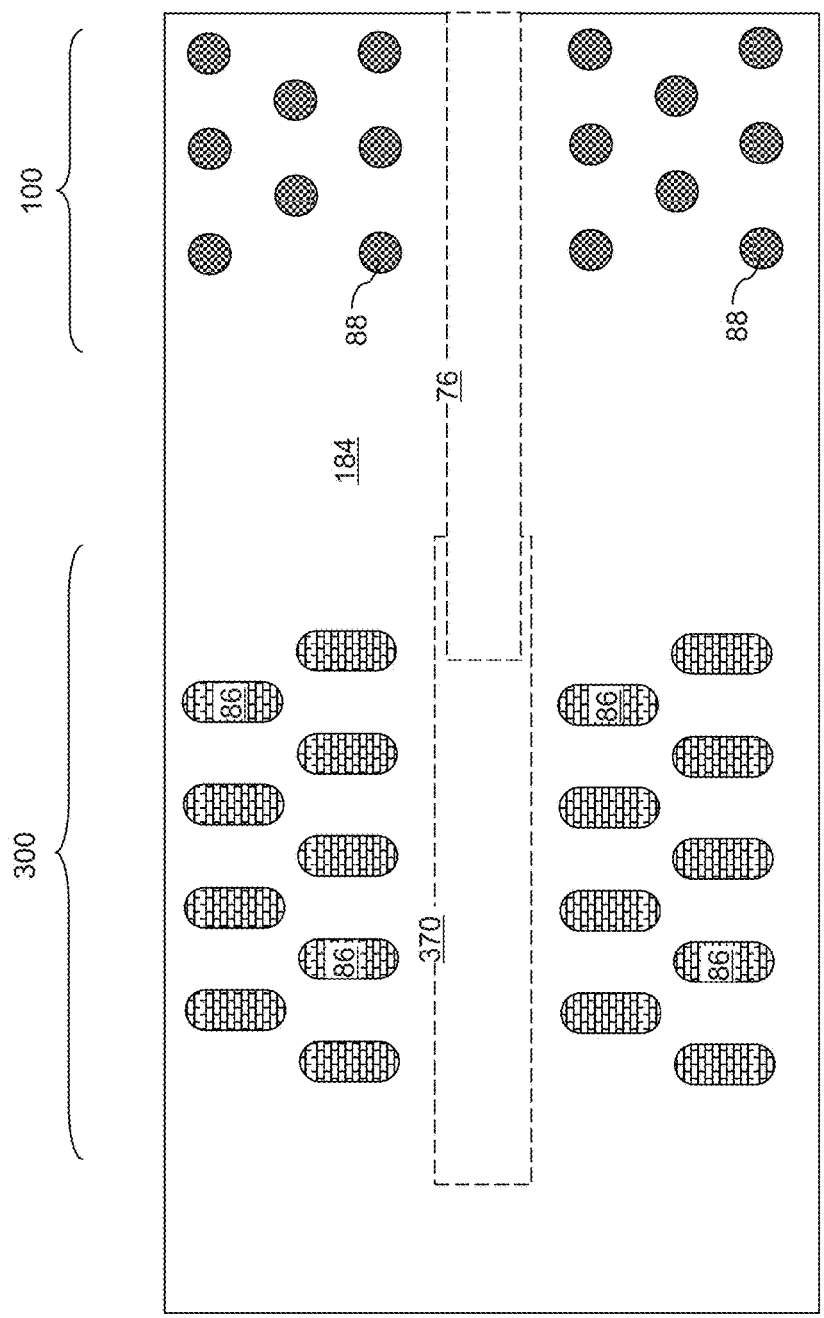
FIG. 23 is a top-down view of an alternative embodiment of the first exemplary structure.

Referring to FIG. 23, an alternative embodiment of the first exemplary structure is illustrated, which can be derived from the first exemplary structure of FIGS. 22A and 22B by forming the word line contact via structures 86 as staggered arrays in which each group of word line contact via structures 86 is arranged in multiple rows.

Referring generally to all drawings of the present disclosure, a three-dimensional memory device includes an alternating stack of L-shaped insulating layers 32 and L-shaped electrically conductive layers 46 located over a top surface 7 of a substrate 9, such that each of the L-shaped insulating layers 32 and the L-shaped electrically conductive layers 46 includes a respective horizontally-extending portion (32H, 46H) and a respective non-horizontally-extending portion (32V, 46V). Memory stack structures 55 extend through a memory array region 100 of the alternating stack (32, 46) that includes the horizontally-extending portions 32H of the L-shaped electrically conductive layers. Each of the memory stack 55 structures includes a memory film 50 and a vertical semiconductor channel 60. Optional dielectric spacers 33 can be added such that they non-horizontally extend between neighboring pairs of a non-horizontally-extending portion 32V of an L-shaped insulating layer 32 and a non-horizontally-extending portion 46V of an L-shaped electrically conductive layer 46. Contact via structures 86 contact a respective one of the non-horizontally-extending portions 46V of the L-shaped electrically conductive layers 46.

In one embodiment, each respective non-horizontally-extending portion (32V, 46V) of the L-shaped insulating layers 32 and the L-shaped electrically conductive layers 46 extends at angle of 60 to 90 degrees with respect to a horizontal direction which is parallel to the top surface 7 of the substrate 9. In a non-limiting example, each respective non-horizontally-extending portion (32V, 46V) of the L-shaped insulating layers 32 and the L-shaped electrically conductive layers 46 comprise vertically-extending portions (32V, 46V).

In one embodiment, each respective horizontally-extending portion (32H, 46H) has a uniform vertical thickness and each respective vertically-extending portion (32V, 46V) has a uniform horizontal thickness.

In another embodiment, a mesa structure (260, 270) is located over the substrate 9. Each respective non-horizontally-extending portion (32V, 46V) of the L-shaped insulating layers 32 and the L-shaped electrically conductive layers 46 is located over a sidewall of the mesa structure.

In one embodiment, each of the L-shaped electrically conductive layers 46 further comprises a tapered portion 46T which extends in a direction between the vertical and horizontal directions (e.g., at an angle of 10 to 80 degrees with respect to the horizontal direction) and which connects respective vertically-extending 46V and horizontally-extending portions 46H of the respective L-shaped electrically conductive layers 46. The tapered portion 46T of each electrically conductive layer 46 is formed over the tapered sidewall 260T of the lower template layer 260L of the mesa structure (260, 270).

In one embodiment, the horizontally-extending portions of the L-shaped electrically conductive layers 46 contact a bottom surface of a respective overlying one of the horizontally-extending portions of the L-shaped insulating layers 32 and a top surface of a respective underlying one of the horizontally-extending portions of the L-shaped insulating layers 32.

In one embodiment, a plurality of the vertically-extending portions of the L-shaped electrically conductive layers 46 contacts a sidewall of a respective one of the L-shaped insulating layers 32 and a sidewall of a respective one of the dielectric spacers 33. In one embodiment, the dielectric spacers 33 have a lateral width that is in a range from 50% to 400% of an average lateral width of the vertically-extending portions of the L-shaped insulating layers 32.

In one embodiment, the contact via structures 86 contact a pair of sidewalls of the respective one of the vertically-extending portions of the L-shaped electrically conductive layers 46. In one embodiment, the contact via structures 86 straddle the respective one of the vertically-extending portions of the L-shaped electrically conductive layers 46 and include a respective pair of downward-protruding portions. In one embodiment, the respective pair of downward-protruding portions contacts a sidewall of one of the dielectric spacers 33 and a sidewall of one of the vertically-extending portions of the L-shaped insulating layers 32.

In one embodiment, at least one contact level dielectric layer (182, 184) can overlie the memory stack structures 55, the vertically-extending portions of the L-shaped insulating layers 32, and the L-shaped electrically conductive layers 46, wherein the contact via structures 86 extend through the at least one contact level dielectric layer (182, 184). In one embodiment, the contact via structures 86 have a same height that is greater than a total thickness of the at least one contact level dielectric layer (182, 184).

In one embodiment, the three-dimensional memory device can comprise: a first dielectric wall structure 370 vertically extending through the vertically-extending portions of the L-shaped insulating layers 32 and the L-shaped electrically conductive layers 46 of the alternating stack (32, 46); and a second dielectric wall structure 76 vertically extending through the horizontally-extending portions of the L-shaped insulating layers 32 and the L-shaped electrically conductive layers 46 of the alternating stack (32, 46).

In one embodiment, the three-dimensional memory structure comprises a vertical NAND memory device. The L-shaped electrically conductive layers 46 can comprise, or can be electrically connected to, a respective word line of the monolithic three-dimensional NAND memory device. The substrate semiconductor layer 9 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of a charge storage layer 54 at a level of another electrically conductive layer 46) in a second device level of the array of monolithic three-dimensional NAND strings. The silicon substrate can contain an integrated circuit comprising a driver circuit for the memory device located thereon. The L-shaped electrically conductive layers 46 can comprise a plurality of control gate electrodes having a strip shape extending substantially parallel to the top surface of the substrate semiconductor layer 9, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion 60 of each of the plurality of semiconductor channels (59, 60) extends substantially perpendicular to a top surface of the substrate semiconductor layer 9; and a plurality of charge storage elements (as embodied as portions of the charge storage layer 54 that are located at each level of the L-shaped electrically conductive layers 46). Each charge storage element can be located adjacent to a respective one of the plurality of vertical semiconductor channels 60.

The various embodiments of the present disclosure provide schemes for formatting an alternating stack of the L-shaped insulating layers 32 and the L-shaped electrically conductive layers 46 such that end portions 46V of the L-shaped electrically conductive layers 46 extend along a non-horizontal (e.g., vertical) direction and provide top surfaces within a same horizontal plane that may be at the height of the top surfaces of drain regions 63 that are formed in the memory array region 100. The L-shaped electrically conductive layers 46 including non-horizontally extending portions 46V function as angled word lines that facilitate formation of word line contact via structures 86 thereupon. Thus, formation of staircases or a terrace region in which electrically conductive layers 46 extent to different lateral extents is not necessary. By eliminating the need to form a terrace region, the various embodiments of the present disclosure can simplify the process flow for manufacture of word line contact via structures 86, and thus, reduce the manufacturing cost and/or enhance the yield and/or reliability of the word line contact via structures 86 of a three-dimensional memory device.

Figure 24:
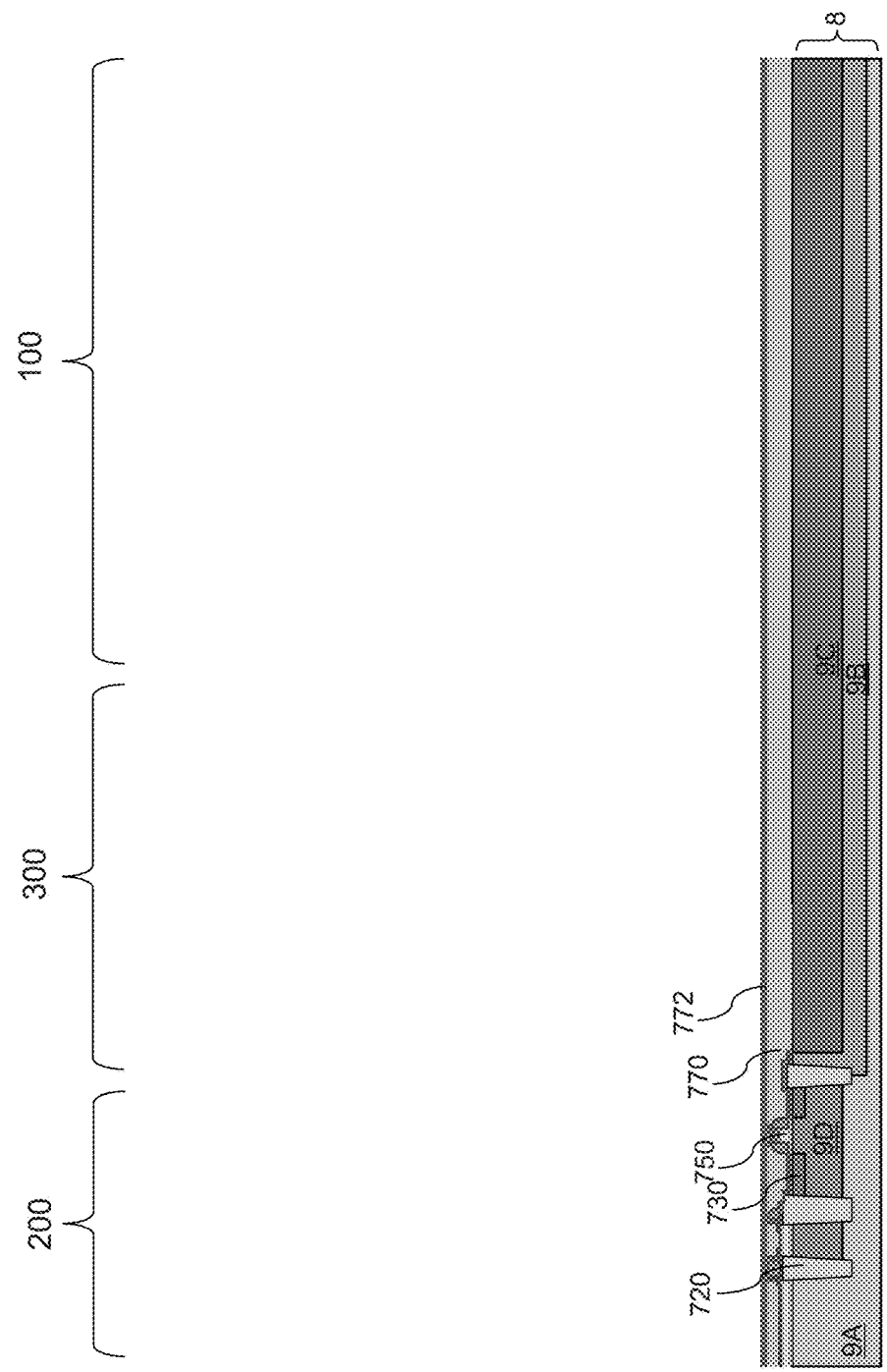
FIG. 24 is a vertical cross-sectional view of a second exemplary structure after formation of peripheral semiconductor devices, a planarization dielectric layer, and a capping dielectric material layer according to a second embodiment of the present disclosure.

Referring to FIG. 24, a second exemplary structure according to an embodiment of the present disclosure is illustrated, which can be employed, for example, to fabricate a device structure containing vertical NAND memory devices. The second exemplary structure includes a substrate 8, which can include a substrate semiconductor layer embedding various doped semiconductor regions (9A, 9B, 9C, 9D). For example, the substrate semiconductor layer can include a first doped semiconductor region 9A having the same doping as the semiconductor substrate as initially provided, a second doped semiconductor region 9B having a doping of the opposite conductivity type as the first doped semiconductor region 9A and providing electrical isolation, a third doped semiconductor region 9C that functions a doped well having a same conductivity type as the first doped semiconductor region 9A, and a fourth doped semiconductor region 9D that functions as a doped well having an opposite conductivity type from the first doped semiconductor region 9A. In an illustrative example, the first and third doped semiconductor regions (9A, 9C) can be p-doped, and the second and fourth doped semiconductor regions (9B, 9D) can be n-doped. The substrate semiconductor layer maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

At least one semiconductor device for a peripheral circuitry can be formed on a portion of the substrate semiconductor layer (9A, 9B, 9C, 9D). The at least one semiconductor device can include, for example, field effect transistors. Each field effect transistor can include a pair of active regions 730 (i.e., source regions and drain regions), a channel region located between the pair of active regions 730, a gate dielectric overlying the channel region, and a gate electrode 750 overlying the gate dielectric. The at least one semiconductor device can include a plurality of semiconductor devices (such as a plurality of field effect transistors) that are laterally electrically isolated among one another by shallow trench isolation structures 720. The least one semiconductor device for the peripheral circuitry can contain a driver circuit for memory devices to be subsequently formed, which can include at least one NAND device. The region (i.e., area) of the at least one semiconductor device is herein referred to as a peripheral device region 200. The region in which a memory array is subsequently formed is herein referred to as a memory array region 100. A contact region 300 for subsequently forming contacts to electrically conductive layers (e.g., word lines) can be provided between the memory array region 100 and the peripheral device region 200. A device planarization dielectric layer 770 and a device capping dielectric layer 772 can be optionally formed over the at least one semiconductor device.

Figure 25:
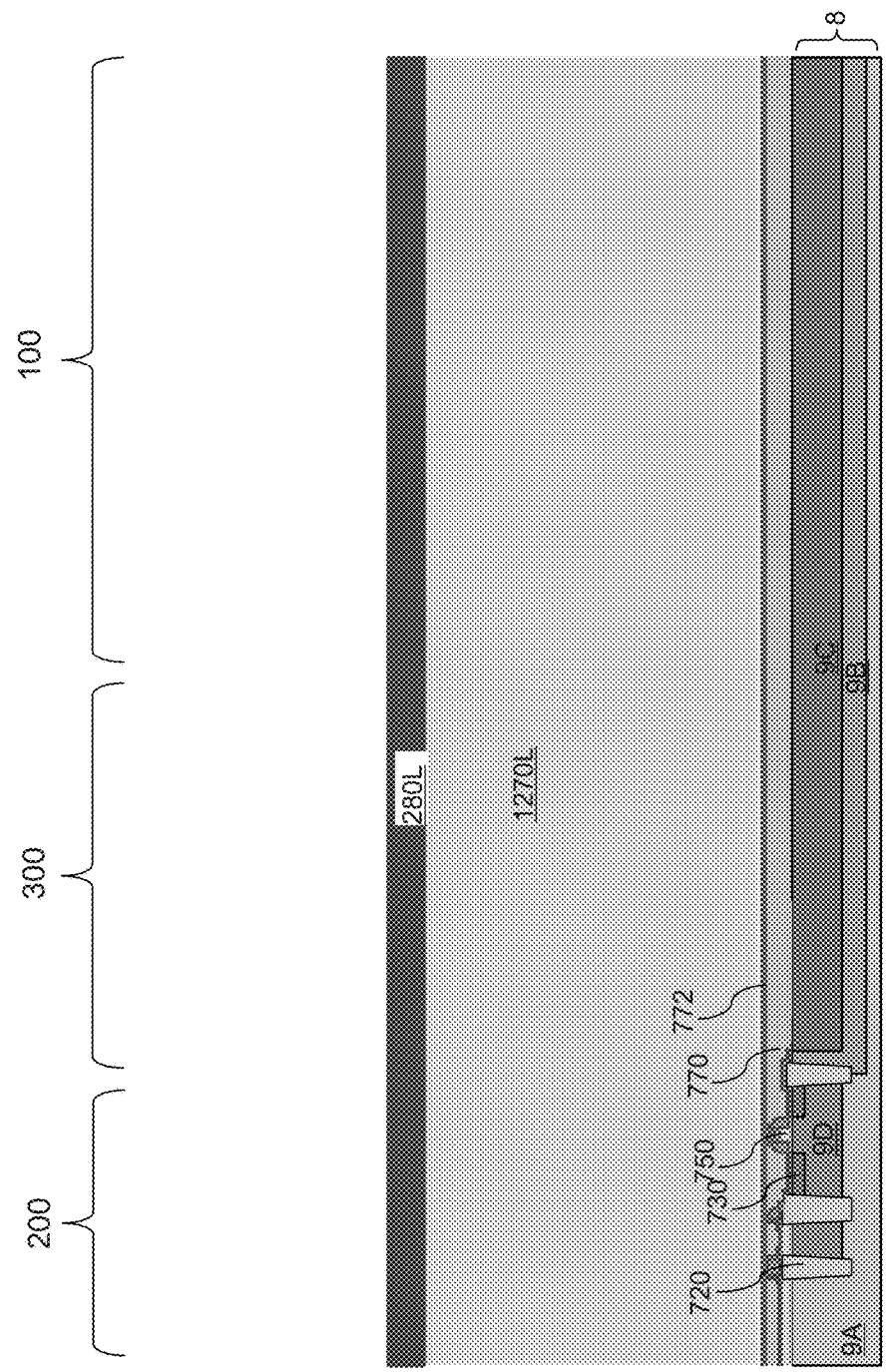
FIG. 25 is a vertical cross-sectional view of the second exemplary structure after formation of a template layer and an optional planarization stopping layer according to a second embodiment of the present disclosure.

Referring to FIG. 25, at least one template layer 1270L can be deposited over the at least one semiconductor device (such as over the device planarization dielectric layer 770 and the device capping dielectric layer 772). In one embodiment, the at least one template layer 1270L includes a dielectric material, and may include a lower template layer 260L (shown in FIG. 1) and an upper template layer 270L (shown in FIG. 1) of the first embodiment. An optional planarization stopping layer 280L can be formed over the at least one template layer 1270L in the same manner as in the first embodiment.

Figure 26:
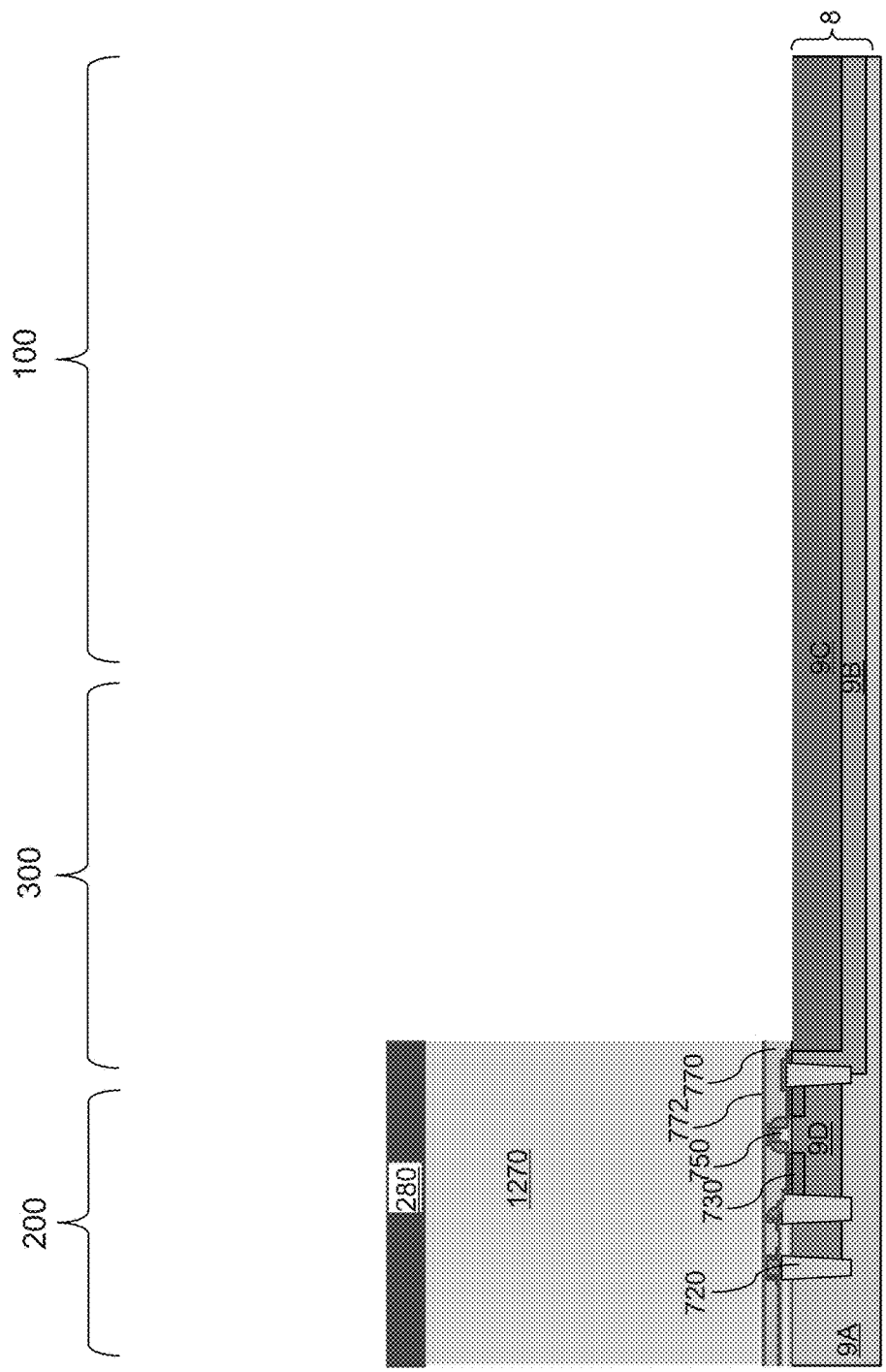
FIG. 26 is a vertical cross-sectional view of the second exemplary structure after formation of a first mesa structure according to the second embodiment of the present disclosure.

Referring to FIG. 26, a photoresist layer (not shown) can be applied over the planarization stopping layer 280L, and can be lithographically patterned to cover to a region adjacent to the contact region 300 in the same manner as in the first embodiment. An anisotropic etch is performed to transfer the pattern of the photoresist layer through the planarization stopping layer 280L, the at least one template layer 1270L, the device capping dielectric layer 772, and the device planarization dielectric layer 770. The anisotropic etch can include multiple etch steps for sequentially etching the materials of the planarization stopping layer 280L, the at least one template layer 1270L, the device capping dielectric layer 772, and the device planarization dielectric layer 770. The top surface of the substrate semiconductor layer 9 can be physically exposed after the anisotropic etch process.

The remaining portion of the planarization stopping layer 280L is herein referred to as a planarization stopping structure 280, and the remaining portion of the at least one template layer 1270L is herein referred to as a mesa structure 1270, which can be structurally the same as the upper template structure 270 or the combination of the upper template structure 270 and the lower template structure 260 of the first embodiment. For example, the first mesa structure 1270 can have non-horizontal sidewalls having an angle of 60 to 90 degrees with respect to a horizontal direction (e.g., with respect to the top surface of the substrate), which may be vertical sidewalls (i.e., having an angle of 90 degrees with respect to the horizontal direction) in some embodiments. Alternatively, if an isotropic wet etch is used to pattern the first mesa structure 1270, then the first mesa structure 1270 can have non-vertical tapered sidewalls having an angle of 60 to 89 degrees with respect to the horizontal direction. The first mesa structure 1270 protrudes above the top surface of the substrate semiconductor layer (9A, 9B, 9C, 9D). In one embodiment the first mesa structure 1270 can have a planar top surface. The first mesa structure 1270 has dielectric sidewalls.

Figure 27:
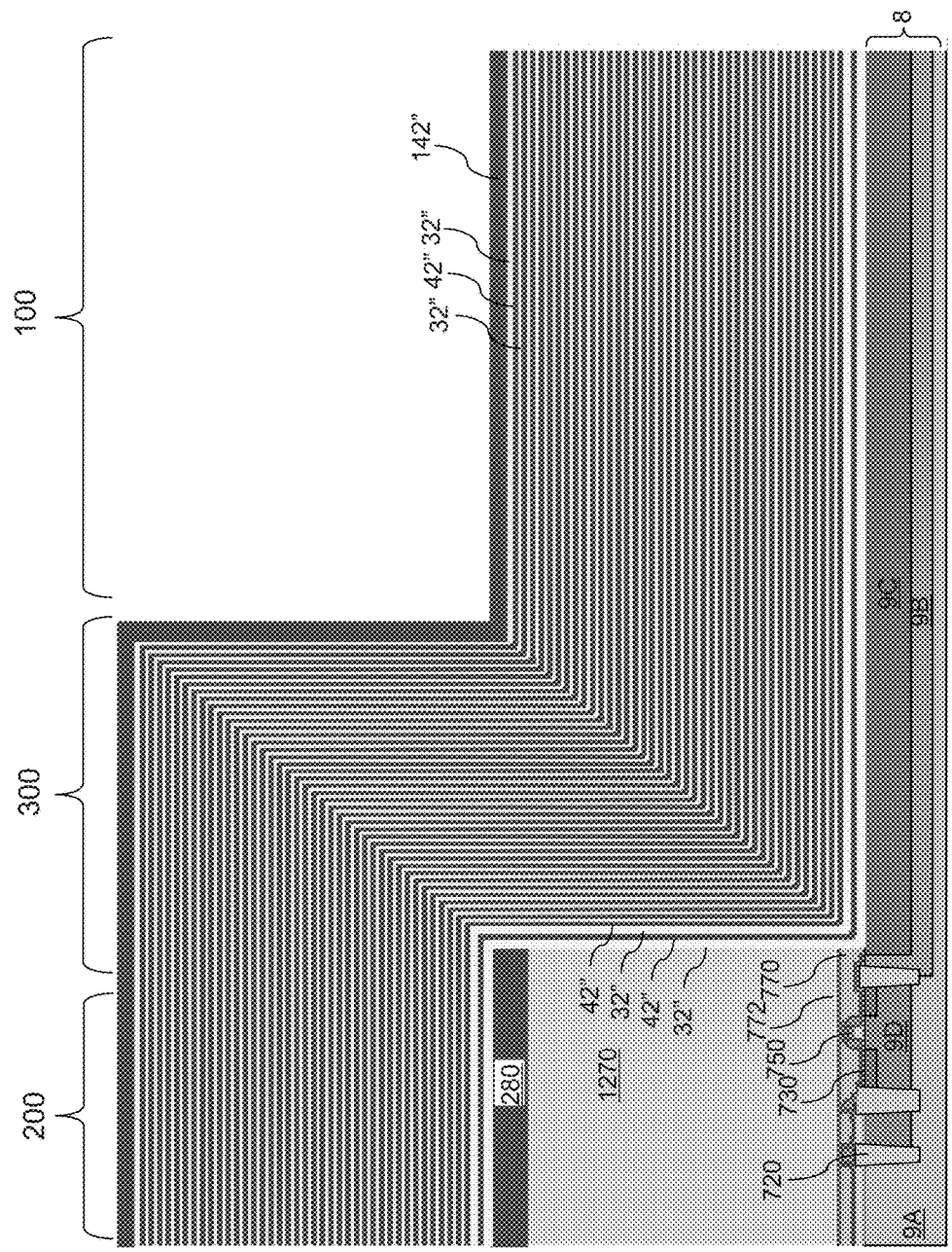
FIG. 27 is a vertical cross-sectional view of the second exemplary structure after formation of a first alternating sequence of first conformal insulating layers and first conformal sacrificial material layers according to the second embodiment of the present disclosure.

Referring to FIG. 27, a first alternating sequence of first insulating layers and first spacer material layers can be formed. In one embodiment, the first insulating layers can be first conformal insulating layers 32" formed by a respective conformal deposition process, and first spacer material layers can be first conformal spacer material layers formed by a respective conformal deposition process. In one embodiment, the first conformal spacer material layers can be first conformal sacrificial material layers 42" that are subsequently partially replaced with first electrically conductive layers, or can be first conformal electrically conductive layers. While the present disclosure is described employing an embodiment in which the first conformal spacer material layers can be first conformal sacrificial material layers 42" that are subsequently partially replaced with first electrically conductive layers, embodiments are expressly contemplated herein in which the first conformal spacer material layers are formed as first conformal electrically conductive layers and processing steps for replacing the material of the first conformal sacrificial material layers 42' with the first electrically conductive layers are omitted.

The first alternating sequence (32", 42") of the first conformal insulating layers 32" and the first conformal sacrificial material layers 42" can be formed by alternately depositing the conformal insulating layers 32" and the conformal sacrificial material layers 42" over a top surface of the substrate 8 and over the first mesa structure 1270. Each of the first conformal insulating layers 32" and the first conformal sacrificial material layers 42" can be deposited by a respective conformal deposition process, which can include a chemical vapor deposition (CVD) process or an atomic layer deposition (ALD) process. In one embodiment, the first conformal insulating layers 32" can have the same composition and thickness as the Z-shaped insulating layer 32' of the first exemplary structure, and the first conformal sacrificial material layers 42" can have the same composition and thickness as the Z-shaped sacrificial material layers 42' of the first exemplary structure. Generally speaking, a region of each first conformal insulating layer 32" of the second exemplary structure can be the same as a Z-shaped insulating layer 32' of the first exemplary structure, and each Z-shaped insulating layer 32' of the first exemplary structure may be a region of a first conformal insulating layer 32" in a structure incorporating the first exemplary structure. Likewise, a region of each first conformal sacrificial material layer 42" of the second exemplary structure can be the same as a Z-shaped sacrificial material layer 42' of the first exemplary structure, and each Z-shaped sacrificial material layer 42' of the first exemplary structure may be a region of a first conformal sacrificial material layer 42" in a structure incorporating the first exemplary structure. A conformal cap sacrificial material layer 142" formed over the alternating sequence (32", 42") may have a greater thickness than underlying first conformal sacrificial material layers 42".

In one embodiment, the first conformal insulating layers 32" can include silicon oxide, which may, or may not, be doped with dopants such as B, P, F, or As. In one embodiment, the first conformal insulating layers 32" may consist essentially of $SiO_2$ with a trace level of hydrogen atoms and/or carbon atoms. The first conformal insulating layers 32" can be formed by a conformal deposition process such as low pressure chemical vapor deposition. The thickness of the first conformal insulating layers 32" can be in a range from 25 nm to 60 nm, although lesser and greater thicknesses can also be employed. In one embodiment, the first conformal sacrificial material layers 42" can include silicon nitride. The thickness of each first conformal sacrificial material layer 42" can be in a range from 25 nm to 60 nm, although lesser and greater thicknesses can also be employed. In one embodiment, the top surface of the planarization stopping structure 280 may be at about the same level as the top surface of the portion of the cap sacrificial material layer 142" in the memory array region 100.

Figure 28:
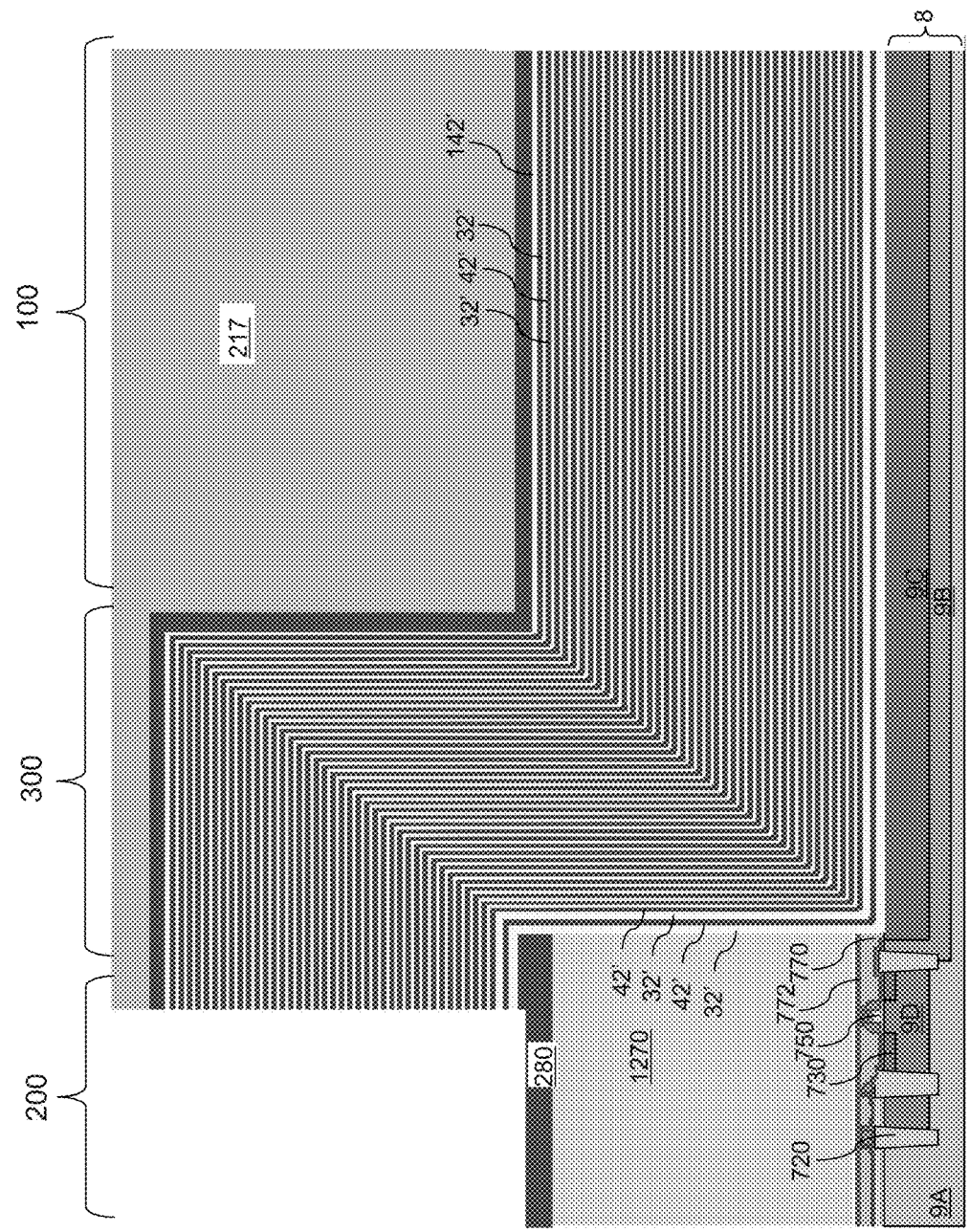
FIG. 28 is a vertical cross-sectional view of the second exemplary structure application and patterning of a photoresist layer, and removal of portions of the first alternating sequence from above the first mesa structure according to the second embodiment of the present disclosure.

Referring to FIG. 28, a photoresist layer 217 is applied over the second exemplary structure, and is lithographically patterned to cover the memory array region 100 and the contact region 300 while a predominant portion of the peripheral device region 200 is not covered by the patterned portion of the photoresist layer 217. An anisotropic etch process can be performed to etch portions of the first alternating sequence (32", 42") of the first conformal insulating layers 32" and the first conformal sacrificial material layers 42" from the peripheral device region 200. The anisotropic etch process can stop on the planarization stopping structure 280. The photoresist layer 217 can be subsequently removed, for example, by ashing.

Figure 29:
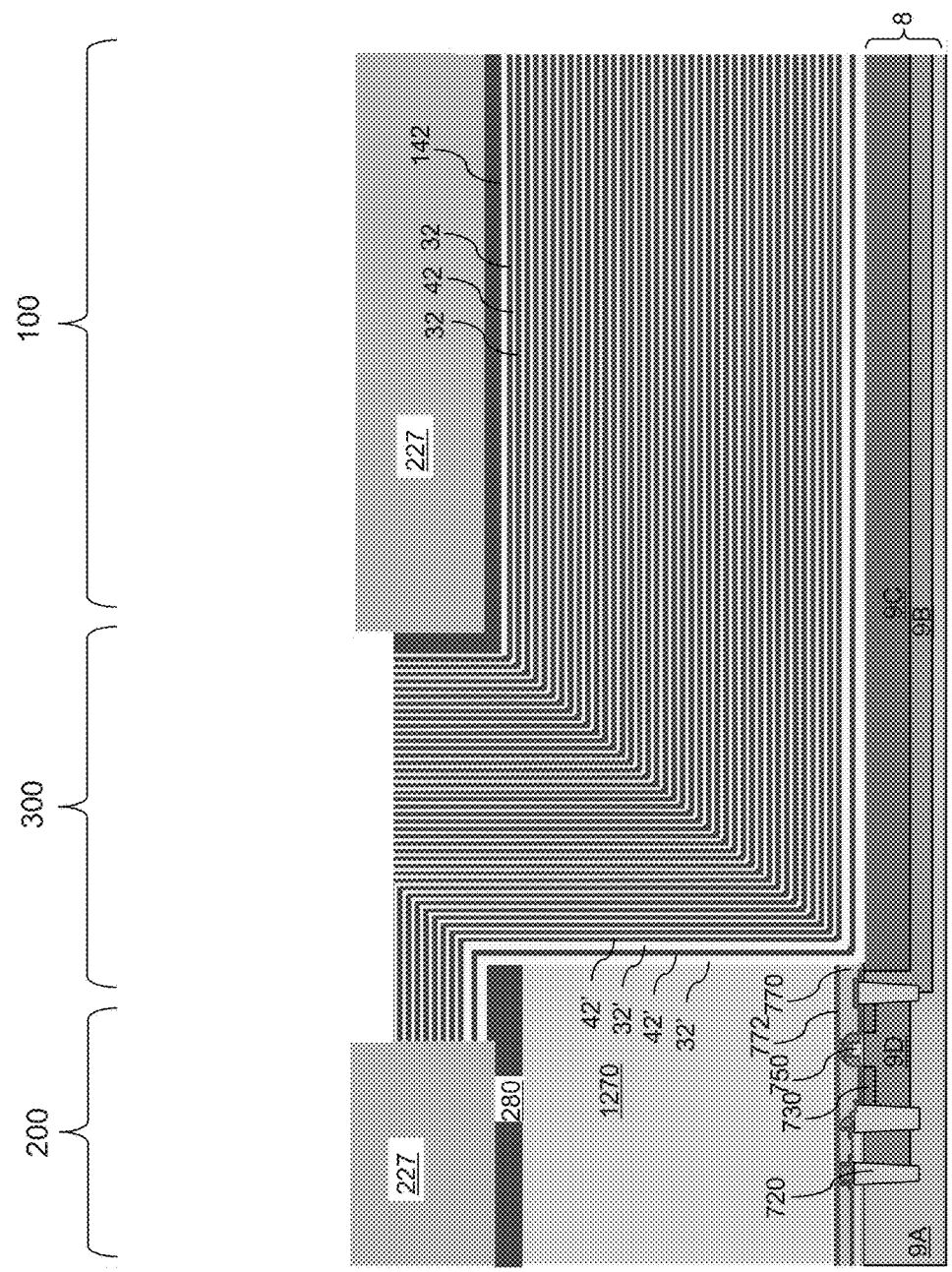
FIG. 29 is a vertical cross-sectional view of the second exemplary structure application and patterning of an etch mask layer, and removal of protruding portions of the first alternating sequence according to the second embodiment of the present disclosure.

Referring to FIG. 29, an etch mask layer 227 can be formed around the protruding portion of the first alternating sequence (32", 42") of the first conformal insulating layers 32" and the first conformal sacrificial material layers 42". The etch mask layer 227 can be formed by a self-planarizing deposition process such as spin coating. For example, the etch mask layer 227 can include a polymer layer or a photoresist material layer that is applied by spin coating so that the etch mask layer 227 is formed around the protruding portion of the first alternating sequence (32", 42") of the first conformal insulating layers 32" and the first conformal sacrificial material layers 42", and does not cover the protruding portion of the protruding portion of the first alternating sequence (32", 42") of the first conformal insulating layers 32" and the first conformal sacrificial material layers 42". An etch process can be performed to recess the protruding portions of the protruding portion of the first alternating sequence (32", 42") of the first conformal insulating layers 32" and the first conformal sacrificial material layers 42" that are not covered by the etch mask layer 227. The etch mask layer 227 can be subsequently removed, for example, by ashing or by dissolving in a solvent.

Each remaining portion of a first conformal insulating layer 32" constitutes a first insulating layer 32. Each remaining portion of a first conformal sacrificial material layer 42" constitutes a first sacrificial material layer 42. The remaining portion of the conformal cap sacrificial material layer 142" constitutes a cap sacrificial material layer 142. A first alternating stack (32, 42) of the first insulating layers 32 and the first sacrificial material layers 42 is formed.

Figure 30:
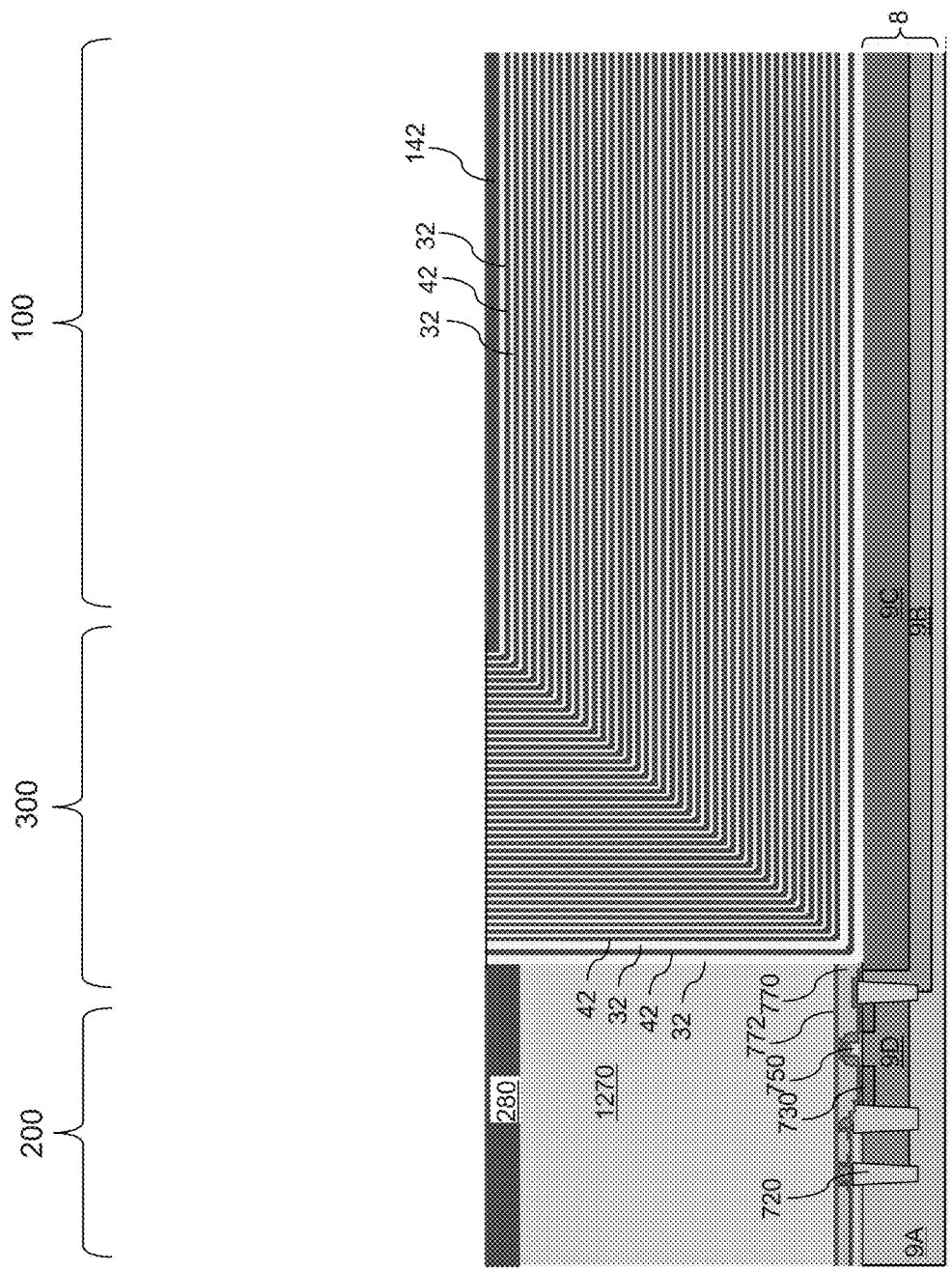
FIG. 30 is a vertical cross-sectional view of the second exemplary structure after a planarization process that forms a first alternating stack of first insulating layers and first sacrificial material layers according to the second embodiment of the present disclosure.

Referring to FIG. 30, the protruding portions of the first alternating sequence (32", 42") of the first conformal insulating layers 32" and the first conformal sacrificial material layers 42" can be removed from the contact region by an additional planarization process such as a chemical mechanical planarization (CMP) process. In this case, the first alternating stack (32, 42) of the first insulating layers 32 and the first sacrificial material layers 42 is formed on the first mesa structure 1270, and each of the first insulating layers 32 and the first sacrificial material layers 42 includes a respective horizontally-extending portion and a respective non-horizontally-extending portion. The top surfaces of the non-horizontally-extending portions of the first insulating layers 32 and the first sacrificial material layers 42 are physically exposed in the contact region 300. A top surface of a cap sacrificial material layer 142 is physically exposed in the memory array region 100. A top surface of the planarization stopping structure 280 is physically exposed in the peripheral device region 200. The top surfaces of the non-horizontally-extending portions of the first insulating layers 32 and the first sacrificial material layers 42, the top surface of a cap sacrificial material layer 142, and the top surface of the planarization stopping structure 280 can be located within as a same horizontal plane.

Figure 31B:
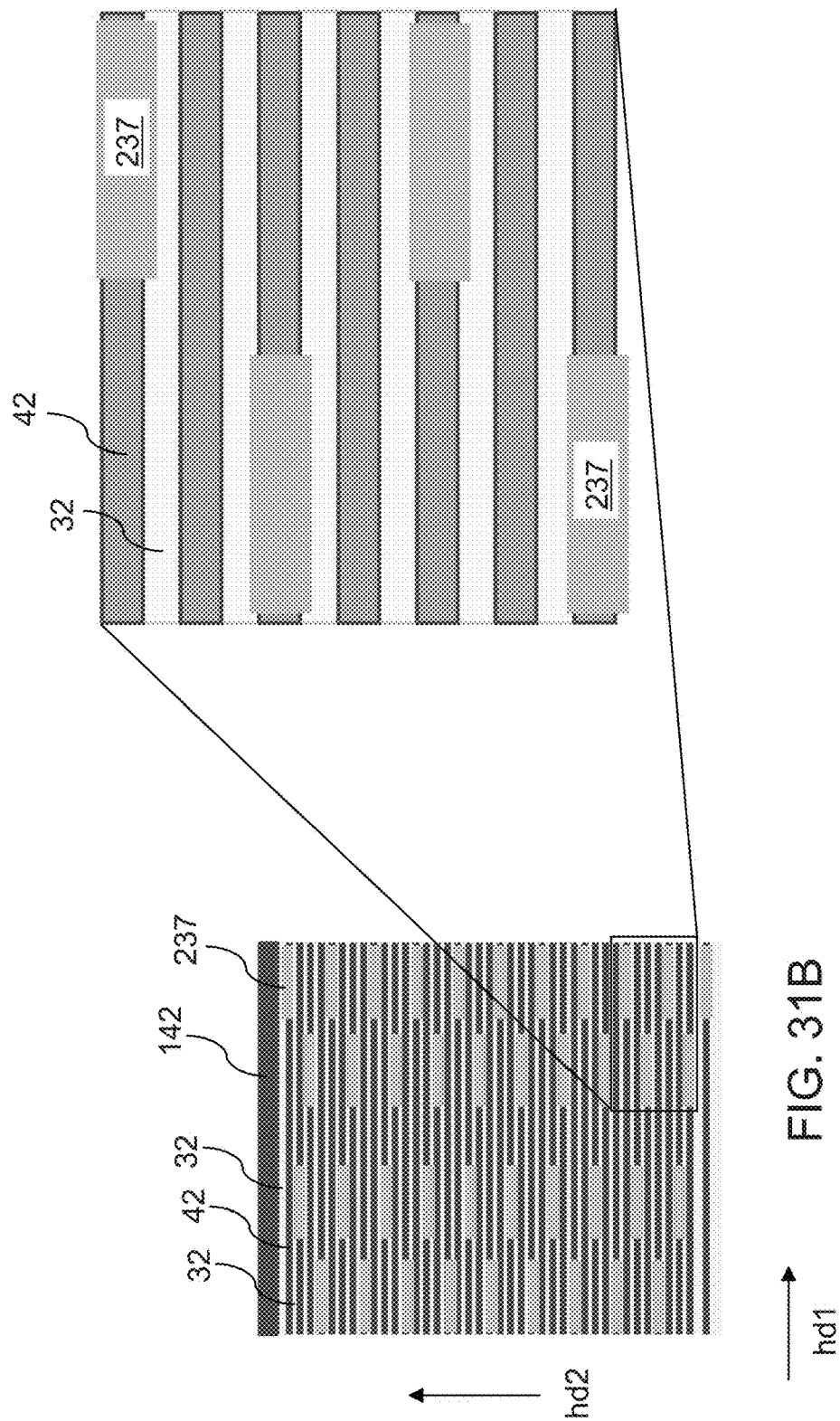
FIG. 31B is a top-down view of a region of the second exemplary structure of FIG. 31A.

Referring to FIGS. 31A and 31B, patterned etch mask portions 237 is formed to mask isolated areas of non-horizontally-extending portions of the first sacrificial material layers 42. In one embodiment, the patterned etch mask portions 237 may be a lithographically patterned photoresist layer. In this case, a photoresist material is applied over the top surface of the second exemplary structure, and is lithographically patterned over the non-horizontally-extending portions of the first sacrificial material layers 42 and the first insulating layers 32. Each masked region of the non-horizontally-extending portions of the first sacrificial material layers 42 can be covered by a patterned portion of the photoresist material. The unmasked regions of the non-horizontally-extending portions of the first sacrificial material layers 42 are not covered by the photoresist material. The masked regions of the non-horizontally-extending portions of the first sacrificial material layers 42 are laterally isolated among one another, and include top surfaces located within a first horizontal plane HP1.

In one embodiment, the non-horizontally-extending portions of the first sacrificial material layers 42 and the first insulating layers 32 in the contact region 300 can laterally extend along a first horizontal direction hd1 (e.g., bit line direction), and can be laterally spaced among one another along a second horizontal direction hd2 (e.g., word line direction). The patterned etch mask portions 237 can be provided as discrete material portions such that each discrete etch mask portion 237 covers only a single first sacrificial material layer 42. In this case, the discrete etch mask portions 237 can be arranged in multiple rows that extend along the second horizontal direction hd2. Specifically, each row of discrete etch mask portions 237 can include discrete etch mask portions 237 that are laterally spaced apart along the second horizontal direction.

In one embodiment, for each memory array to be subsequently formed in the memory array region 100, N rows of discrete etch mask portions 237 laterally extending along the second horizontal direction hd2 can be provided such that the N rows are laterally spaced among one another along the first horizontal direction hd1. Further, each row or discrete etch mask portions 237 can cover every N-th non-horizontally-extending portions of the first sacrificial material layers 42 along the second horizontal direction hd2. While FIGS. 31A and 31B illustrate an embodiment in which N is 4, N can be any integer greater than 1, and may be 2, 3, 4, 5, 6, 7, 8, 9, 10, or any number less than that total number of the first sacrificial material layers 42. In one embodiment, N can be greater than 1 and less than the square root of the total number of the first sacrificial material layers 42. The length of each etch mask portion 237 along the first horizontal direction hd1 can be in a range from 50 nm to 500 nm, although lesser and greater lengths can also be employed. The width of each etch mask portion 237 along the second horizontal direction hd2 can be less than its length and greater than the width of the top surface of an underlying first sacrificial material layer 42 along the second horizontal direction hd2, and can be less than the distance between two neighboring first sacrificial material layers 42. Thus, each etch mask portion 237 can cover a portion of only one of the first sacrificial material layers 42.

Figure 32:
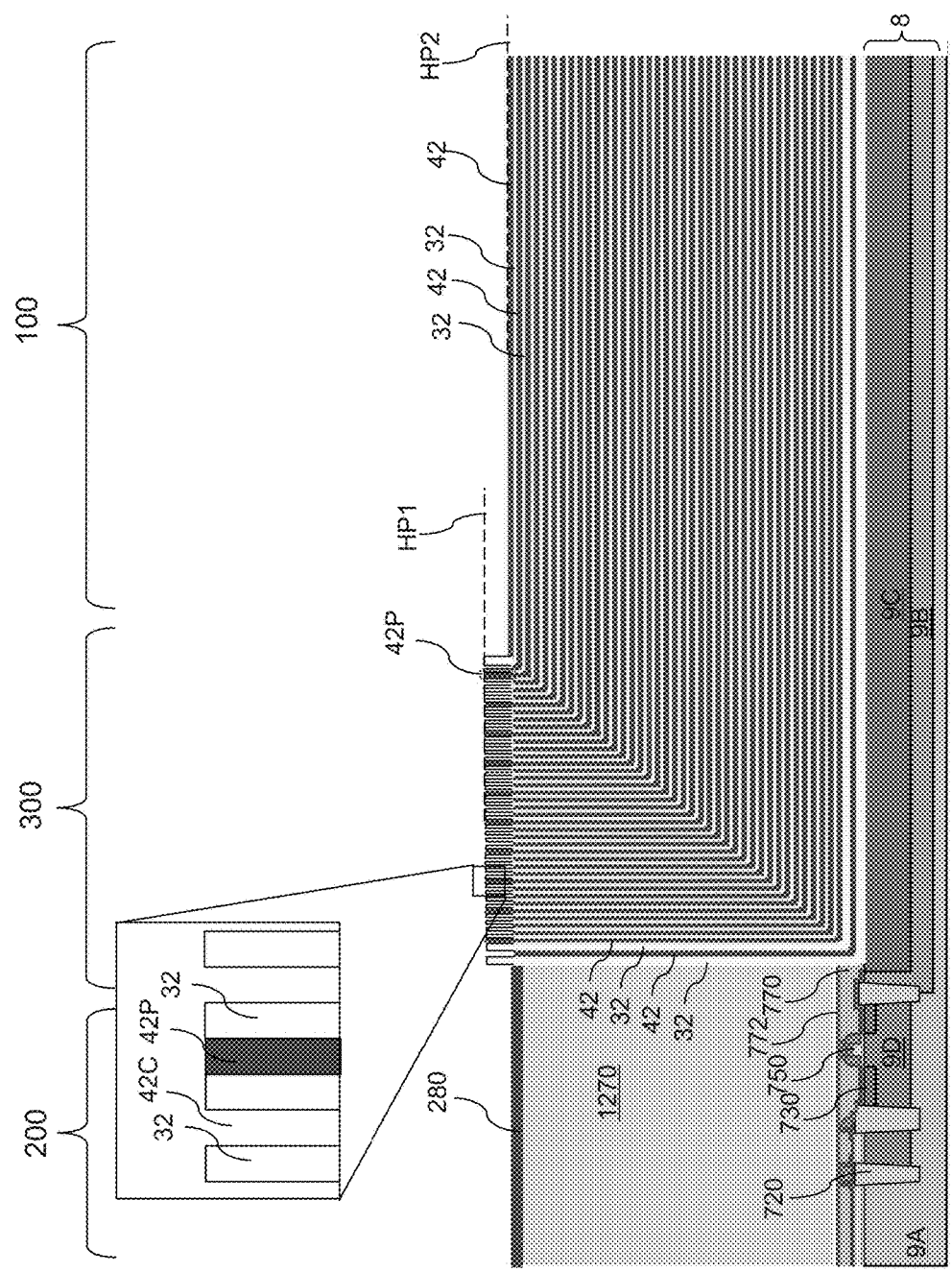
FIG. 32 is a vertical cross-sectional view of the second exemplary structure after vertically recessing unmasked regions of the non-horizontally-extending portions of the first sacrificial material layers according to the second embodiment of the present disclosure.

Referring to FIG. 32, unmasked regions of the non-horizontally-extending portions of the first sacrificial material layers 42 can be vertically recessed by a selective etch process that employs the set of etch mask portions 237 (which may be remaining portions of the photoresist material) as an etch mask. The selective etch process vertically recesses physically exposed regions of the non-horizontally-extending portions of the first sacrificial material layers 42, the planarization stopping structure 280, and the cap sacrificial material layer 142, while not removing masked regions of the non-horizontally-extending portions of the first sacrificial material layers 42. The selective etch process etches the materials of the first sacrificial material layers 42, the planarization stopping structure 280, and the cap sacrificial material layer 142 selective to the material of the first insulating layers 32. In one embodiment, the first sacrificial material layers 42, the planarization stopping structure 280, and the cap sacrificial material layer 142 can include silicon nitride, and the first insulating layers 32 can include a silicon oxide material such as undoped silicate glass or doped silicate glass. The selective etch process can be an anisotropic etch process such as a reactive ion etch process or an isotropic etch process such as a wet etch process (e.g., phosphoric acid etch process). The duration of the selective etch process can be selected such that the cap sacrificial material layer 142 is thinned to a target thickness for a topmost electrically conductive layer to be subsequently formed. In one embodiment, the cap sacrificial material layer 142 and the first sacrificial material layers 42 can include a same sacrificial material. In this case, the thinned cap sacrificial material layer 142 can function as a topmost sacrificial material layer, and can be considered to be the topmost one of the first sacrificial material layers 42.

The unmasked regions of the non-horizontally-extending portions of the first sacrificial material layers 42 are vertically recessed to provide recessed top surfaces located within a second horizontal plane HP2 located below the first horizontal plane HP1. Each masked region of the non-horizontally-extending portions of the first sacrificial material layers 42 in the contact region 300 is protected by the etch mask portions 237, while unmasked regions of the non-horizontally-extending portions of the first sacrificial material layers 42 in the contact region 300 are recessed by a vertical recess distance. The vertical recess distance can be the same as the distance between the first horizontal plane HP1 and the second horizontal plane HP2. The vertical recess distance can be in a range from 20 nm to 200 nm, although lesser and greater vertical recess distances can also be employed. The etch mask portions 237 can be subsequently removed, for example, by ashing. Each first insulating layer 32 can protrude above the second horizontal plane HP2. Line cavities 42C having a same width as the width of an underlying first sacrificial material layer 42 are present between each neighboring pair of first insulating layers 32 that protrude above the second horizontal plane HP2.

Each first sacrificial material layer 42 can have a non-horizontally-extending portion that extends upward to the second horizontal plane HP2 and a protrusion region 42P that protrudes above the second horizontal plane HP2. In one embodiment, the non-horizontally-extending portions of the first sacrificial material layers 42 can be vertical portions that have the structure of a respective vertical plate, i.e., a rectangular parallelepiped including a set of four edges that extend vertically. In this case, each first sacrificial material layer 42 can have a vertical plate region having a respective pair of vertical sidewalls that are parallel to the dielectric sidewall of the first mesa structure 1270, and a protrusion region that protrudes above the vertical plate region and having a narrower lateral dimension than the vertical plate region along a horizontal direction that is parallel to the dielectric sidewall of the first mesa structure 1270, i.e., along the first horizontal direction hd1.

Figure 33:
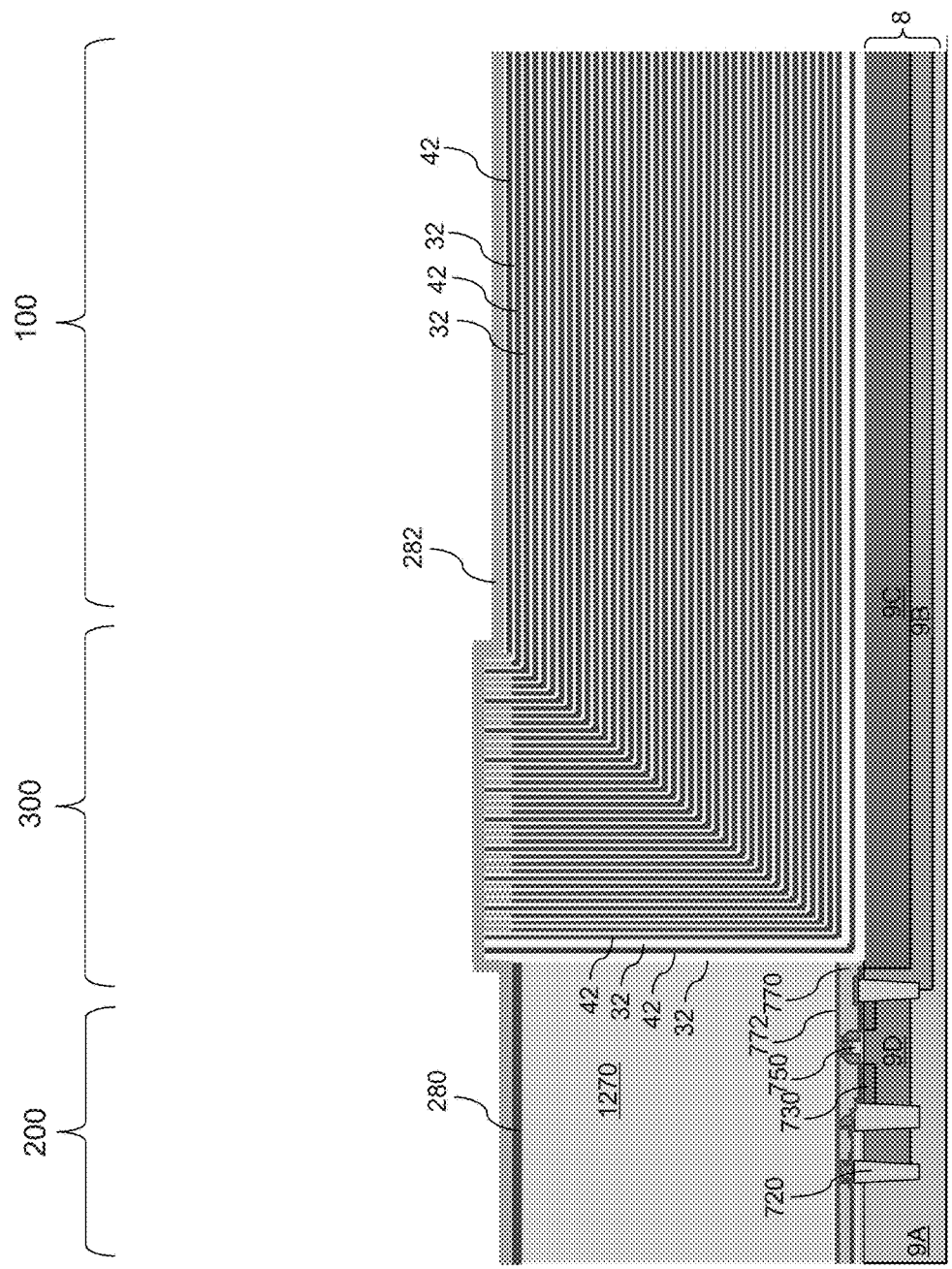
FIG. 33 is a vertical cross-sectional view of the second exemplary structure after deposition of a first insulating cap layer according to the second embodiment of the present disclosure.

Referring to FIG. 33, a first insulating cap layer 282 can be deposited over the protrusion regions 42P, the first sacrificial material layers 42, and the planarization stropping structure 280 by a conformal deposition process. The first insulating cap layer 282 can fill each line cavity 42C among the protruding portions of the first insulating layers 32. The first insulating cap layer 282 includes a different material from the material of the first sacrificial material layers 42. In one embodiment, the first insulating cap layer 282 can include a silicon oxide material such as undoped silicate glass or doped silicate glass. The thickness of the first insulating cap layer 282 is greater than half the thickness of the thickest one of the first sacrificial material layers 42. In one embodiment, the thickness of the first insulating cap layer 282 can be in a range from 50 nm to 200 nm, although lesser and greater thicknesses can also be employed.

Figure 34:
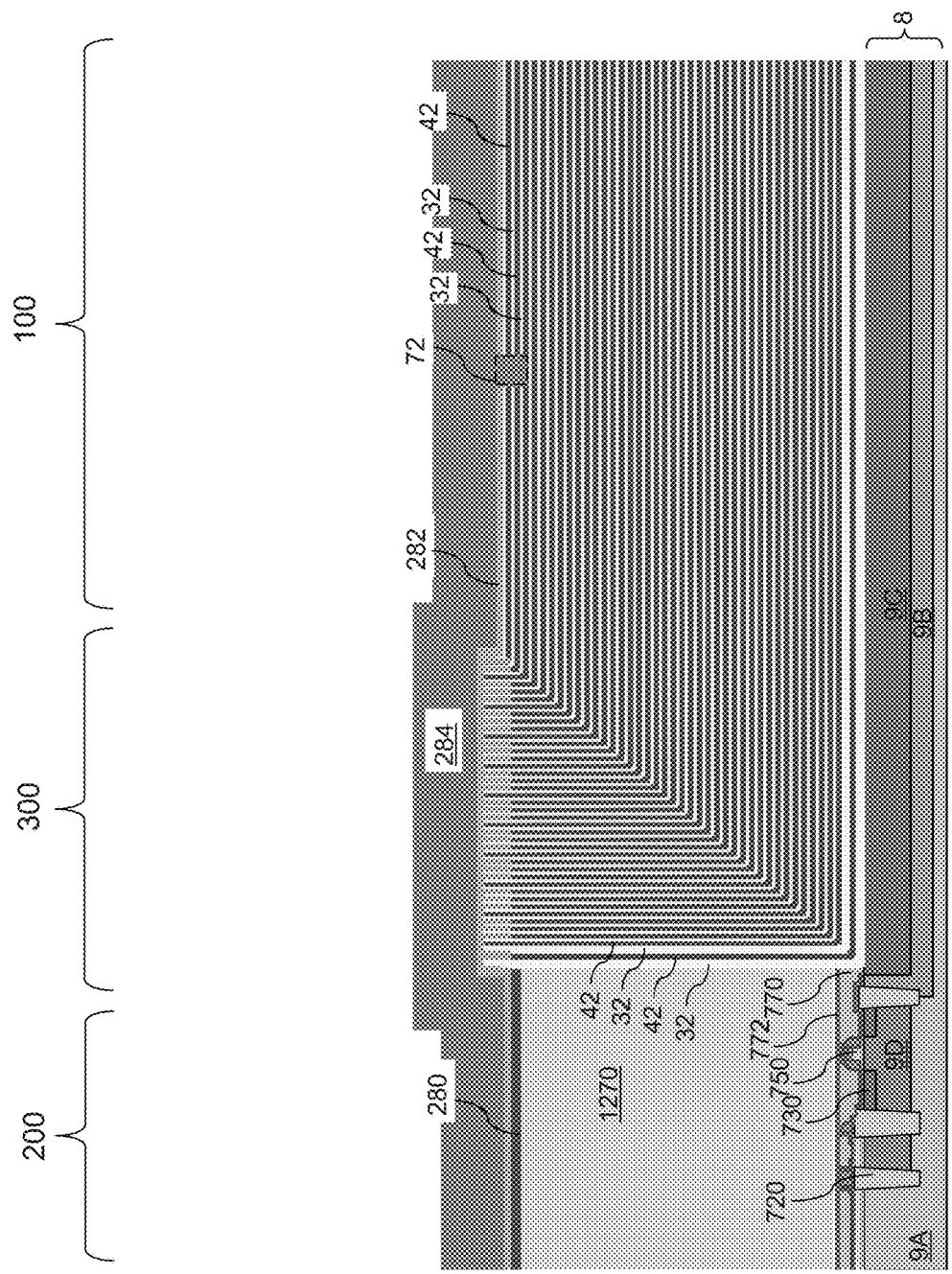
FIG. 34 is a vertical cross-sectional view of the second exemplary structure after formation of a drain select level isolation structure and a second insulating cap layer according to the second embodiment of the present disclosure.

Referring to FIG. 34, line trenches can be formed through at least one first sacrificial material layer 42 located at one or more drain select levels. As used herein, a drain select level refers to a level at which a drain select gate electrode is subsequently formed that activates a group of memory stack structures from the drain side of vertical semiconductor channels. In one embodiment, the line trenches can laterally extend along the second horizontal direction hd2.

A second insulating cap layer 284 can be deposited in the line trenches and over the first insulating cap layer 282. The second insulating cap layer 284 can include a dielectric material such as undoped silicate glass or a doped silicate glass. The thickness of the second insulating cap layer 284 can be in a range from 50 nm to 500 nm, although lesser and greater thicknesses can also be employed. Each portion of the second insulating cap layer 284 that fills a line trench is herein referred to as a drain select level isolation structure 72, which laterally divides the first alternating stack (32, 42) at each drain select level, which may be a single drain select level corresponding to the topmost first sacrificial material layer 42 or a plurality of drain select levels corresponding to a set of first sacrificial material layers 42 including the topmost first sacrificial material layer 42.

Figure 35:
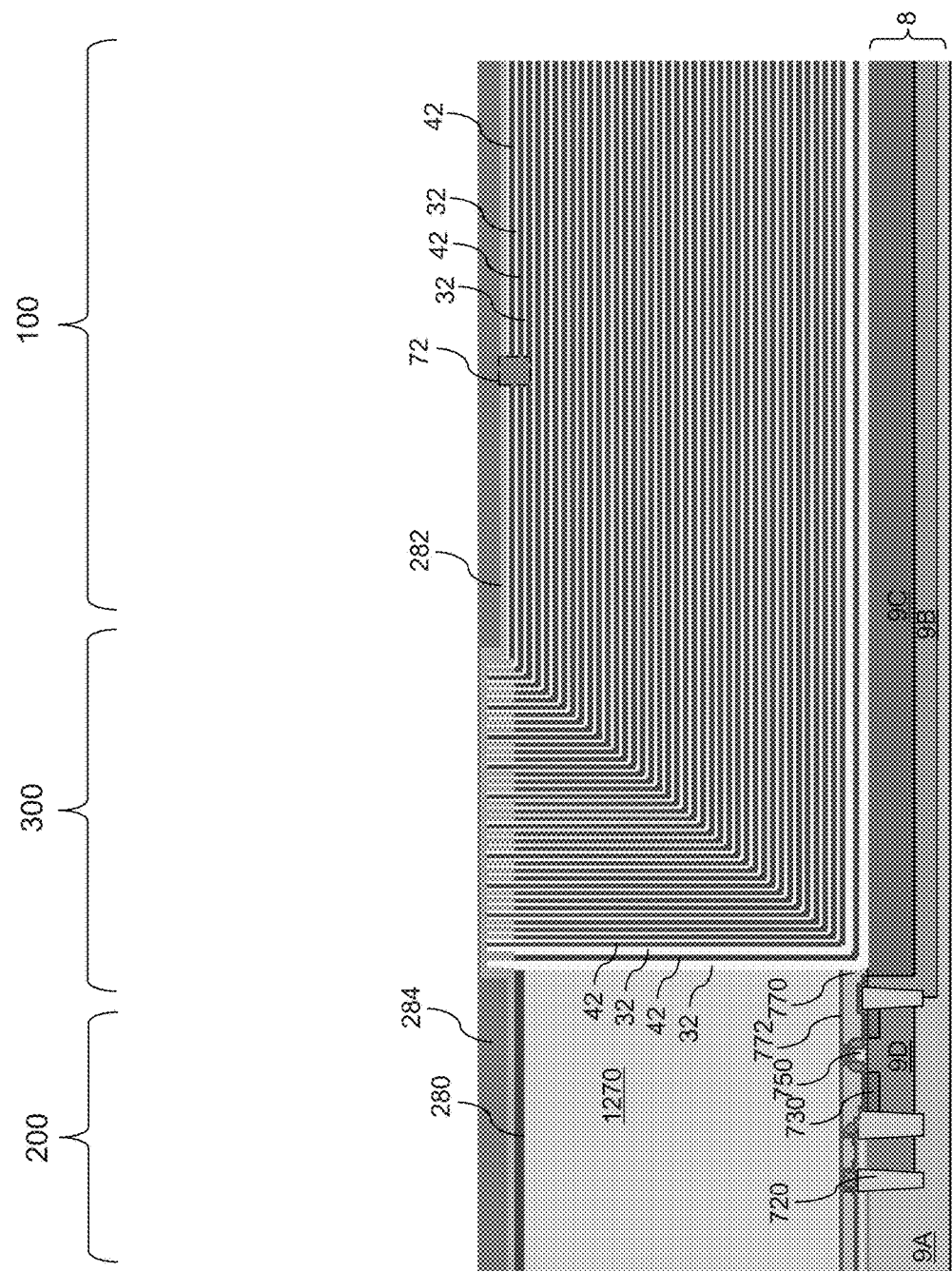
FIG. 35 is a vertical cross-sectional view of the second exemplary structure after planarization of the second insulating cap layer according to the second embodiment of the present disclosure.

Referring to FIG. 35, the second insulating cap layer 284 can be planarized so that the remaining portions of the first insulating cap layer 282 and the second insulating cap layer 284 provide a planar horizontal top surface. For example, the second insulating cap layer 284 may be planarized employing the top surface of the first insulating cap layer 282 as a stopping surface. Alternatively, the planarized top surface may consist of a top surface of the second insulating cap layer 284 that is located above the horizontal plane including the topmost surface of the first insulating cap layer 282. Yet alternatively, a top portion of the first insulating cap layer 282 may be partially planarized. The topmost portions of the first sacrificial material layers 42 (i.e., the protrusion regions 42P illustrated in FIG. 32) are covered at least by the first insulating cap layer 282, and thus, are not physically exposed.

Figure 36:
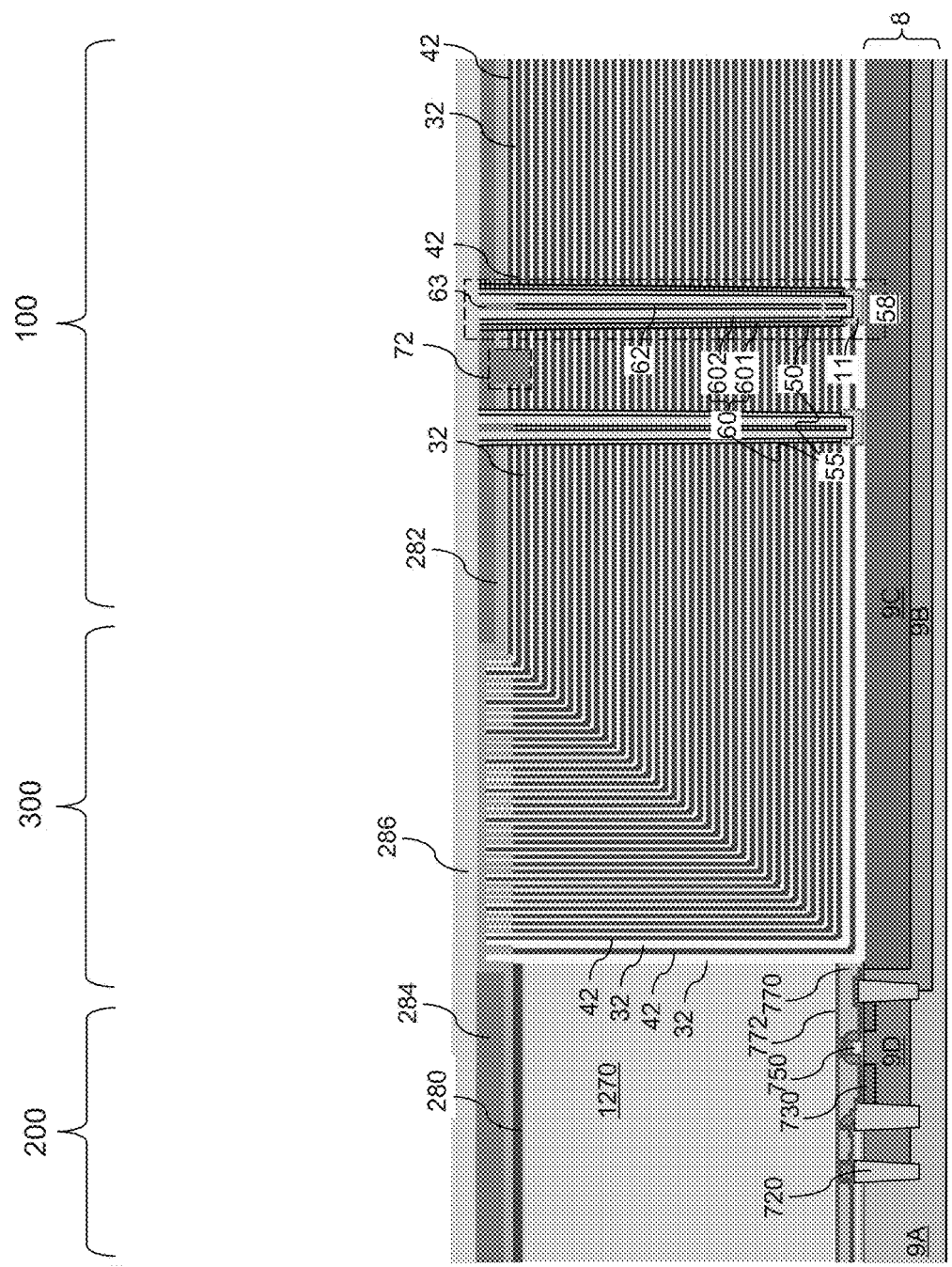
FIG. 36 is a vertical cross-sectional view of the second exemplary structure after formation of memory stack structures and a first contact level dielectric layer according to the second embodiment of the present disclosure.

Referring to FIG. 36, memory openings can be formed in the memory array region 100. Memory opening fill structures 58 can be formed in the memory openings. Each memory opening fill structure 58 includes a memory stack structure 55, an optional dielectric core 62, and a drain region 63.

For example, memory openings extending through the first and second insulating cap layers (282, 284) and the horizontally-extending portions of the first alternating stack (32, 42) to a top surface of the substrate 8. A pedestal channel portion 11 can be optionally formed at the bottom of each memory opening by a selective semiconductor deposition process such as a selective epitaxy process. A memory film 50 including a blocking dielectric layer 52, a charge storage layer 54, and a tunneling dielectric layer 56 can be sequentially deposited in each of the memory openings employing the same processing steps as in the first embodiment. Each component layer of the memory film 50 can have the same composition and thickness as in the first embodiment, and can be formed by a same processing step.

An optional first semiconductor channel layer (not expressly shown) may be deposited on the tunneling dielectric layer 56 of each memory film 50. The optional first semiconductor channel layer, the tunneling dielectric layer 56, the charge storage layer 54, and the blocking dielectric layer 52 are sequentially anisotropically etched employing at least one anisotropic etch process to physically expose an underlying semiconductor surface, which may be a semiconductor surface of a pedestal channel portion 11 (if present) or a semiconductor surface of the third doped semiconductor region 9C.

A semiconductor channel material layer can be deposited directly on the semiconductor surface at the bottom of each memory opening. If the optional first semiconductor channel layer is present, then the semiconductor channel material layer comprises a second semiconductor channel layer formed on a surface of the optional first semiconductor channel layer. If the optional first semiconductor channel layer is not present, then the semiconductor channel material layer is formed directly on the tunneling dielectric layer 56. The semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer includes amorphous silicon or polysilicon. The semiconductor channel material layer can be formed by a conformal deposition method such as low pressure chemical vapor deposition (LPCVD). The thickness of the semiconductor channel material layer can be in a range from 2 nm to 10 nm, although lesser and greater thicknesses can also be employed. The semiconductor channel material layer may partially or fully fill the cavities in the memory openings. Any remaining semiconductor material of the semiconductor channel material layer located above the top surface of the first and second insulating cap layers (282, 284) can be removed by a planarization process, which can employ a recess etch or chemical mechanical planarization (CMP). Each remaining portion of the semiconductor channel material layer in the memory openings constitutes a vertical semiconductor channel 60.

In case the cavities in each memory opening are not completely filled by the vertical semiconductor channel 60, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. Subsequently, the horizontal portion of the dielectric core layer can be removed, for example, by a recess etch from above the top surface of the first and second insulating cap layers (282, 284). Each remaining portion of the dielectric core layer in the memory openings constitutes a dielectric core 62.

Each vertical semiconductor channel 60 formed in the memory openings is a channel of a vertical field effect transistor through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each contiguous set of a blocking dielectric layer 52, a charge storage layer 54, and a tunneling dielectric layer 56 within a memory opening collectively constitutes a memory film 50, which can store electrical charges with a macroscopic retention time. As used herein, a macroscopic retention time refers to a retention time suitable for operation of a memory device as a permanent memory device such as a retention time in excess of 24 hours.

In some embodiments, a blocking dielectric layer 52 may not be present in the memory film 50 at this step, and a blocking dielectric layer may be subsequently formed after formation of backside recesses. Each combination of a memory film 50 and a vertical semiconductor channel 60 located within a same memory opening constitutes a memory stack structure 55.

The top surface of each dielectric core 62 can be further recessed within each memory opening, for example, by a recess etch to a depth that is located between the top surface of the first and second insulating cap layers (282, 284) and the bottom surface of the first and second insulating cap layers (282, 284). Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the first and second insulating cap layers (282, 284), for example, by chemical mechanical planarization (CMP) or a recess etch to form the drain regions 63. Each combination of a memory film 50 and a vertical semiconductor channel 60 within a memory opening constitutes a memory stack structure 55.

A first contact level dielectric layer 286 can be optionally deposited. If present, the first contact level dielectric layer 286 includes a dielectric material such as undoped silicate glass or a doped silicate glass, and can have a thickness in a range from 50 nm to 500 nm, although lesser and greater thicknesses can also be employed.

Figure 37A:
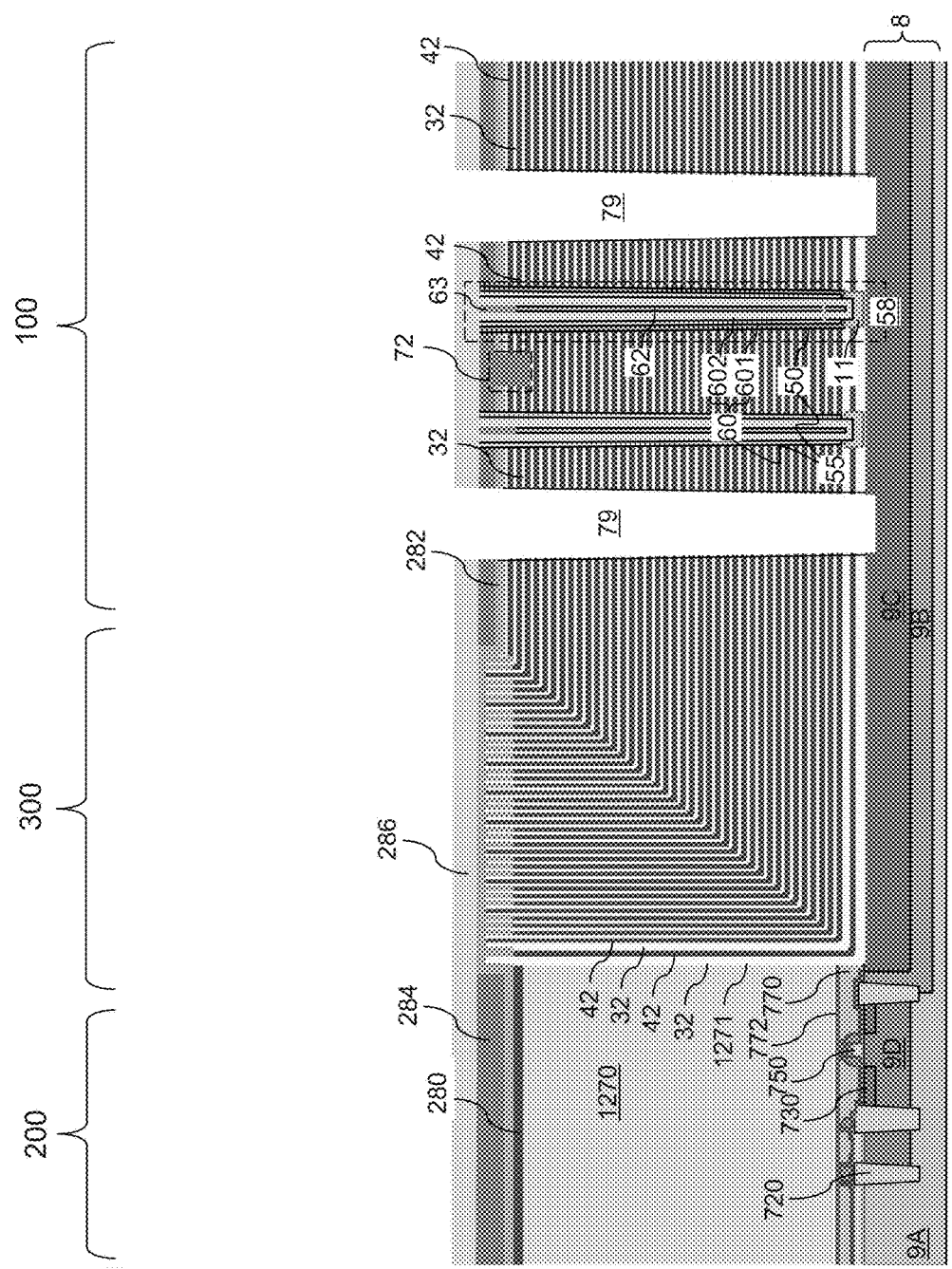
FIG. 37A is a vertical cross-sectional view of the second exemplary structure after formation of backside trenches according to the second embodiment of the present disclosure.

Referring to FIGS. 37A and 37B, a photoresist layer (not shown) can be applied over the first contact level dielectric layer 286, and can be lithographically patterned to form at least one elongated opening between clusters of memory stack structures 55 within the memory array region 100. In one embodiment, the elongated openings can laterally extend along the second horizontal direction hd2, and can have a uniform width along the first horizontal direction hd1. The pattern in the photoresist layer can be transferred through the first contact level dielectric layer 286, the first and second insulating cap layers (282, 284), and the alternating stack (32, 42) employing an anisotropic etch to form at least one backside trench 79, which extends at least to the top surface of the substrate semiconductor layer (9A, 9B, 9C, 9D). In one embodiment, the at least one backside trench 79 can extend through the first mesa structure 1270, or otherwise be adjoined to the first mesa structure 1270. In other words, a surface of the first mesa structure 1270 can be physically exposed to each backside trench 79. In one embodiment, the at least one backside trench 79 can include a source contact opening in which a source contact via structure can be subsequently formed. The photoresist layer can be subsequently removed, for example, by ashing.

In one embodiment, multiple backside trenches 79 can be formed. For example, a pair of backside trenches 79 can laterally extend along the second horizontal direction hd2 that is perpendicular to the dielectric sidewall 1271 of the first mesa structure 1270. Each first insulating layer 32 and each first sacrificial material layer 42 within first alternating stack (32, 42) can laterally extend in the first horizontal direction hd1 from a sidewall of one of the pair of backside trenches 79 to a sidewall of another of the pair of backside recesses 79.

Figure 38:
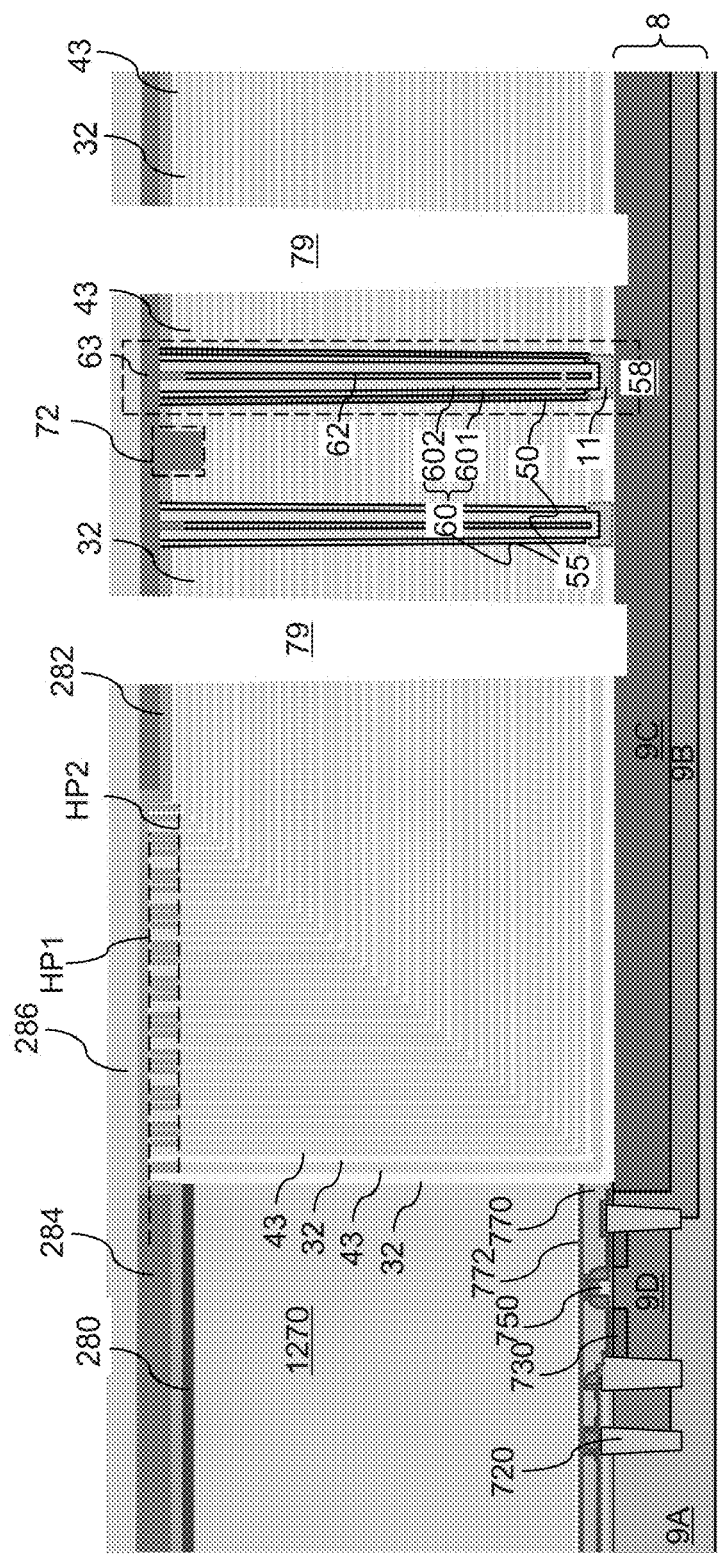
FIG. 38 is a vertical cross-sectional view of the second exemplary structure after removal of the first sacrificial material layers to form backside recesses according to the second embodiment of the present disclosure.

Referring to FIG. 38, the first sacrificial material layers 42 are removed selective to the first insulating layers 32, and the first and second insulating cap layers (282, 284), and the first contact level dielectric layer 286 to form backside recesses 43. For example, an isotropic etchant that selectively etches the material of the first sacrificial material layers 42 with respect to the material of the first insulating layers 32 can be introduced into the at least one backside trench 79, for example, employing an etch process. The backside recesses 43 are formed in volumes from which the first sacrificial material layers 42 are removed. The removal of the material of the first sacrificial material layers 42 can be selective to the material of the first insulating layers 32, the semiconductor material of the substrate semiconductor layer (9A, 9B, 9C, 9D), and the material of the outermost layer of the memory films 50. In one embodiment, the first sacrificial material layers 42 can include silicon nitride, and the first insulating layers 32 include silicon oxide.

The etch process that removes the material selective to the material and the outermost layer of the memory films 50 can be a wet etch process employing a wet etch solution, or can be a gas phase (dry) etch process in which the etchant is introduced in a vapor phase into the at least one backside trench 79. For example, if the first sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The memory stack structures 55 provide structural support to prevent collapse of the first insulating layers 32 while the backside recesses 43 are present within volumes previously occupied by the first sacrificial material layers 42.

Each backside recess 43 can include a horizontally-extending portion and a non-horizontally-extending portion, which may extend vertically or substantially vertically or with a taper angle. Each backside recess 43 includes a wall cavity region laterally extending between a pair of backside recesses 79 and vertically extending up to the second horizontal plane HP2 and a protrusion region that has a lesser lateral extent than the wall cavity region and located between the first horizontal plane HP1 and the second horizontal plane HP2. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings.

Each horizontally-extending portion of the backside recesses 43 can extend substantially parallel to the top surface of the substrate 8. A horizontally-extending portion of the backside recesses 43 can be vertically bounded by a top surface of an underlying insulating layer 32 and a bottom surface of an overlying insulating layer 32. In one embodiment, each horizontally-extending portion of the backside recesses 43 can have a uniform height throughout. Each non-horizontally-extending portion of the backside recesses 43 can extend at an angle of 60 to 90 degrees with respect to a horizontal direction, such as vertically or substantially vertically (e.g., within 5 degrees of vertical).

Figure 39:
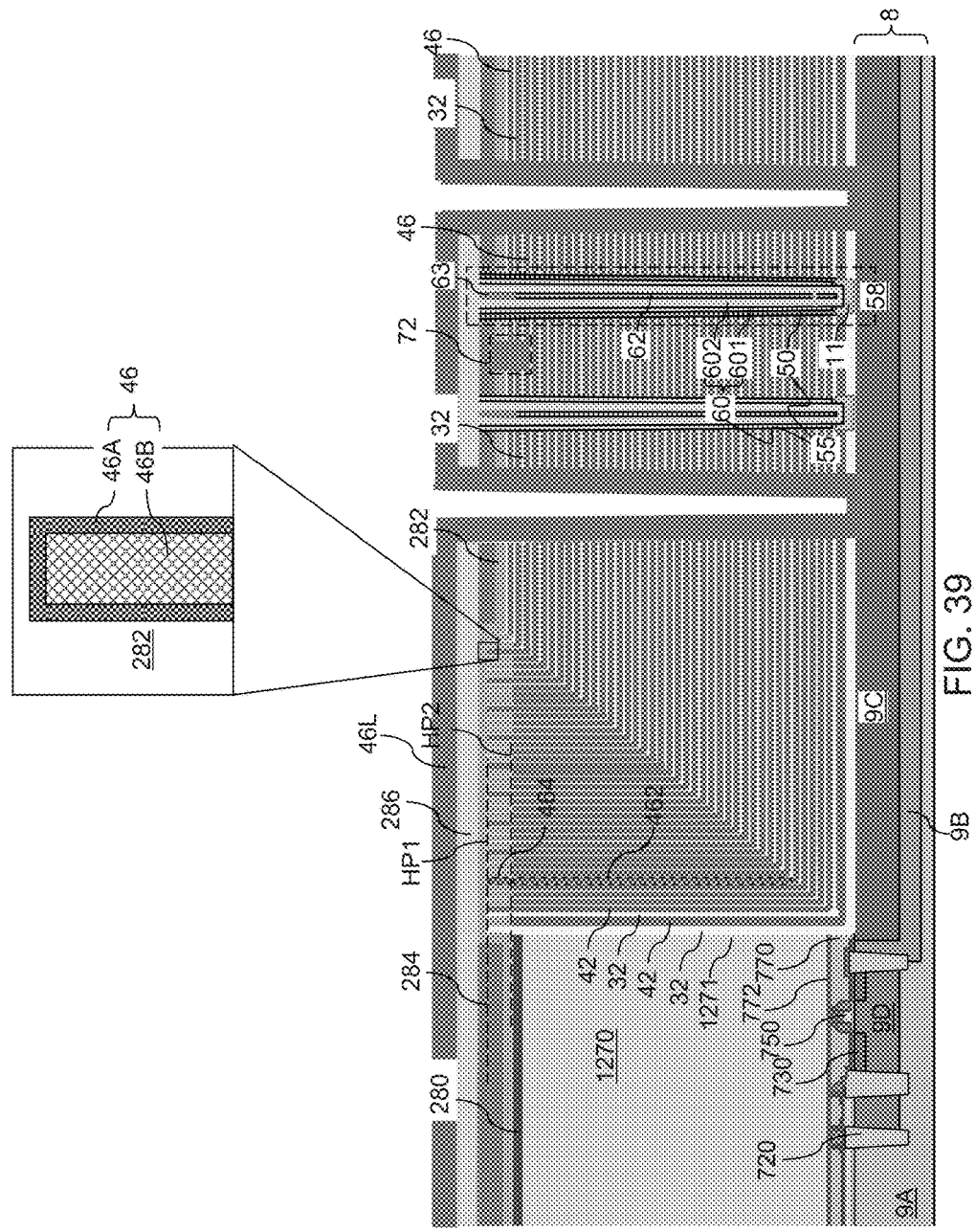
FIG. 39 is a vertical cross-sectional view of the second exemplary structure after formation of first electrically conductive layers in the backside recesses and a continuous conductive material layer in the backside trenches and over the first contact level dielectric layer according to the second embodiment of the present disclosure.

Referring to FIG. 39, first electrically conductive layers 46 can be formed in the backside recesses 43, and a continuous conductive material layer 46L can be formed in the backside trenches 79 and over the first contact level dielectric layer 286. The backside recesses 43 are filled with the first electrically conductive layers 46. Thus, the first sacrificial material layers 42 are replaced with the first electrically conductive layers 46. Each first electrically conductive layer 46 includes a horizontally-extending portion and a non-horizontally-extending portion. In one embodiment, the non-horizontally-extending portion may include a vertical plate region 462 having a respective pair of vertical sidewalls that are parallel to the dielectric sidewall 1271 of the first mesa structure 1270, and a protrusion region 464 that protrudes above the vertical plate region 462 and having a narrower lateral dimension than the vertical plate region 462 along a horizontal direction that is parallel to the dielectric sidewall 1271, i.e., along the first horizontal direction hd1.

The first electrically conducive layers 46 can be formed by conformally depositing at least one conductive material. In one embodiment, the at least one conductive material can include a conductive metal nitride (such as TiN, TaN, or WN) that forms a metallic nitride liner 46A within each first electrically conductive layer, and a metallic fill material that forms a metal fill portion 46B within each first electrically conductive layer 46. Each metal fill portion 46B can consist essentially of at least one elemental metal (i.e., a single elemental metal or an intermetallic alloy of multiple elemental metals).

The second exemplary structure can include a first alternating stack of first insulating layers 32 and first electrically conductive layers 46 located over the top surface of a substrate 8. Each of the first insulating layers 32 and the first electrically conductive layers 46 includes a respective horizontally-extending portion and a respective non-horizontally-extending portion. A first mesa structure 1270 can be located on the top surface of the substrate 8. In one embodiment, the first mesa structure 1270 can include a dielectric sidewall 1271 that contacts a most proximal one of the first insulating layers 32. The memory stack structures 55 extend through a memory array region 100 of the first alternating stack (32, 46) that includes the horizontally-extending portions of the first electrically conductive layers 46. Each of the memory stack structures 55 comprises a memory film 50 and a vertical semiconductor channel 60.

In one embodiment, each non-horizontally-extending portion of the first insulating layers 32 and the first electrically conductive layers 46 can include a vertically-extending portion. In one embodiment, each horizontally-extending portion of the first insulating layers 32 and the first electrically conductive layers 46 has a respective uniform vertical thickness (i.e., a thickness measured along the vertical direction), and each vertically-extending portion of the first insulating layers 32 and the first electrically conductive layers 46 has a respective uniform horizontal thickness (i.e., a thickness measured along a horizontal direction). In one embodiment, each vertically-extending portion of the first electrically conductive layers 46 can include a vertical plate region 462 having a pair of vertical sidewalls that are parallel to the dielectric sidewall 1271 of the first mesa structure 1270, and a protrusion region 464 that protrudes above the vertical plate region 462. In one embodiment, the protrusion region 464 can have a lesser lateral extent along a horizontal direction that is parallel to the dielectric sidewall 1271 of the first mesa structure 1270 than the vertical plate region 462.

In one embodiment, top surfaces of the protrusion regions 464 can be located within a first horizontal plane HP1, and top surfaces of the vertical plate regions 462 can be located within a second horizontal plane HP2 located below the first horizontal plane HP1. In one embodiment, the entirety of each protrusion region 464 can have the same lateral dimension as a respective underlying one of the vertical plate regions 462 along a horizontal direction that is perpendicular to the dielectric sidewall 1271 of the first mesa structure 1270, i.e., along the second horizontal direction hd2.

Figure 40:
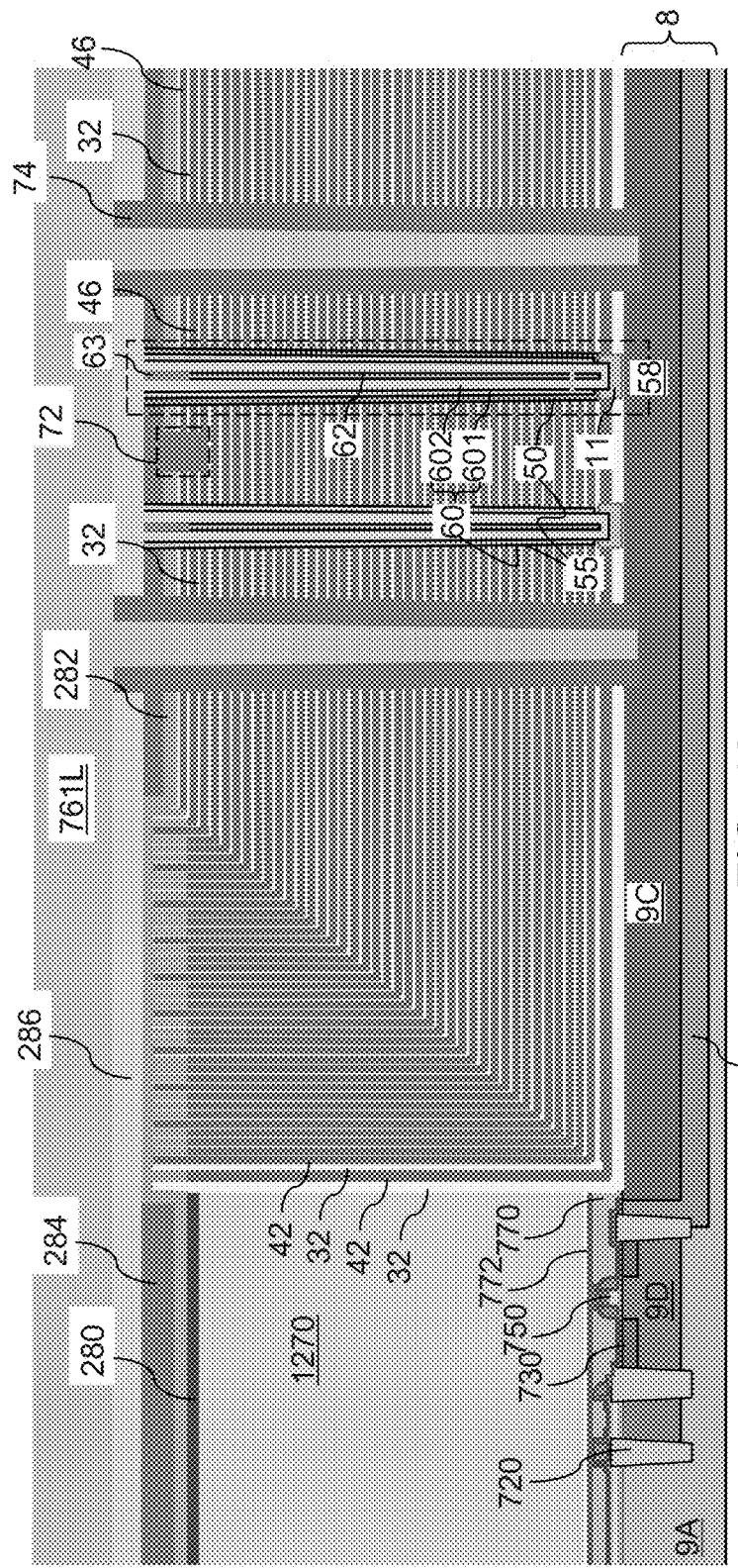
FIG. 40 is a vertical cross-sectional view of the second exemplary structure after forming of insulating spacers at a periphery of each backside trench and deposition of a first conductive material layer in the backside trenches and over the first contact level dielectric layer according to the second embodiment of the present disclosure.

Referring to FIG. 40, the continuous conductive material layer 46L can be removed by an etch-back process, which can employ an isotropic etch process and/or an anisotropic etch process. The etch-back process removes the continuous conductive material layer 46L selective to the materials of the first contact level dielectric layer 286 and the first insulating layers 32.

An insulating material layer can be conformally deposited in the backside trenches 79, and can be anisotropically etched to form insulating spacers 74. The insulating spacers 74 can be formed in a tubular configuration at a periphery of each backside trench 79, and includes an insulating material such as silicon oxide. A first conductive material layer 761L including a first conductive material can be deposited in the backside trenches 79 and over the first contact level dielectric layer 286 by a conformal deposition process. For example, the first conductive material layer 761L can include a conductive semiconductor material, which is a heavily doped semiconductor material. Optionally, source regions (not shown) can be formed underneath the backside trenches 79 by implanting dopant ions into surface portions of third doped semiconductor region 9C, which can include horizontal semiconductor channels connected to the pedestal channel portions 11.

Figure 41:
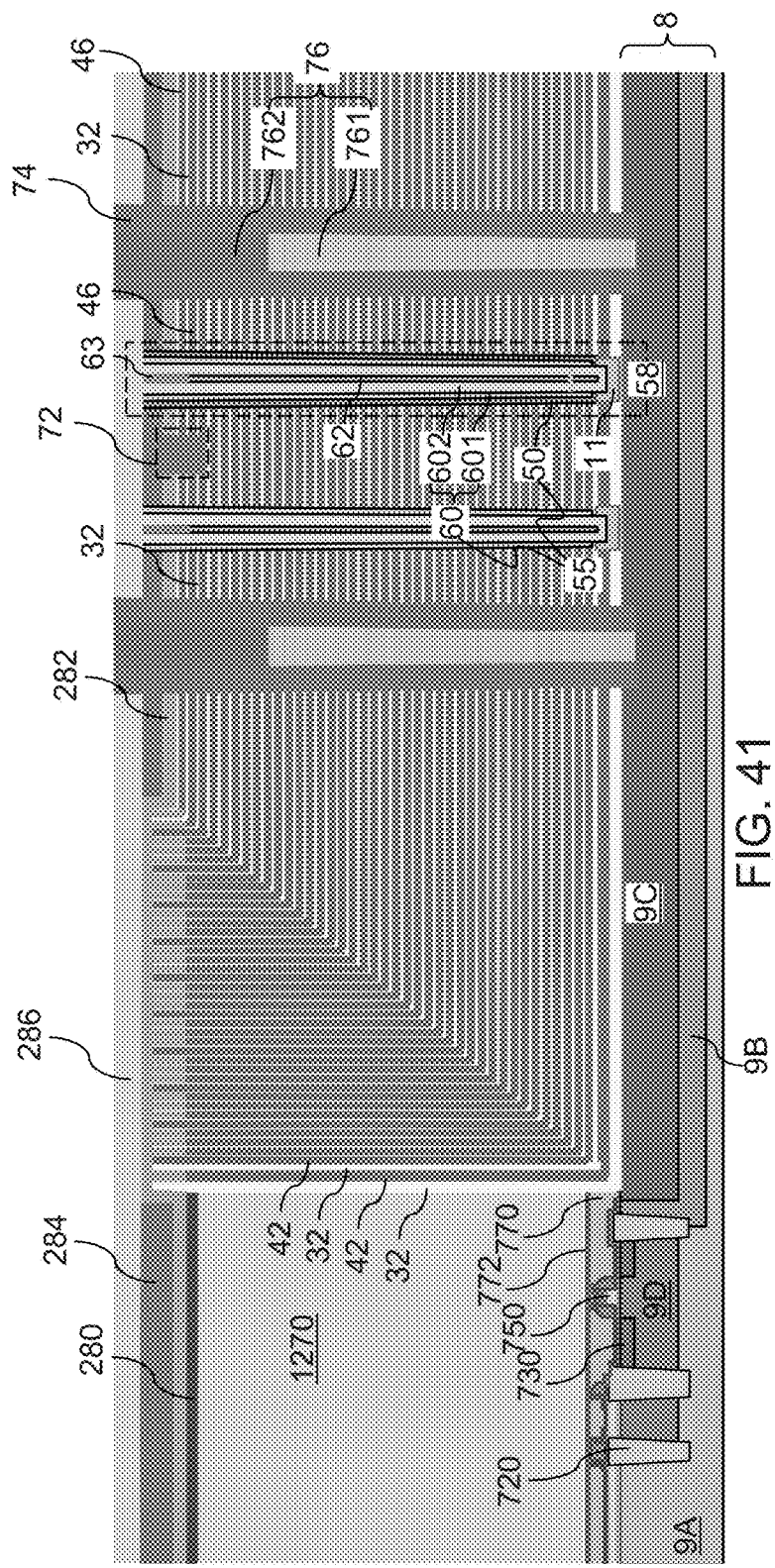
FIG. 41 is a vertical cross-sectional view of the second exemplary structure after recessing the first conductive material layer and deposition and recessing of a second conductive material layer to form backside contact via structures according to the second embodiment of the present disclosure.

Referring to FIG. 41, horizontal portions of the first conductive material layer 761L can be removed by a planarization process, which can employ an etch-back process or chemical mechanical planarization. Further, remaining portions of the first conductive material layer 761L can be removed from upper portions of the backside trenches 79. Each remaining portion of the first conductive material layer 761L located at lower portions of the backside trenches 79 constitutes a lower backside contact via structure 761. A second conductive material (e.g., a metal, such as tungsten) that is different from the first conductive material can be deposited in the upper portions of the backside trenches 79. Excess portions of the second conductive material can be removed from above the horizontal plane including the top surface of the first contact level dielectric layer by a planarization process. Each remaining portion of the second conductive material in the backside trenches 79 constitutes an upper backside contact via structure 762. Each vertical stack of a lower backside contact via structure 761 and an upper backside contact via structure 762 constitutes a backside contact via structure 76 that provides electrical contact to the third doped semiconductor region 9C and/or source regions (if provided at the bottom of each backside trenches 79).

Figure 42:
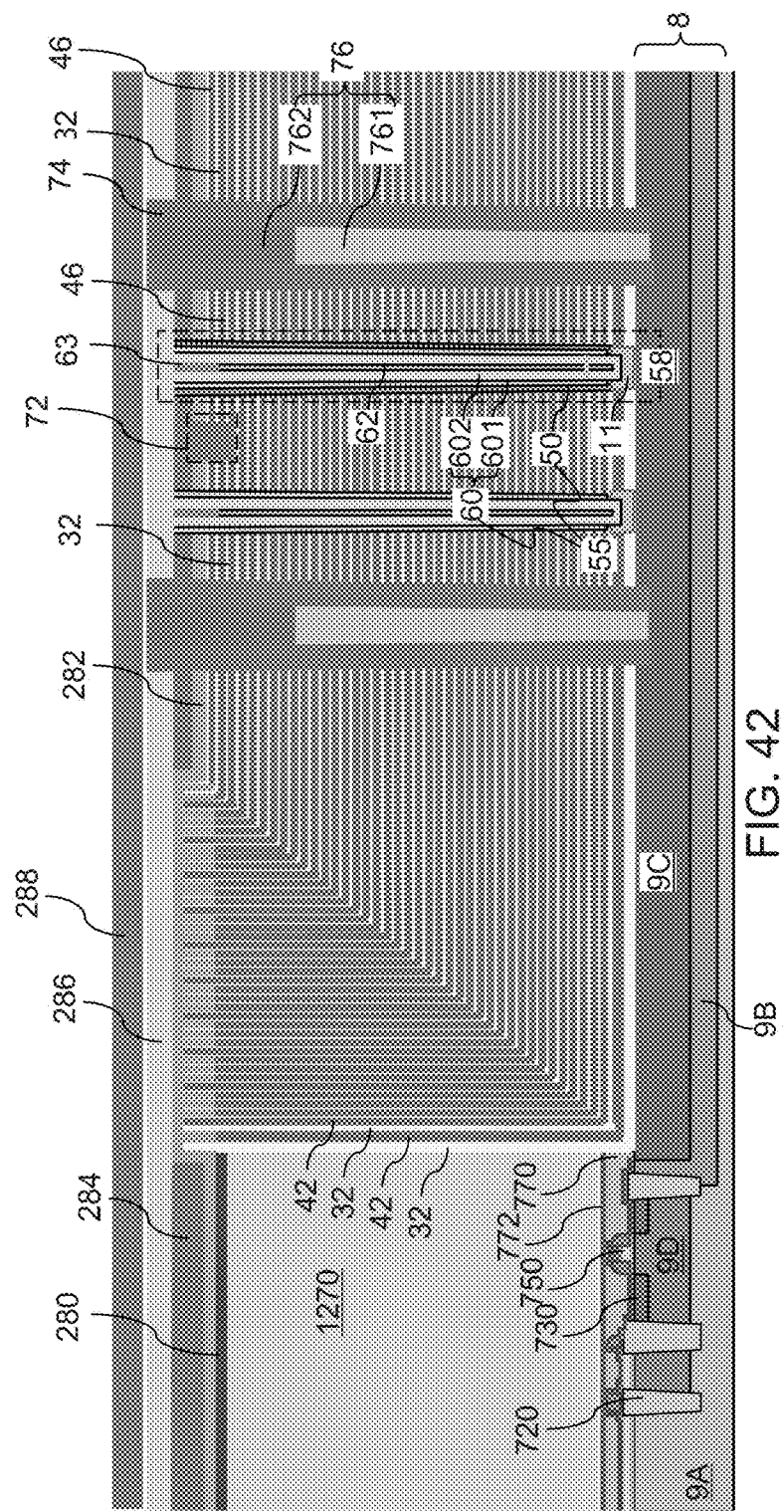
FIG. 42 is a vertical cross-sectional view of the second exemplary structure after formation of a second contact level dielectric layer according to the second embodiment of the present disclosure.

Referring to FIG. 42, a second contact level dielectric layer 288 can be formed over the first contact level dielectric layer 286. The second contact level dielectric layer 288 includes a dielectric material such as undoped silicate glass or a doped silicate glass, and can have a thickness in a range from 20 nm to 500 nm, although lesser and greater thicknesses can also be employed.

Figure 43:
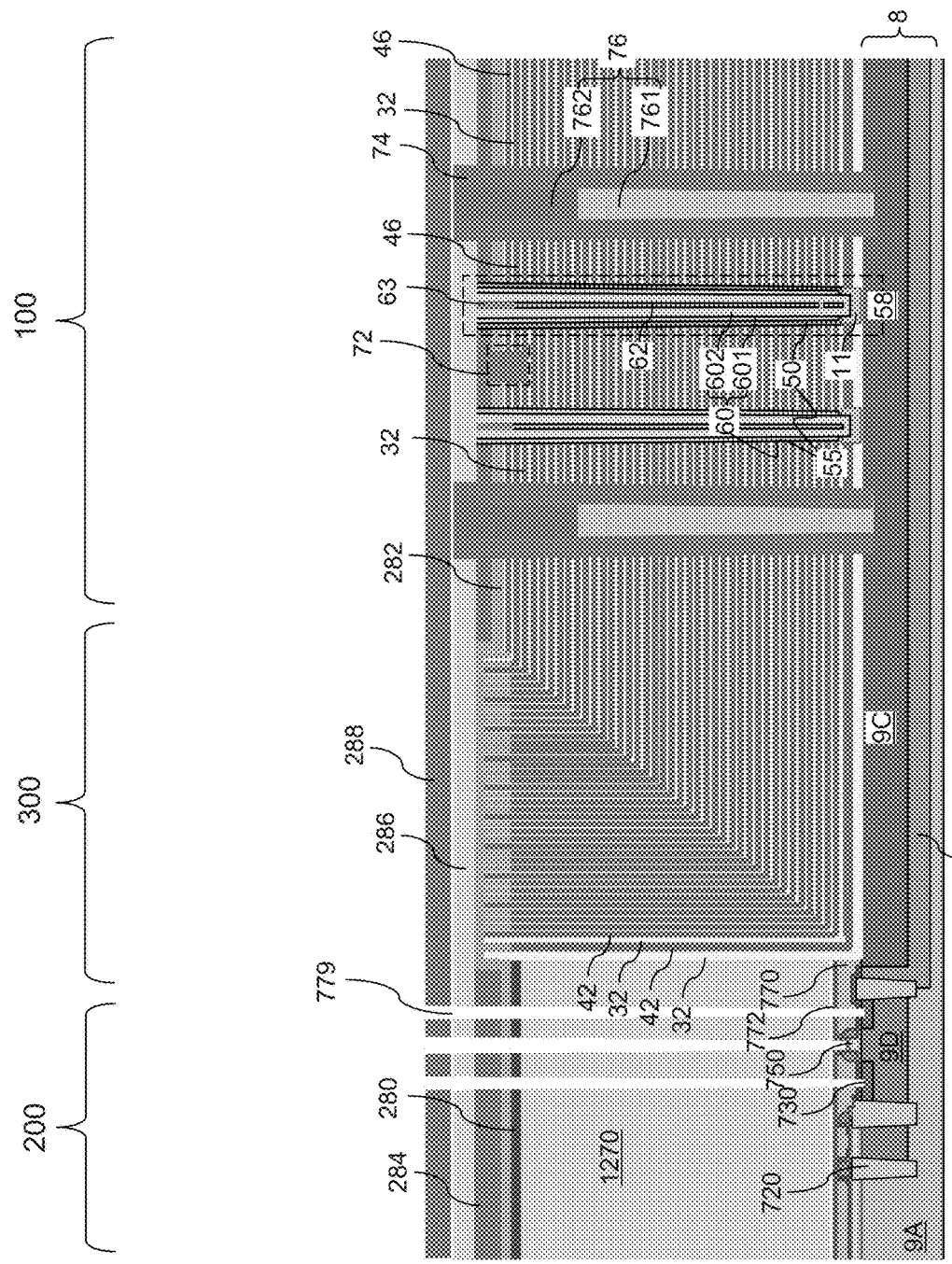
FIG. 43 is a vertical cross-sectional view of the second exemplary structure after formation of peripheral device contact via cavities according to the second embodiment of the present disclosure.

Referring to FIG. 43, a first photoresist layer (not shown) is applied over the second exemplary structure, and is lithographically patterned to form openings in the peripheral device region 200 in areas that overlie the various semiconductor devices on the substrate 8. An anisotropic etch is performed to etch through unmasked regions of the underlying dielectric material layers (288, 286, 284, 282), the planarization stopping structure 280, the first mesa structure 1270, the device capping dielectric layer 772, and the device planarization dielectric layer 770 to form peripheral device contact via cavities 779 that extend to various nodes of the semiconductor devices. The first photoresist layer may be subsequently removed, for example, by ashing.

Figure 44:
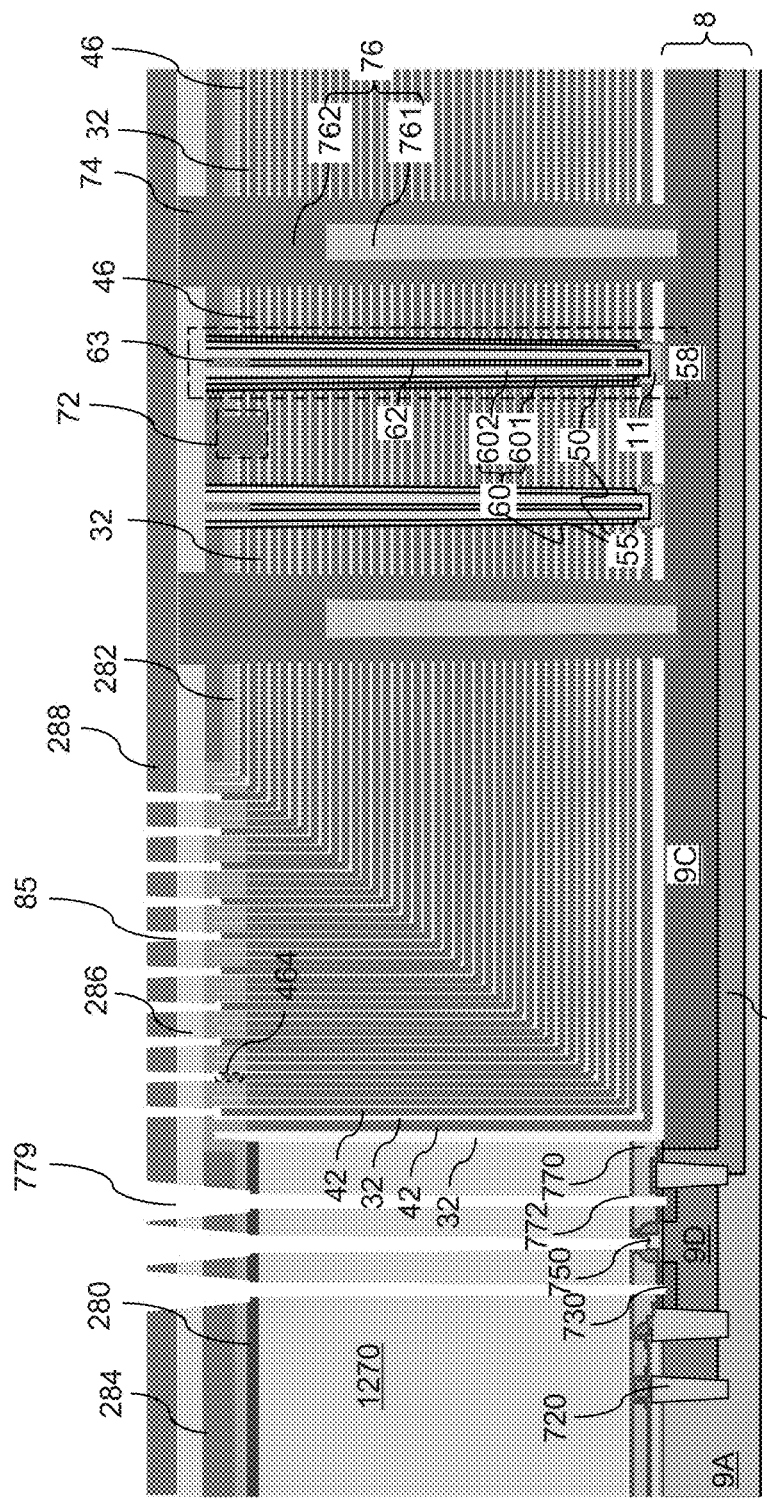
FIG. 44 is a vertical cross-sectional view of the second exemplary structure after formation of word line contact via cavities according to the second embodiment of the present disclosure.

Referring to FIG. 44, a second photoresist layer may be applied over the second exemplary structure, and can be patterned to form opening in areas that overlie the protrusion regions 464 of the first electrically conductive layers 46. An anisotropic etch is performed to form word line contact via cavities 85, which can have a respective horizontal cross-sectional shape that is approximately the same as, larger than, or smaller than, the horizontal cross-sectional shape of an underlying protrusion region 464. In one embodiment, the horizontal cross-sectional area of each word line contact via cavity 85 at a bottom portion thereof can be in a range from 80% to 120% of the horizontal cross-sectional area of the underlying protrusion region 464. The second photoresist layer can be subsequently removed, for example, by ashing.

In an alternative embodiment, instead of employing the second photoresist layer to form the pattern of openings for the word line contact via cavities 85, the pattern of openings for the word line contact via cavities 85 may be formed in the first photoresist layer after the peripheral device contact via cavities 779 are at least partially formed. An anisotropic etch process can be subsequently formed to form the word line contact via cavities 85 and the bottom portions of the peripheral device contact via cavities 779 simultaneously. The first photoresist layer can be subsequently removed. In another alternative embodiment, top portions of the peripheral device contact via cavities 779 can be laterally expanded by an isotropic etch process prior to removal of the first photoresist layer, or by employing a sacrificial fill material that temporarily fills bottom portions of the peripheral device contact via cavities 779.

Figure 45:
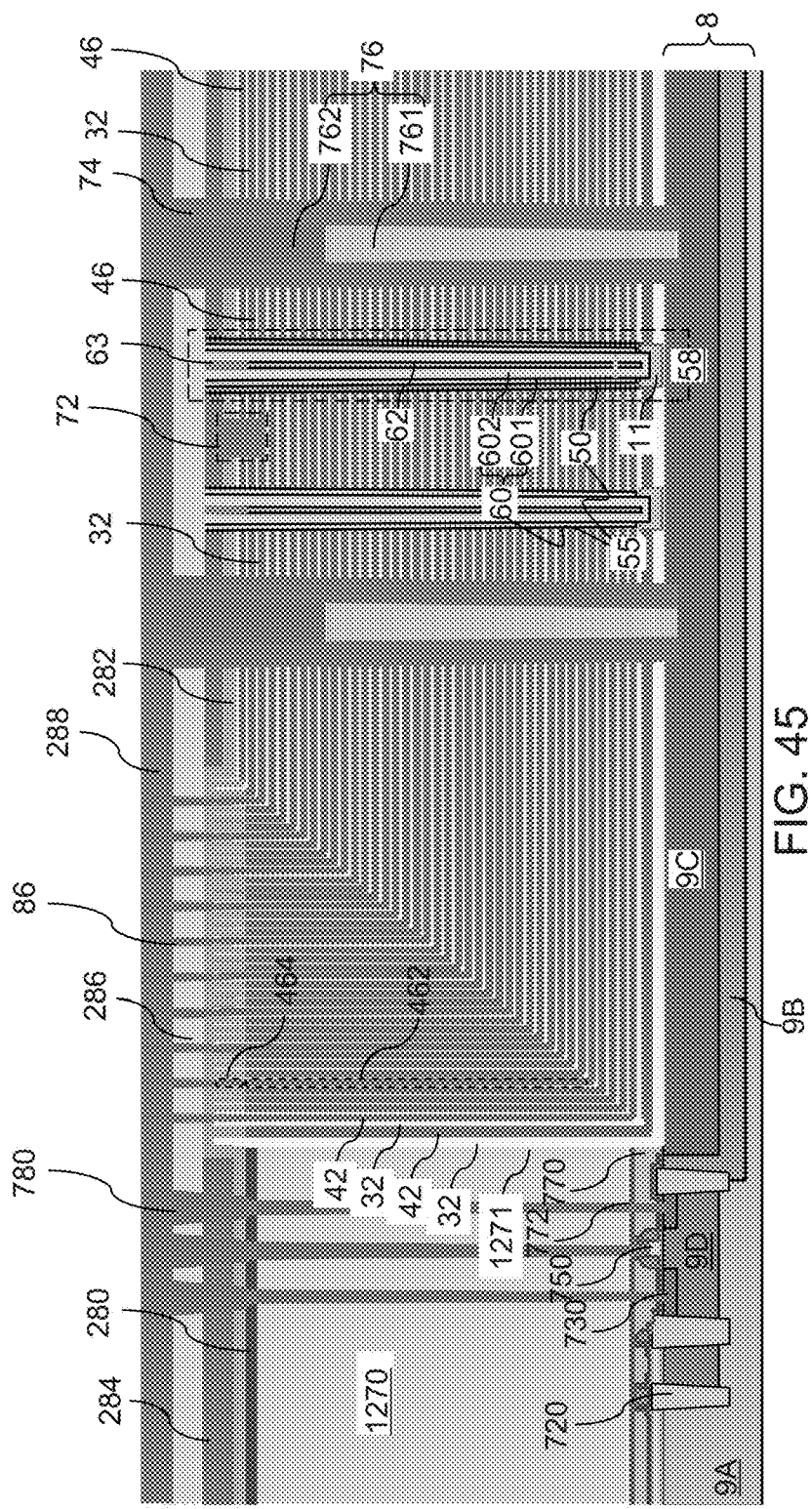
FIG. 45 is a vertical cross-sectional view of the second exemplary structure after formation of peripheral contact via structures and word line contact via structures according to the second embodiment of the present disclosure.

Referring to FIG. 45, at least one conductive material is deposited in the word line contact via cavities 85 and the peripheral device contact via cavities 779. Excess portions of the at least one conductive material can be removed from above the second contact level dielectric layer 288 by a planarization process, which can include an etch back process or a chemical mechanical planarization process. Each remaining portion of the at least one conductive material in the word line contact via cavities 85 constitutes a word line contact via structure 86. Each remaining portion of the at least one conductive material in the peripheral device contact via cavities 779 constitutes a peripheral contact via structure 780.

In one embodiment, the at least one conductive material can include at least one metallic material, and the peripheral contact via structures 780 and the word line contact via structures 86 can be metal contact structures. Each word line contact via structure 86 can be formed on a respective one of the protrusion regions 464 of the first electrically conductive layers 46, and can be vertically spaced from top surfaces of the vertical plate regions 462.

Figure 46:
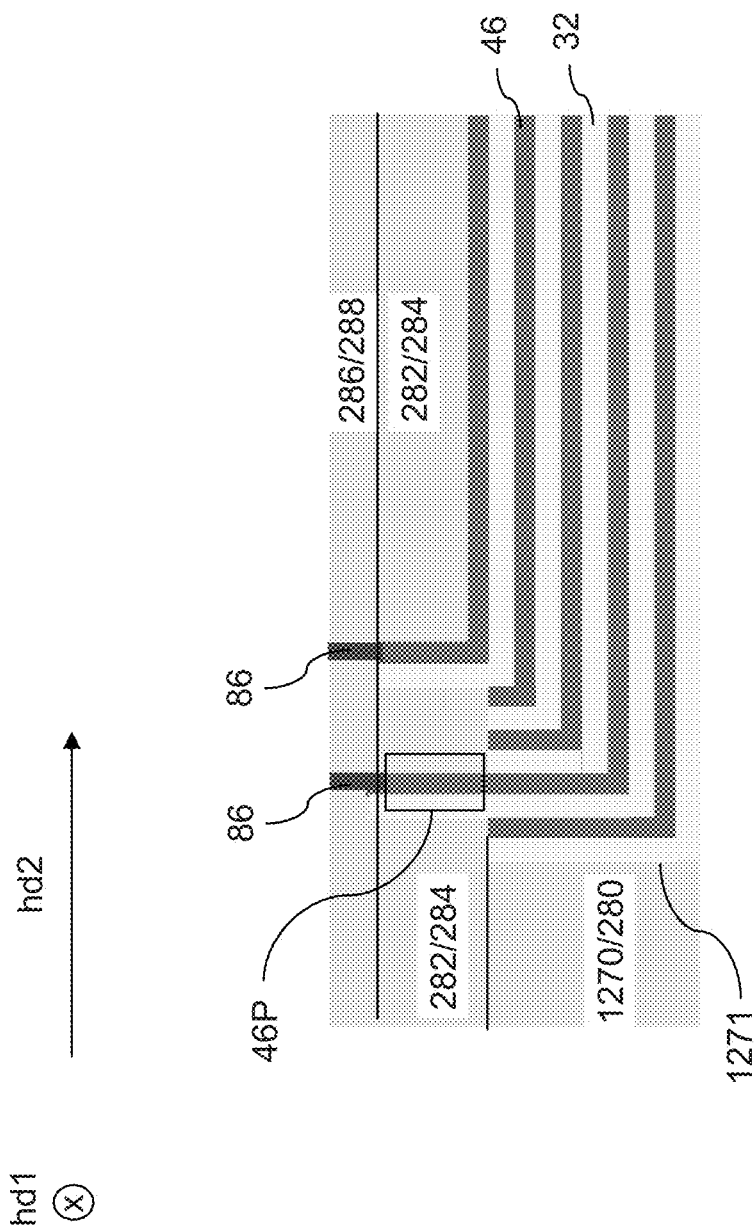
FIG. 46 is a magnified view of a region of FIG. 45.

Referring to FIG. 46, each word line contact via structure 86 can include a pair of sidewalls that laterally extend along the first horizontal direction hd1, which is the direction along which a dielectric sidewall 1271 of the first mesa structure 1270 laterally extends. The pair of sidewalls of each word line contact via structure 86 may be vertically coincident with, or may be laterally offset from, sidewalls of an underlying protrusion region 464 of a first electrically conductive layer 46.

Figure 47:
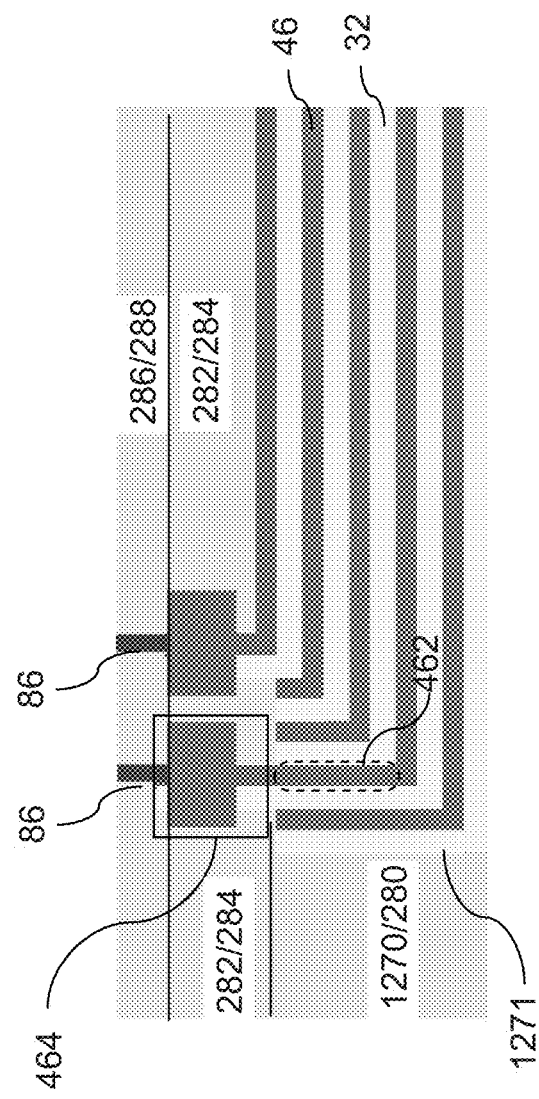
FIG. 47 is a magnified view of a region of an alternative embodiment of the second exemplary structure of FIG. 45.

Referring to FIG. 47, a region of an alternative embodiment of the second exemplary structure is illustrated, in which each protrusion region 464 can include a portion having a greater lateral dimension than an underlying one of the vertical plate regions 462 along a horizontal direction that is perpendicular to the dielectric sidewall 1271 of the first mesa structure 1270.

Figures 49A, 49B:
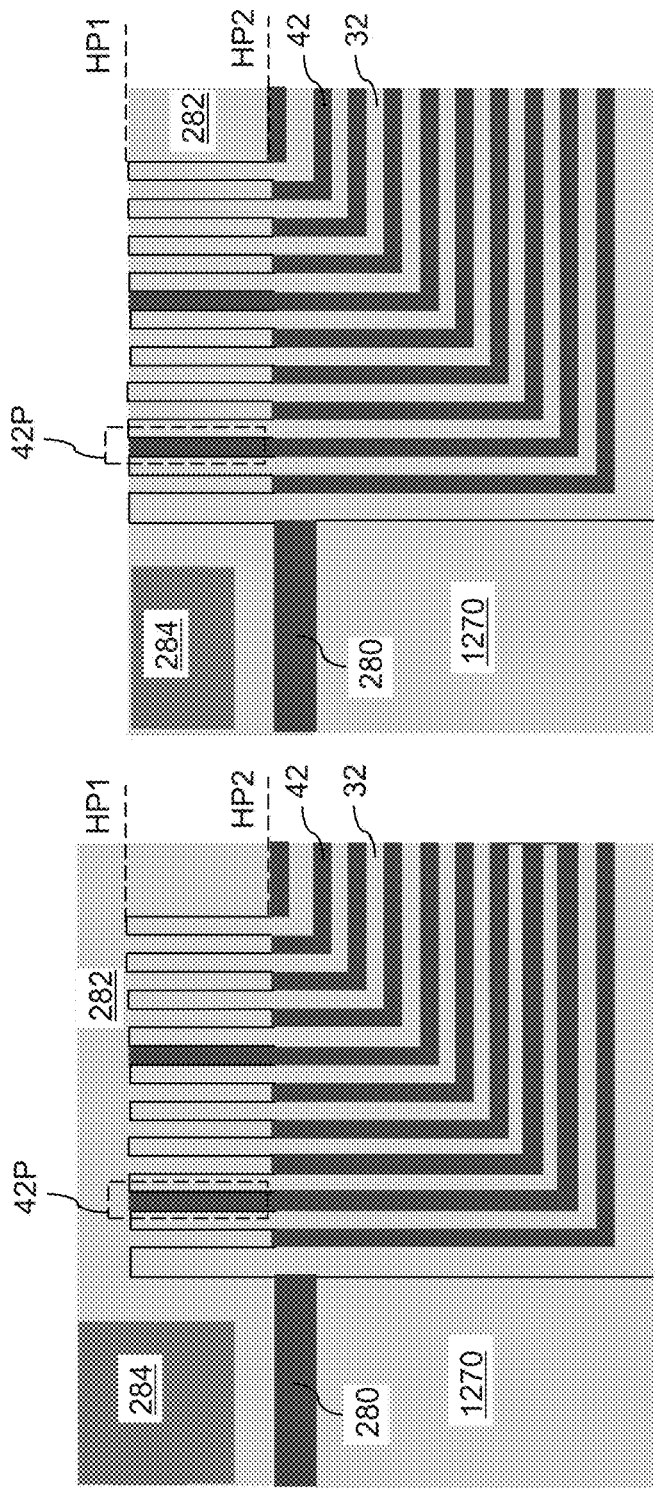

FIGS. 48 and 49A-49F illustrate a manufacturing sequence that can be employed to provide the alternative embodiment illustrated in FIG. 47. Referring to FIGS. 48 and 49A, the alternative embodiment of the second exemplary structure can be derived from the second exemplary structure of FIG. 35.

Referring to FIG. 49B, the second insulating cap layer 284 and the first insulating cap layer 282 can be partially vertically recessed to physically expose first top surfaces of the non-horizontally-extending portions of the first sacrificial material layers 42 located within the first horizontal plane HP1, i.e., to physically expose the top surfaces of the protrusion regions 42P of the first sacrificial material layers 42. Second top surfaces of the non-horizontally-extending portions of the first sacrificial material layers 42 located within the second horizontal plane HP2 are not physically exposed. In an illustrative example, the first and second insulating cap layers (282, 284) can include undoped silicate glass, and a wet etch process employing hydrofluoric acid can be performed to vertically recess the top surfaces of the first and second insulating cap layers (282, 284) to physically expose the top surfaces of the protrusion regions 42P of the first sacrificial material layers 42. Topmost surfaces of the first insulating layers 32 can be physically exposed.

Referring to FIG. 49C, the first top surfaces of the non-horizontally-extending portions of the first sacrificial material layers 42 are vertically recessed to form recess cavities 87'. For example, a selective isotropic etch process can be performed to vertically recess the first sacrificial material layers 42. The selective isotropic etch process etches the material of the first sacrificial material layers 42 selective to the materials of the first and second insulating cap layers (282, 284) and the first insulating layers 32. For example, if the first sacrificial material layers 42 include silicon nitride, and if the first and second insulating cap layers (282, 284) and the first insulating layers 32 include undoped silicate glass, the selective isotropic etch process can be a wet etch process (e.g., phosphoric acid etch process) that etches silicon nitride selective to undoped silicate glass. The recess depth can be about the target thickness of conductive pad structures to be subsequently formed, and is less than the initial height of the protrusion regions 42P of the first sacrificial material layers 42. In one embodiment, the recess depth can be in a range from 20 nm to 100 nm, although lesser and greater recess depths can also be employed.

Referring to FIG. 49D, another selective isotropic etch process can be performed to etch the materials of the first and second insulating cap layers (282, 284) and the first insulating layers 32 selective to the material of the first sacrificial material layers 42. The recess cavities 87' are isotropically expanded by isotropically etching the first and second insulating cap layers (282, 284) and the first insulating layers 32, and annular pad cavities 87 can be formed around each vertically protruding portion, i.e., the protrusion region 42P, of the first sacrificial material layers 42. For example, if the first sacrificial material layers 42 include silicon nitride, and if the first and second insulating cap layers (282, 284) and the first insulating layers 32 include undoped silicate glass, the selective isotropic etch process can be a wet etch process that etches undoped silicate glass selective to silicon nitride (such as a wet etch employing hydrofluoric acid).

Figures 49E, 49F:
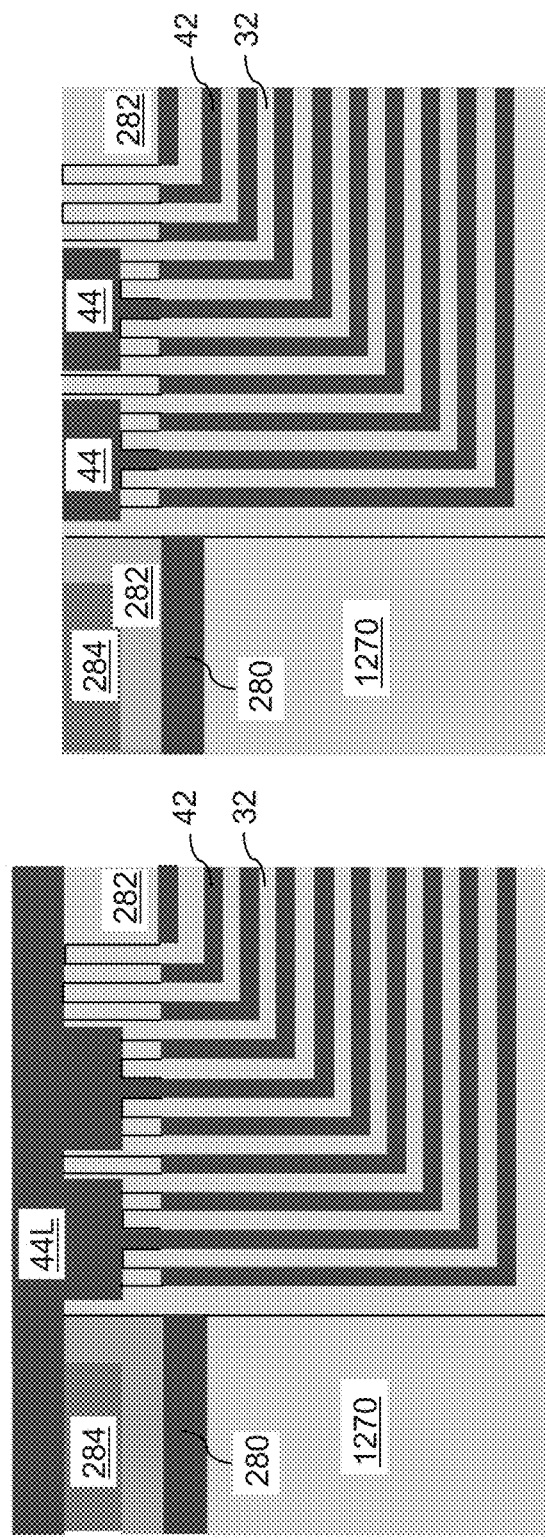

Referring to FIG. 49E, a sacrificial fill material layer 44L can be deposited in the annular pad cavities 87 and over the first and second insulating cap layers (282, 284). In one embodiment, the sacrificial fill material layer 44L can include the same material (e.g., silicon nitride) as the first sacrificial material layers 42.

Referring to FIG. 49F, horizontal portions of the sacrificial fill material layer 44L can be removed from above the first and second insulating cap layers (282, 284) by a planarization process. The planarization process can employ a recess etch and/or chemical mechanical planarization. Each remaining portion of the sacrificial fill material layer 44L can combine with a protruding portion of a first sacrificial material layer 42 to form a first sacrificial pad structure 44. Each sacrificial pad structure 44 fills an isotropically expanded recess cavity that is formed at the processing steps of FIG. 49D.

The first mesa structure 1270, the first alternating stack of the first insulating layers 32 and the first sacrificial material layers 42, and the structures formed thereupon collectively constitutes a first tier structure. A second tier structure can be subsequently formed over the first tier structure.

Figure 50:
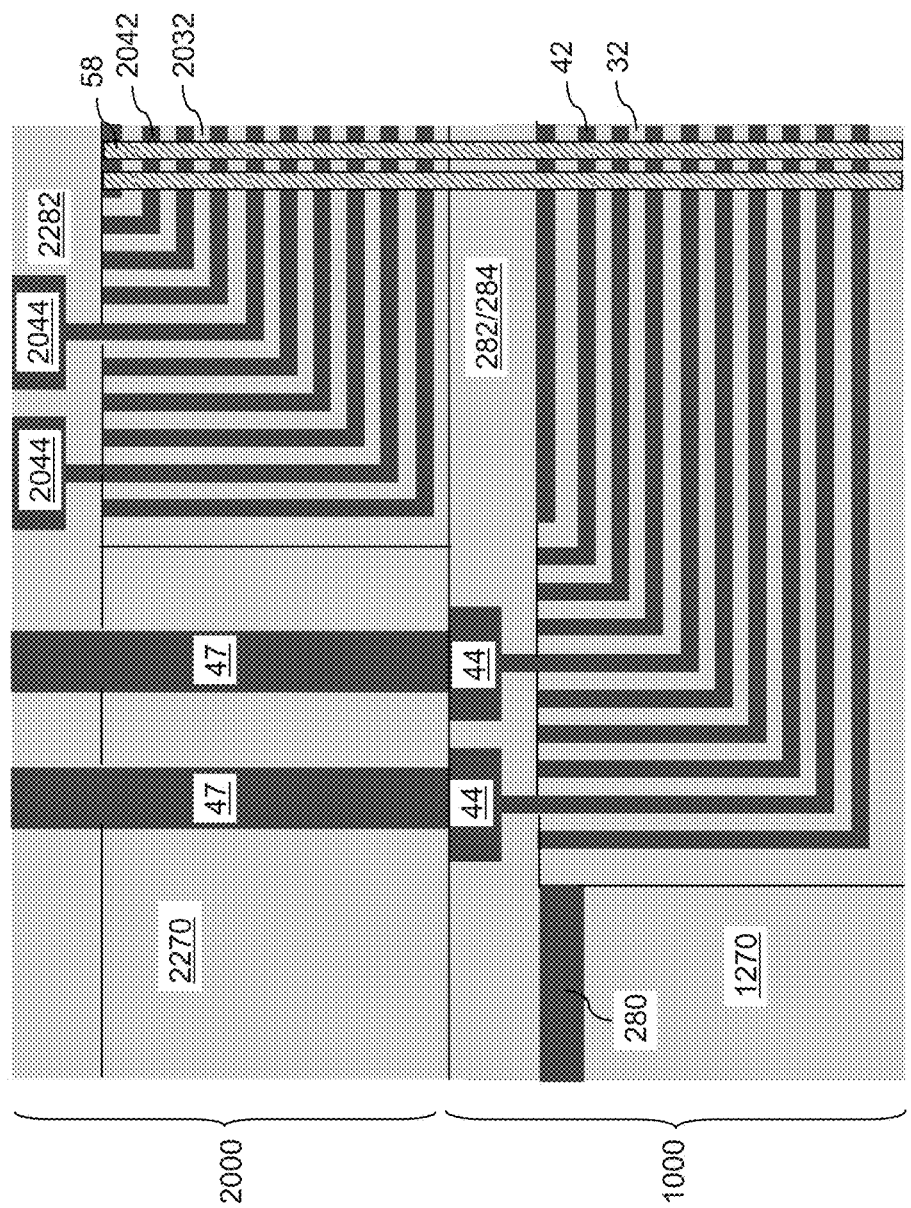
FIG. 50 is a vertical cross-sectional view of the alternative embodiment of the second exemplary structure after formation of a second mesa structure and a second alternating stack of second insulating layers and second sacrificial material layers, second sacrificial pad structures, and sacrificial contact via structures according to the second embodiment of the present disclosure.

Referring to FIG. 50, an exemplary configuration for forming a second tier structure 2000 over a first tier structure 1000 is illustrated. A second mesa structure 2270 can be formed over the first mesa structure 1270 and the non-horizontally-extending portions of the first insulating layers 32 and the first sacrificial material layers 42. A second alternating stack of second insulating layers 2032 and second sacrificial material layers 2042 can be formed on a dielectric sidewall of the second mesa structure 2270 and over the horizontally-extending portions of the various layers of the first alternating stack (32, 42), for example, by performing a set of processing steps such as the processing steps of FIGS. 27-30. The second insulating layers 2032 can include the same material as, and can have the same thickness as, the first insulating layers 32. The second sacrificial material layers 2042 can include the same material as, and can have the same thickness as, the first sacrificial material layers 42. Each of the second insulating layers 2032 and the second sacrificial material layers 2042 includes a respective horizontally-extending portion and a respective non-horizontally-extending portion.

Memory openings can be formed through the horizontally-extending portions of the second alternating stack (2032, 2042), the first and second insulating cap layers (282, 284), and the horizontally-extending portions of the first alternating stack (32, 42). Memory opening fill structures 58 including a respective memory stack structure 55 can be formed by performing the processing steps of FIG. 36. The memory stack structures 55 (within the memory opening fill structures 58) are formed through the horizontally-extending portions of the second sacrificial material layers 2042, the second insulating layers 2032, the first sacrificial material layers 42, and the first insulating layers 32.

In an alternative embodiment, instead of forming a memory opening fill structure 58 within each memory opening 49 in the first alternating stack (32, 42), a sacrificial material is formed in each memory opening 49 during fabrication of the first tier structure. Thereafter, the memory openings are formed through the horizontally-extending portions of the second alternating stack (2032, 2042) and the first and second insulating cap layers (282, 284) to expose the sacrificial material. The sacrificial material is then selectively removed from each memory opening 49 in the first alternating stack (32, 42), and the memory opening fill structure 58 is formed within each memory opening in the first and second tiers.

Second tier insulating cap layers 2282 can be formed in the same manner as the first and second insulating cap layers (282, 284). Second sacrificial pad structures 2044 can be formed in the same manner as the first sacrificial pad structures 44 on protruding regions of the second sacrificial material layers 2042. Sacrificial contact via structures 47 including the same material as the first and second sacrificial material layers (42, 2042) can be formed through the second mesa structure 2270 on the first sacrificial pad structures 44.

Figure 51:
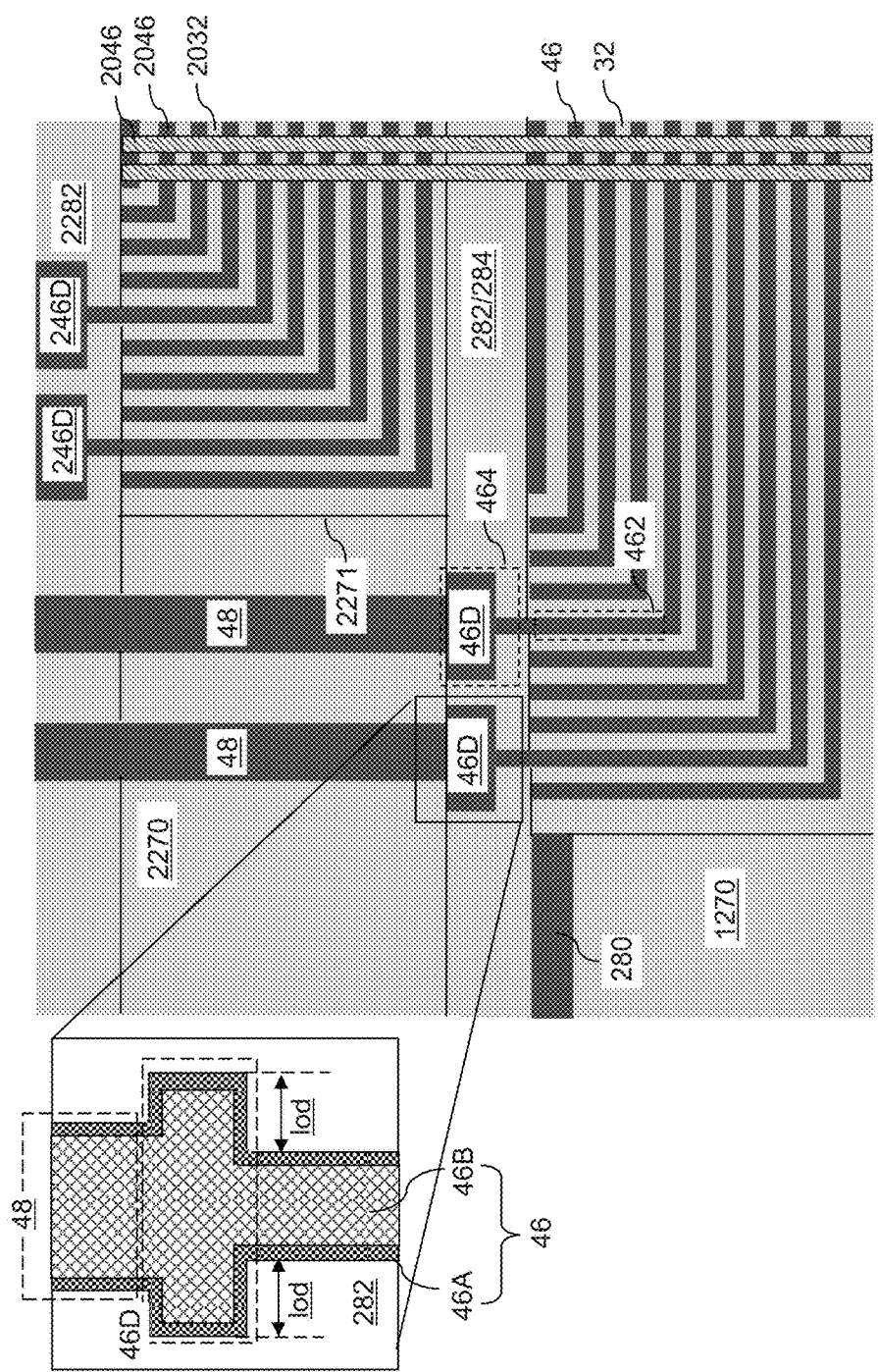
FIG. 51 is a vertical cross-sectional view of the alternative embodiment of the second exemplary structure after replacement of the sacrificial material layers with electrically conductive layers and replacement of the sacrificial contact via structures with word line contact via structures according to the second embodiment of the present disclosure.

Referring to FIG. 51, the processing steps of FIGS. 37A, 37B, and 38-41 can be performed to replace the first and second sacrificial material layers (42, 2042) with first and second electrically conductive layers (46, 2046), respectively. The first sacrificial pad structures 44, the sacrificial contact via structures 47, and the second sacrificial pad structures 2044 can be simultaneously replaced with first electrically conductive pad structures 46D, word line contact via structures 48, and second electrically conducive pad structures 2046D, respectively. Each of the first and second electrically conductive layers (46, 2046), the first electrically conductive pad structures 46D, the word line contact via structures 48, and the second electrically conducive pad structures 2046D includes at least one conductive material. In one embodiment, the at least one conductive material can include a conductive metal nitride (such as TiN, TaN, or WN) that forms a metallic nitride liner 46A within each of the first and second electrically conductive layers (46, 2046), the first electrically conductive pad structures 46D, the word line contact via structures 48, and the second electrically conducive pad structures 2046D, and a metallic fill material that forms a metal fill portion 46B within each of the first and second electrically conductive layers (46, 2046), the first electrically conductive pad structures 46D, the word line contact via structures 48, and the second electrically conducive pad structures 2046D. Each metal fill portion 46B can consist essentially of at least one elemental metal (i.e., a single elemental metal, such as W, or an intermetallic alloy of multiple elemental metals).

In one embodiment, a metallic nitride liner 46A can continuously extend through a first electrically conductive layer 46, a first electrically conductive pad structure 46D, and a word line contact via structure 48. Likewise, a metal fill portion 46B can continuously extend through a first electrically conductive layer 46, a first electrically conductive pad structure 46D, and a word line contact via structure 48. In one embodiment, a metallic nitride liner 46A can continuously extend through a second electrically conductive layer 2046 and a second electrically conductive pad structure 2046D. Likewise, a metal fill portion 46B can continuously extend through a second electrically conductive layer 2046 and a second electrically conductive pad structure 2046D. Generally, metal contact structures on non-horizontally-extending portions of each of the first and second electrically conductive layers (46, 2046).

Each first sacrificial pad structure 44 can be replaced with a first electrically conductive pad structure 46D, and each second sacrificial pad structure 2044 can be replaced with a second electrically conducive pad structure 2046D. In one embodiment, each protrusion region 464 of the first electrically conductive layers 46 includes a pair of vertical sidewalls (i.e., the sidewalls of a first electrically conductive pad structure 46D) that are laterally offset from a respective one of a pair of sidewalls of the underlying one of the vertical plate regions 462 by a same lateral offset distance lod, which is the etch distance of the isotropic etch process employed at the processing steps of FIG. 49D.

In an alternative embodiment, the second tier and the second alternating stack (2032, 2046) can be omitted. In this alternative embodiment, the word line contact via structures 48 can be formed on the respective first electrically conductive pad structures 46D to reduce the likelihood of misalignment between the electrically conductive layers 46 and the respective word line contact via structures 48.

The second mesa structure 2270 overlies the first mesa structure 1270, and can include a dielectric sidewall 2271 that contacts a most proximal one of the second insulating layers 2032. Additional metal contact structures (not illustrated) can that contact a respective one of the non-horizontally-extending portions of the second electrically conductive layers 2046, for example, on the top surfaces of the second electrically conducive pad structures 2046D.

Figure 52:
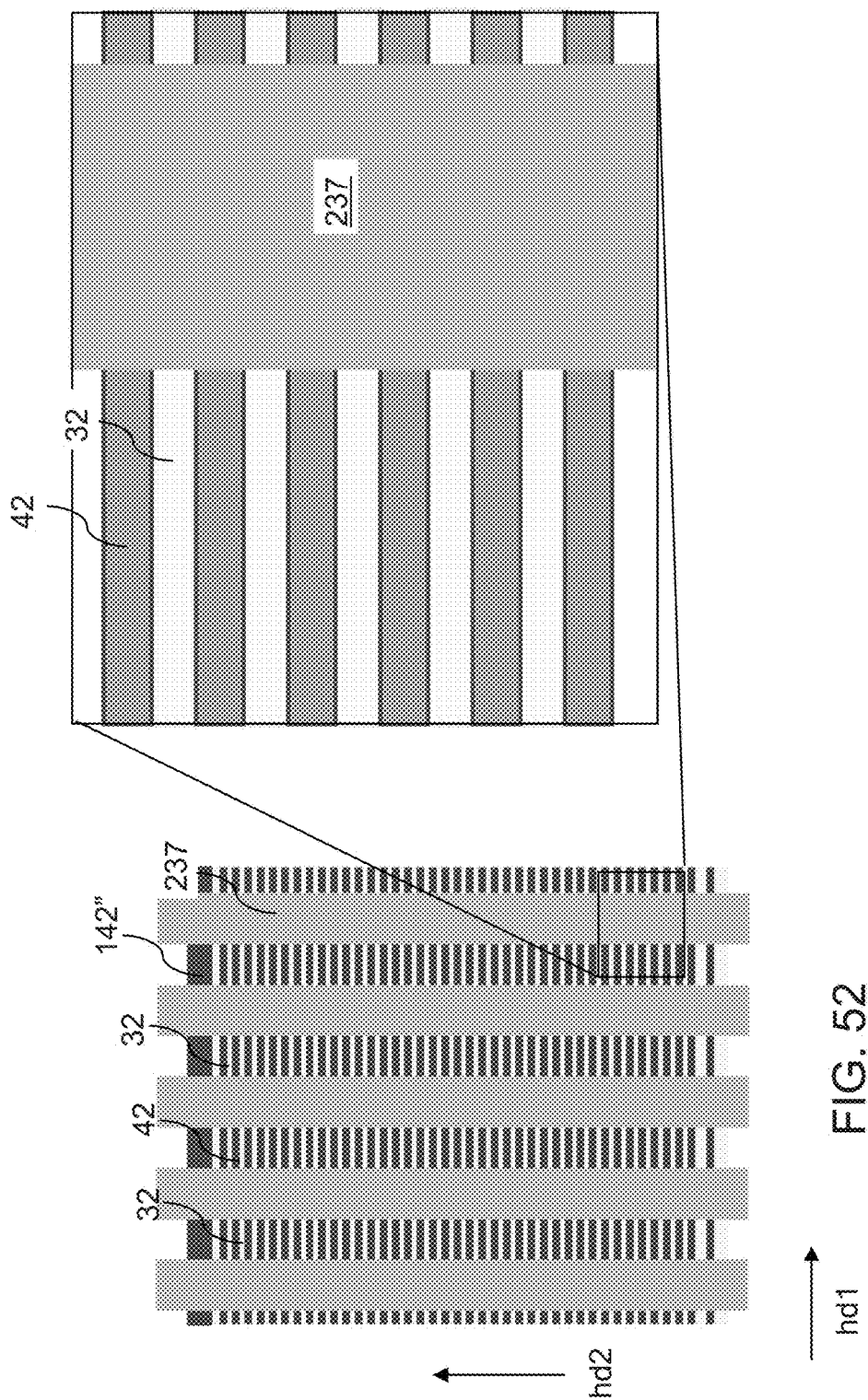
FIG. 52 illustrates a first alternative pattern for a photoresist layer that masks non-horizontally-extending portions of the first sacrificial material layers and/or of the second sacrificial material layers according to the second embodiment of the present disclosure.

Referring to FIG. 52, a first alternative pattern is illustrated for a photoresist layer 237 that masks non-horizontally-extending portions of the first sacrificial material layers 42 and/or of the second sacrificial material layers 2042. In this case, the protrusion regions 464 of each first electrically conductive layer 46 (or the protrusion regions of each second electrically conducive layer) can be formed as a two-dimensional array including rows of protrusion regions 464 that extend along the second horizontal direction. In this case, metal contact structures (such as the word line contact via structures 48) that are formed on the protrusion regions 464 of the first electrically conductive layers 46 may be staggered to avoid electrical shorts to neighboring first electrically conductive layers 46. This embodiment relaxes the photolithography alignment tolerance limit between the sacrificial material layers 42 and the respective pattern for the photoresist layer 237.

Figure 53:
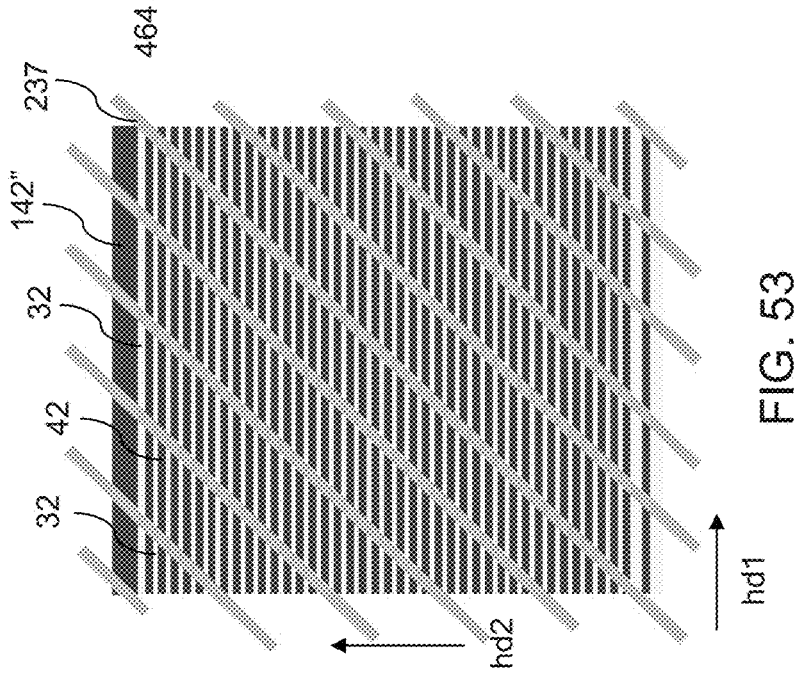
FIG. 53 illustrates a second alternative pattern for a photoresist layer that masks non-horizontally-extending portions of the first sacrificial material layers and/or of the second sacrificial material layers according to the second embodiment of the present disclosure.

FIG. 53 illustrates a second alternative pattern for a photoresist layer 237 that masks non-horizontally-extending portions of the first sacrificial material layers 42 and/or of the second sacrificial material layers 2042 according to the second embodiment of the present disclosure. In this case, the protrusion regions 464 of the first electrically conductive layers 46 can be formed along a diagonal horizontal direction that is different from the first horizontal direction hd1 and the second horizontal direction hd2.

Figure 54:
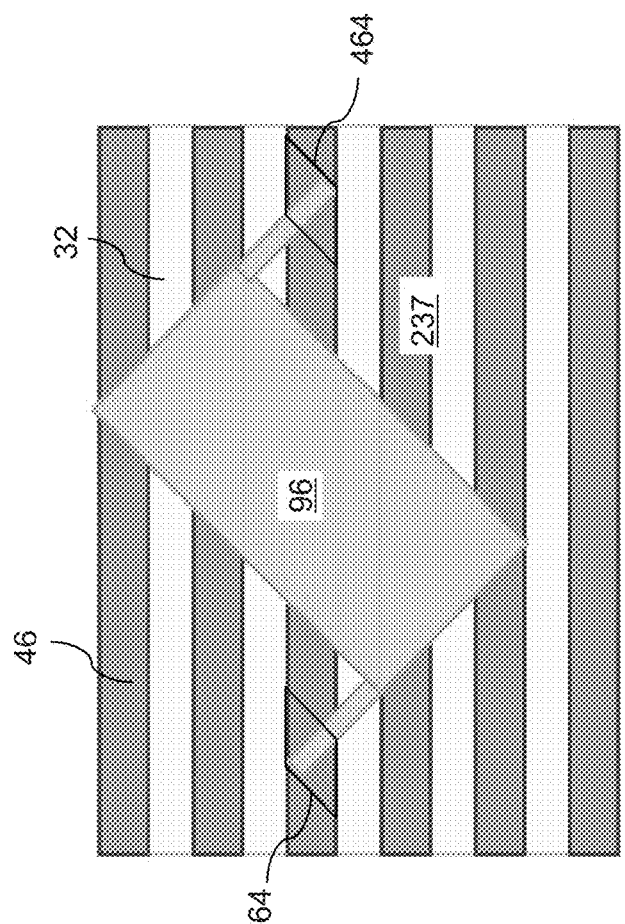
FIG. 54 illustrates an exemplary layout for a landing pad structure that can be employed in conjunction with first electrically conductive layers derived from the first sacrificial material layers patterned with the second alternative pattern illustrated in FIG. 53.

Referring to FIG. 54, a pattern for a landing pad structure 96 is illustrated, which can be employed in conjunction with first electrically conductive layers 46 which replace the first sacrificial material layers 42 patterned with the second alternative pattern illustrated in FIG. 53. In this case, a landing pad structure 96 including a pair of laterally protruding arms can be formed directly on top surfaces of a pair of protrusion regions 464 connected to a same first electrically conductive layer 46. A word line contact via structure 48 can be formed on a top surface of the landing pad structure 96. Generally, the landing pad structure 96 can include multiple arms to connect to a plurality of protrusion regions 96 connected to a same first electrically conductive layer 46. Alternatively, a word line contact via structure 48 can be formed with a pair of laterally protruding arms that land on top surfaces of a pair of protrusion regions 464 connected to a same first electrically conductive layer 46. In other words, word line contact via structures 48 may be formed with the horizontal cross-sectional shape of the landing pad structure illustrated in FIG. 54.

Figure 55A:
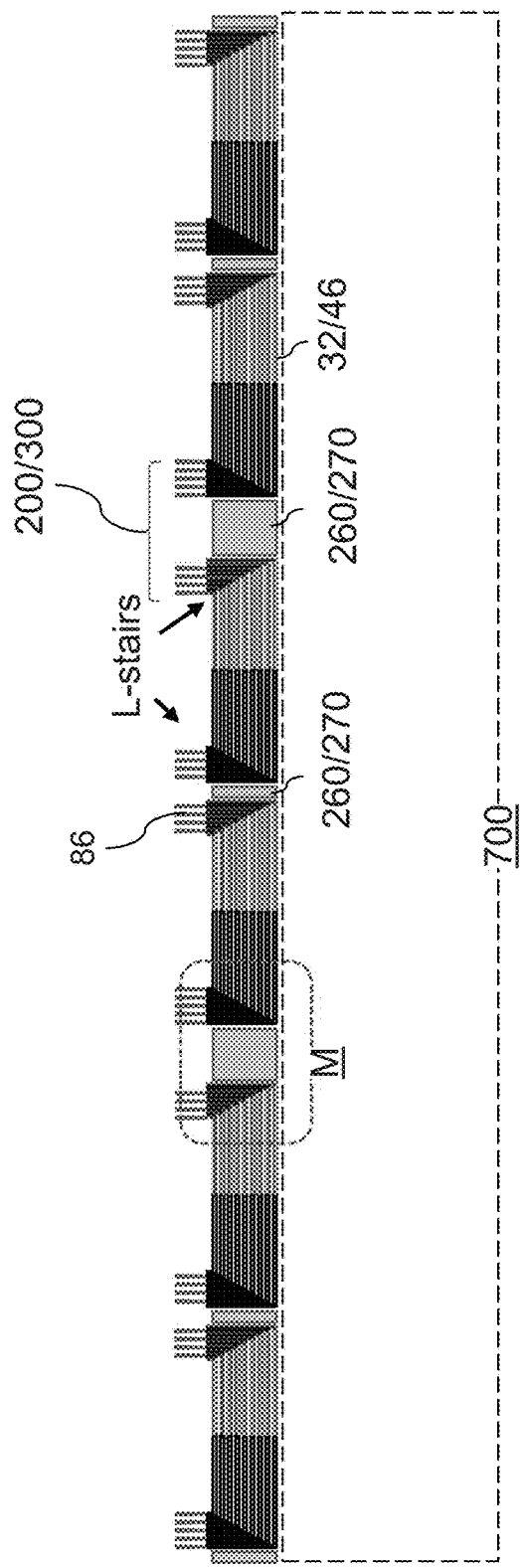
FIG. 55A is a vertical cross-sectional view of an alternative embodiment of the present disclosure.
Figure 55B:
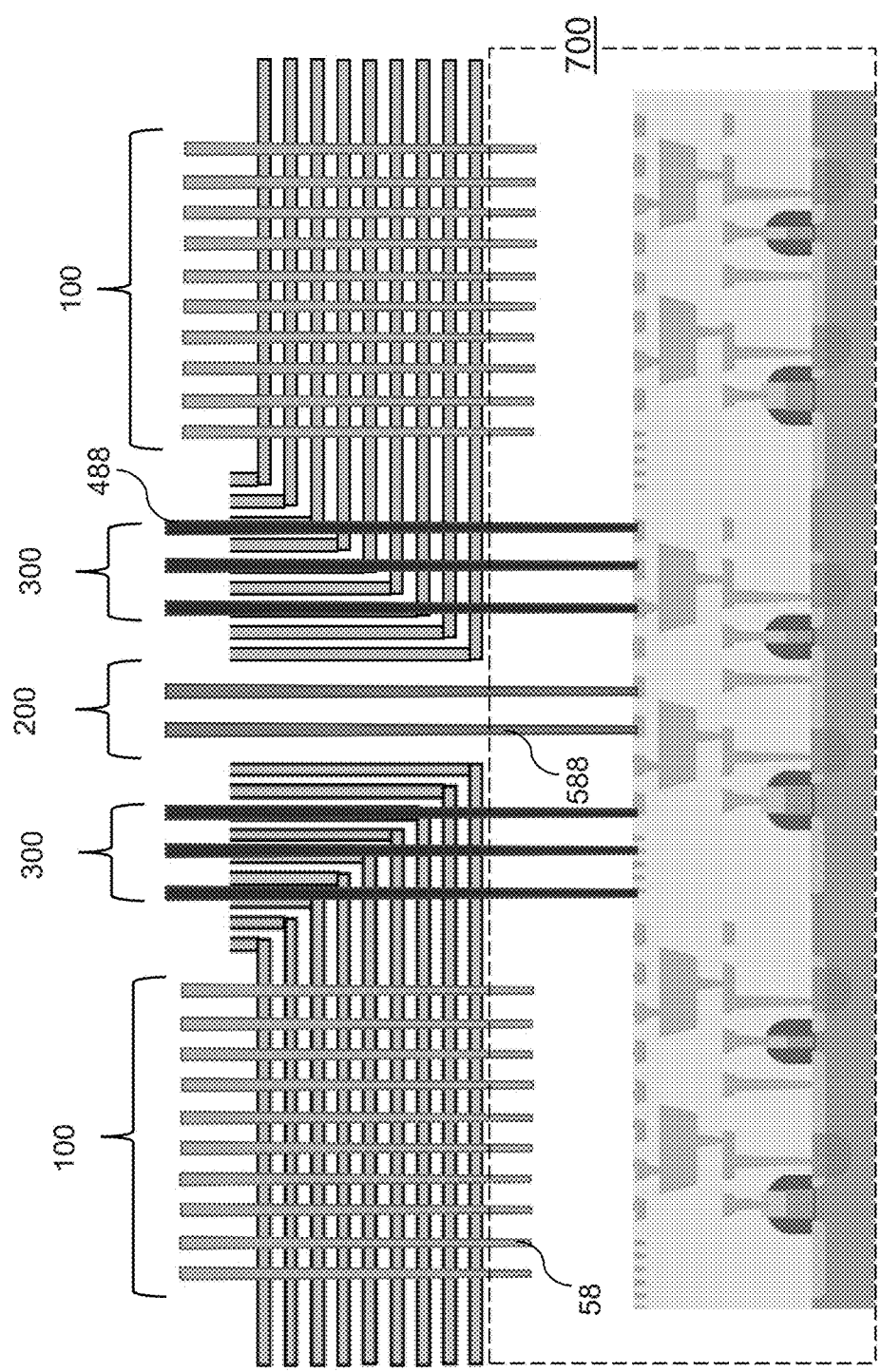
FIG. 55B is a magnified view of the region M of FIG. 55A.
Figure 55C:
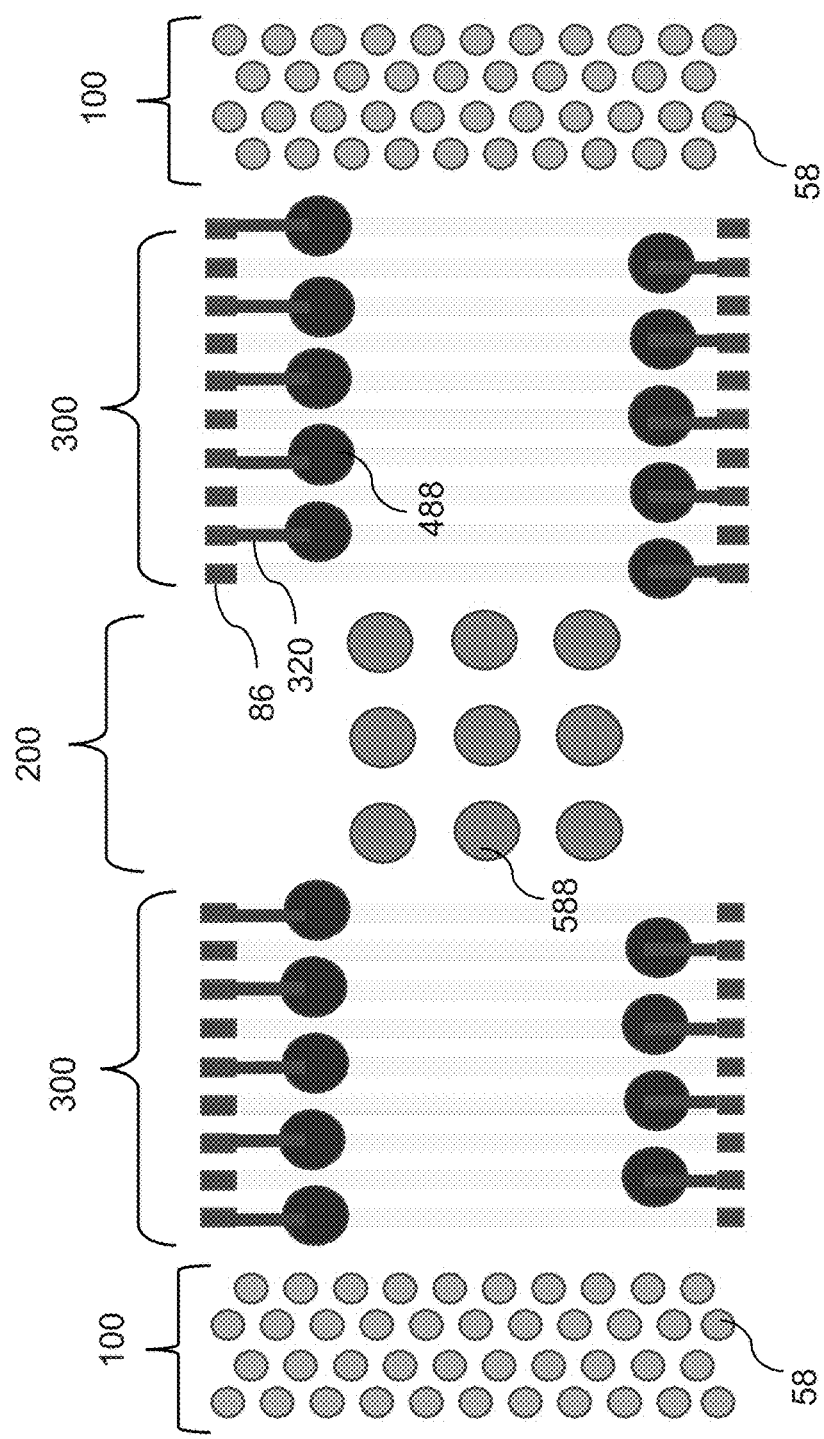
FIG. 55C is a top-down view of the region M of FIG. 55A.

Referring to FIGS. 55A-55C, an alternative embodiment of the present disclosure is illustrated in which multiple memory array regions 100 are laterally spaced apart by mesa structures (260, 270) within a same semiconductor chip. A space region including a pair of contact regions 300 and a peripheral device region 200 can be provided between each neighboring pair of memory array regions 100. An underlying semiconductor structure 700 can be provided underneath the alternating stacks (32, 46) and the memory stack structures 58, which can include a semiconductor substrate 8, semiconductor devices such as field effect transistors that are formed on the semiconductor substrate 8, and metal interconnect structures embedded in lower level dielectric material layers, as illustrated in FIG. 55B. The width of each mesa structure (260, 270) can be optimized as needed, for example, depending on the number of first through-memory-level contact via structures 588 that are formed through the mesa structures (260, 270). Thus, at least one contact via structure 588 extends through the mesa structure (260, 270) such that it electrically contacts at least one driver circuit transistor (730, 750) located on the substrate 8.

Second through-memory-level contact via structures 488 can be formed in the contact regions 300 within areas that are not occupied by the electrically conductive layers 46, such as openings through the electrically conductive layers that may be formed by patterning an area of the alternating stack (32, 46) within the contact region 300. The first and second through-memory-level contact via structures (588, 488) can be electrically connected to various metal interconnect structures overlying the memory stack structures 58 or the mesa structures (260, 270) by upper metal interconnect structures 320.

Referring to all drawings of the present disclosure, the various embodiments of the present disclosure provide a three-dimensional memory device. The three-dimensional memory device can comprise: a first alternating stack of first insulating layers 32 and first electrically conductive layers 46 located over a top surface of a substrate 8, wherein each of the first insulating layers 32 and the first electrically conductive layers 46 includes a respective horizontally-extending portion and a respective non-horizontally-extending portion; a first mesa structure 1270 located over the top surface of the substrate 8 and including a dielectric sidewall 1271 that contacts a most proximal one of the first insulating layers 32; memory stack structures 55 extending through a memory array region 100 of the first alternating stack that includes the horizontally-extending portions of the first electrically conductive layers 46, wherein each of the memory stack structures 55 comprises a memory film 50 and a vertical semiconductor channel 60; and metal contact structures (86 or 48) that contact a respective one of the non-horizontally-extending portions of the first electrically conductive layers 46.

In one embodiment, the non-horizontally-extending portion of the first insulating layers 32 and the first electrically conductive layers 46 comprise vertically-extending portions. In one embodiment, each horizontally-extending portion of the first insulating layers 32 and the first electrically conductive layers 46 has a respective uniform vertical thickness, and each vertically-extending portion of the first insulating layers 32 and the first electrically conductive layers 46 has a respective uniform horizontal thickness. In one embodiment, each vertically-extending portion of the first electrically conductive layers 46 includes: a vertical plate region 462 having a pair of vertical sidewalls that are parallel to the dielectric sidewall of the first mesa structure 1270; and a protrusion region 464 that protrudes above the vertical plate region 462 and contacting a respective one of the metal contact structures (86 or 48).

In one embodiment, the three-dimensional memory device further comprises a pair of backside trenches 79 that laterally extend along a horizontal direction (such as a second horizontal direction hd2) that is perpendicular to the dielectric sidewall 1271 of the first mesa structure 1270, wherein each vertical plate region 462 laterally extends from a sidewall of one of the pair of backside trenches 79 to a sidewall of another of the pair of backside recesses 79.

In one embodiment, the protrusion region 464 has a lesser lateral extent along a horizontal direction (e.g., a first horizontal direction hd1) that is parallel to the dielectric sidewall 1271 of the first mesa structure 1270 than the vertical plate region 462; and the metal contact structures (86 or 48) are vertically spaced from the vertical plate regions 462 by a dielectric material (such as a dielectric material of the first insulating cap layer 282 or a dielectric material of the first insulating layers 32).

In one embodiment, top surfaces of the protrusion regions 464 are located within a first horizontal plane HP1; and top surfaces of the vertical plate regions 462 are located within a second horizontal plane HP2 located below the first horizontal plane HP1. In one embodiment, the entirety of each protrusion region 464 has a same lateral dimension as a respective underlying one of the vertical plate regions 462 along a horizontal direction that is perpendicular to the dielectric sidewall 1271 of the first mesa structure 1270, e.g., along the second horizontal direction hd2, as illustrated in FIG. 45.

In one embodiment, each protrusion region 464 comprises a portion (such as a first electrically conducive pad structure 46D) having a greater lateral dimension than an underlying one of the vertical plate regions 462 along a horizontal direction that is perpendicular to the dielectric sidewall 1271 of the first mesa structure 1270 as illustrated in FIG. 51. In one embodiment, the protrusion region 464 includes a pair of vertical sidewalls that are laterally offset from a respective one of a pair of sidewalls of the underlying one of the vertical plate regions 462 by a same lateral offset distance lod as illustrated in FIG. 51.

In one embodiment, each vertically-extending portion of the first electrically conductive layers 46 comprises a plurality of protrusion regions 464; and each of the metal contact structures (such as a landing pad structure 96) contacts a respective plurality of protrusion regions 464 connected to a respective vertical plate region 462 as illustrated in FIG. 54.

In one embodiment, the three-dimensional memory device can further comprise: a second alternating stack of second insulating layers 2032 and second electrically conductive layers 2046 located over the first alternating stack (32, 46), wherein each of the second insulating layers 2032 and the second electrically conductive layers 2046 includes a respective horizontally-extending portion and a respective non-horizontally-extending portion, wherein the memory stack structures 55 extend through the horizontally-extending portions of the second electrically conductive layers 2046; a second mesa structure 2270 overlying the first mesa structure 1270 and including another dielectric sidewall 2271 that contacts a most proximal one of the second insulating layers 2032; and additional metal contact structures that contact a respective one of the non-horizontally-extending portions of the second electrically conductive layers 2046.

In some embodiments, the three-dimensional memory device comprises a vertical NAND device located over the substrate 8; the first electrically conductive layers 46 comprise word lines of the vertical NAND device; the substrate 8 comprises a silicon substrate; and the vertical NAND device comprises an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings; the silicon substrate contains an integrated circuit comprising a driver circuit for the memory device located thereon; and the array of monolithic three-dimensional NAND strings comprises a plurality of semiconductor channels, wherein at least one end portion of each of the plurality of semiconductor channels extends substantially perpendicular to a top surface of the substrate 8, and a plurality of charge storage elements, each charge storage element located adjacent to a respective one of the plurality of semiconductor channels.

The various exemplary structures of the present disclosure provide contact regions 300 having a compact footprint, i.e., contact regions 300 having a smaller area than conventional contact regions including stepped surfaces of an alternating stack of insulating layers and electrically conductive layers.

The compact footprint of the contact regions 300 improves scaling of semiconductor devices, reduces the number of processing steps and enhances device density for a three-dimensional memory device. Furthermore, embodiments of the present disclosure provide self-aligned contacts which decrease or prevent shorts between adjacent word lines. Furthermore, formation of additional dummy support pillars in the contact region 300 can be omitted, since the non-horizontal portions of the insulating layers 32 function as support pillars during replacement of the sacrificial material layers 42 with the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    a first alternating stack of first insulating layers and first electrically conductive layers located over a top surface of a substrate, wherein each of the first insulating layers and the first electrically conductive layers includes a respective horizontally-extending portion and a respective non-horizontally-extending portion;
    a first mesa structure located over the top surface of the substrate;
    memory stack structures extending through a memory array region of the first alternating stack that includes the horizontally-extending portions of the first electrically conductive layers, wherein each of the memory stack structures comprises a memory film and a vertical semiconductor channel; and
    metal contact structures that contact a respective one of the non-horizontally-extending portions of the first electrically conductive layers;
    wherein each non-horizontally-extending portion of the first insulating layers and the first electrically conductive layers comprises a vertically-extending portion; and
    wherein each vertically-extending portion of the first electrically conductive layers includes:
    a vertical plate region having a pair of vertical sidewalls that are parallel to a dielectric sidewall of the first mesa structure; and
    a protrusion region that protrudes above the vertical plate region and contacting a respective one of the metal contact structures;
    further comprising a pair of backside trenches that laterally extend along a horizontal direction that is perpendicular to the dielectric sidewall of the first mesa structure, wherein each vertical plate region laterally extends from a sidewall of one of the pair of backside trenches to a sidewall of another of the pair of backside recesses;
    wherein:
    the protrusion region has a lesser lateral extent along a horizontal direction that is parallel to the dielectric sidewall of the first mesa structure than the vertical plate region; and
    the metal contact structures are vertically spaced from the vertical plate regions by a dielectric material.

2. The three-dimensional memory device of claim 1, wherein:
    each horizontally-extending portion of the first insulating layers and the first electrically conductive layers has a respective uniform vertical thickness; and
    each vertically-extending portion of the first insulating layers and the first electrically conductive layers has a respective uniform horizontal thickness.

3. The three-dimensional memory device of claim 1, wherein:
    top surfaces of the protrusion regions are located within a first horizontal plane; and
    top surfaces of the vertical plate regions are located within a second horizontal plane located below the first horizontal plane.

4. The three-dimensional memory device of claim 1, wherein an entirety of each protrusion region has a same lateral dimension as a respective underlying one of the vertical plate regions along a horizontal direction that is perpendicular to the dielectric sidewall of the first mesa structure.

5. The three-dimensional memory device of claim 1, wherein:
    each protrusion region comprises a conducive pad structure having a greater lateral dimension than an underlying one of the vertical plate regions along a horizontal direction that is perpendicular to the dielectric sidewall of the first mesa structure; and
    the protrusion region includes a pair of vertical sidewalls that are laterally offset from a respective one of a pair of sidewalls of the underlying one of the vertical plate regions by a same lateral offset distance.

6. The three-dimensional memory device of claim 1, wherein:
    each vertically-extending portion of the first electrically conductive layers comprises a plurality of protrusion regions; and
    each of the metal contact structures contacts a respective plurality of protrusion regions connected to a respective vertical plate region.

7. The three-dimensional memory device of claim 1, further comprising at least one contact via structure extending through the mesa structure and electrically contacting at least one driver circuit transistor located on the substrate.

8. The three-dimensional memory device of claim 1, further comprising:
    a second alternating stack of second insulating layers and second electrically conductive layers located over the first alternating stack, wherein each of the second insulating layers and the second electrically conductive layers includes a respective horizontally-extending portion and a respective non-horizontally-extending portion, wherein the memory stack structures extend through the horizontally-extending portions of the second electrically conductive layers;
    a second mesa structure overlying the first mesa structure; and
    additional metal contact structures that contact a respective one of the non-horizontally-extending portions of the second electrically conductive layers.

9. The three-dimensional memory device of claim 1, wherein:
- the three-dimensional memory device comprises a vertical NAND device located over the substrate;
- the first electrically conductive layers comprise word lines of the vertical NAND device;
- the substrate comprises a silicon substrate;
- the vertical NAND device comprises an array of monolithic three-dimensional NAND strings over the silicon substrate;
- at least one memory cell in a first device level of the array of monolithic three-dimensional NAND strings is located over another memory cell in a second device level of the array of monolithic three-dimensional NAND strings;
- the silicon substrate contains an integrated circuit comprising a driver circuit for the memory device located thereon; and
- the array of monolithic three-dimensional NAND strings comprises:
  - a plurality of semiconductor channels, wherein at least one end portion of each of the plurality of semiconductor channels extends substantially perpendicular to a top surface of the substrate, and
  - a plurality of charge storage elements, each charge storage element located adjacent to a respective one of the plurality of semiconductor channels.

10. A method of forming a three-dimensional memory device, comprising:
- forming a first mesa structure over a substrate;
- forming a first alternating stack of first insulating layers and first sacrificial material layers on the first mesa structure and over the substrate, wherein each of the first insulating layers and the first sacrificial material layers includes a respective horizontally-extending portion and a respective non-horizontally-extending portion;
- forming memory stack structures in a memory array region of the first alternating stack that includes the horizontally-extending portions of the first sacrificial material layers, wherein each of the memory stack structures comprises a memory film and a vertical semiconductor channel;
- masking first regions the non-horizontally-extending portions of the first sacrificial material layers with patterned etch mask portions;
- vertically recessing unmasked second regions of the non-horizontally-extending portions of the first sacrificial material layers, while not removing the masked first regions of the non-horizontally-extending portions of the first sacrificial material layers; and
- replacing the first sacrificial material layers with first electrically conductive layers;
- wherein each first electrically conductive layer comprises a horizontally-extending portion and a non-horizontally-extending portion that includes:
  - a vertical plate region having a respective pair of vertical sidewalls that are parallel to a dielectric sidewall of the first mesa structure; and
  - a protrusion region that protrudes above the vertical plate region and having a narrower lateral dimension than the vertical plate region along a horizontal direction that is parallel to the dielectric sidewall; and
- further comprising forming metal contact structures on a respective one of the protrusion regions of the first electrically conductive layers, wherein the metal contact structures are vertically spaced from top surfaces of the vertical plate regions;
- wherein the first alternating stack is formed by:
  - alternately depositing conformal insulating layers and conformal sacrificial material layers over a top surface of a substrate and over the first mesa structure; and
  - removing portions of conformal insulating layers and conformal sacrificial material layers from above the first mesa structure by a planarization process, wherein remaining portions of the conformal insulating layers and conformal sacrificial material layers constitute the first insulating layers and the first sacrificial material layers.

11. The method of claim 10, further comprising applying and patterning a photoresist material over the non-horizontally-extending portions of the first sacrificial material layers and the first insulating layers, wherein:
- each masked first region of the non-horizontally-extending portions of the first sacrificial material layers is covered by a patterned portion of the photoresist material and the unmasked second regions of the non-horizontally-extending portions of the first sacrificial material layers are not covered by the photoresist material; and
- the unmasked second regions of the non-horizontally-extending portions of the first sacrificial material layers are vertically recessed by a selective etch process that employs remaining portions of the photoresist material as an etch mask.

12. The method of claim 10, further comprising:
- depositing an insulating cap layer directly on the non-horizontally-extending portions of the first sacrificial material layers after vertically recessing the unmasked second regions of the non-horizontally-extending portions of the first sacrificial material layers;
- removing the first sacrificial material layers selective to the first insulating layers and the insulating cap layer to form backside recesses; and
- filling the backside recesses with the first electrically conductive layers,
- wherein:
  - the masked first regions of the non-horizontally-extending portions of the first sacrificial material layers are laterally isolated among one another and include top surfaces located within a first horizontal plane; and
  - the unmasked second regions of the non-horizontally-extending portions of the first sacrificial material layers are vertically recessed to provide recessed top surfaces located within a second horizontal plane located below the first horizontal plane.

13. The method of claim 12, further comprising:
- partially vertically recessing the insulating cap layer, wherein first top surfaces of the non-horizontally-extending portions of the first sacrificial material layers located within the first horizontal plane are physically exposed and second top surfaces of the non-horizontally-extending portions of the first sacrificial material layers located within the second horizontal plane are not physically exposed;
- vertically recessing the first top surfaces of the non-horizontally-extending portions of the first sacrificial material layers to form recess cavities;
- isotropically expanding the recess cavities by isotropically etching the insulating cap layer; and forming sacrificial pad structures in the isotropically expanded recess cavities, wherein the sacrificial pad structures are subsequently replaced with the first electrically conductive pad structures.

14. The method of claim 10, further comprising:

forming a second mesa structure over the first mesa structure and the non-horizontally-extending portions of the first insulating layers and the first sacrificial material layers; and forming a second alternating stack of second insulating layers and second sacrificial material layers over the horizontally-extending portions of the first insulating layers and the first sacrificial material layers, wherein each of the second insulating layers and the second sacrificial material layers includes a respective horizontally-extending portion and a respective non-horizontally-extending portion, wherein the memory stack structures are formed through the horizontally-extending portions of the second sacrificial material layers;

replacing the second sacrificial material layers with second electrically conductive layers; and forming additional metal contact structures on non-horizontally-extending portions of the second electrically conductive layers.

* * * * *